United States Patent [19]
Okumura et al.

[11] Patent Number: 5,763,921
[45] Date of Patent: Jun. 9, 1998

[54] SEMICONDUCTOR DEVICE INCLUDING RETROGRADE WELL STRUCTURE WITH SUPPRESSED SUBSTRATE BIAS EFFECTS

[75] Inventors: Yoshinori Okumura; Masahiko Takeuchi; Hideaki Arima, all of Hyogo-ken, Japan

[73] Assignee: Mitsubishi Denki Kabushiki Kaisha, Tokyo, Japan

[21] Appl. No.: 645,700

[22] Filed: May 14, 1996

Related U.S. Application Data

[63] Continuation of Ser. No. 242,152, May 13, 1994, abandoned, which is a continuation of Ser. No. 960,631, Oct. 14, 1992, abandoned.

[30] Foreign Application Priority Data

Oct. 22, 1991 [JP] Japan ............................ 3-274142
Jul. 22, 1992 [JP] Japan ............................ 4-195567

[51] Int. Cl.$^6$ ............... H01L 29/76; H01L 29/94; H01L 31/062; H01L 31/113
[52] U.S. Cl. ............... 257/371; 257/372; 257/395; 257/655
[58] Field of Search .............. 257/297, 371, 257/372, 395, 607, 655

[56] References Cited

U.S. PATENT DOCUMENTS

| | | | |
|---|---|---|---|
| 4,506,436 | 3/1985 | Bakeman, Jr. et al. | 257/297 |
| 4,926,223 | 5/1990 | Bergemon | 257/297 |
| 4,961,165 | 10/1990 | Ema | 257/297 |
| 5,047,818 | 9/1991 | Tsukamoto | 257/297 |

FOREIGN PATENT DOCUMENTS

| | | |
|---|---|---|
| 0209939 | 1/1987 | European Pat. Off. |
| 4223272 | 1/1993 | Germany |
| 2-264464 | 10/1990 | Japan |
| 2-276274 | 11/1990 | Japan |

OTHER PUBLICATIONS

Worderman et al, "A Buried N–Grid for Protection Against Radiation Induced Charge Collection in Electronic Circuits", IEDM, 1981, pp. 40–43.

Hayden et al. "A High–Performance Half–Micrometer CMOS Technology for Fast SRAM's ", *IEEE Transactions on Electron Devices*, vol. 38, No. 4 (Apr. 1991), pp. 876–885.

A 0.5 μm Isolation Technology Using Advanced Poly Silicon Pad LOCOS (Appl), by Toshiyuki Nishihara et al, IEDM, pp. 100–103, 1988, no month.

*Primary Examiner*—Ngân V. Ngô
*Attorney, Agent, or Firm*—Lowe, Price, LeBlanc & Becker

[57] ABSTRACT

An n well and a p well are formed in a silicon substrate. The n well has n type impurity concentration peaks and a p type impurity concentration peak. The p well has p type concentration peaks. The impurity concentration peaks serving as channel stopper regions for isolating elements exist only in proximity to the lower surface of an isolation oxide film but not in element regions.

2 Claims, 53 Drawing Sheets

SEMICONDUCTOR DEVICE INCLUDING RETROGRADE WELL STRUCTURE WITH SUPPRESSED SUBSTRATE BIAS EFFECTS

This application is a continuation of application Ser. No. 08/242,152 filed May 13, 1994 now abandoned, which is a continuation of application Ser. No. 07/960,631, filed Oct. 14, 1992, now abandoned.

BACKGROUND OF THE INVENTION

1. Field of the Invention

The invention relates generally to semiconductor devices and a method of manufacturing the same, and more particularly, to a retrograde well structure improved to suppress substrate bias effects and a method of forming such structure.

2. Description of the Background Art

One of such typical semiconductor devices is a complementary MOS transistor (hereinafter referred to as CMOS transistor) as having wells formed on a substrate and MOS transistors formed on the major surface of the wells. The CMOS transistor is characterized by n channel transistors and p channel MOS transistors formed in one semiconductor substrate. The advantage of the CMOS transistor is that a direct current flowing between power source terminals is so small that a very small amount of current is consumed. The structure of a conventional CMOS transistor will be described in the following with reference to the drawings.

FIG. 75 is a partial sectional view showing the structure of a conventional CMOS transistor. An n well 5 and a p well 6 having conductivity types different from each other are formed at the surface region of a p type silicon substrate 1. Isolation oxide films (field oxide film) 2 for isolating elements are formed at a predetermined region on the surface of the n well 5 and the p well 6. A p channel MOS transistor 50 is formed on the surface of the n well 5. An n channel MOS transistor 60 is formed on the surface of the p well 6. The p channel MOS transistor 50 includes a gate electrode 8 and a pair of $p^+$ impurity regions 9a and 9b spaced apart from each other by the gate electrode. The n channel MOS transistor 60 includes a gate electrode 8 and a pair of $n^+$ impurity regions 10a and 10b spaced apart from each other by the gate electrode. Although FIG. 75 shows an n well 5 and a p well 6 each including one transistor, the wells include a plurality of MOS transistors and other function elements formed therein in actuality.

The CMOS structure, however, is liable to cause latch-up effects of excessive current flowing to a power source terminal destroying elements. Latch-up is such an effect as follows. That is, with pnp and npn parasitic bipolar transistors formed in a CMOS transistor to constitute a pnpn thiristor between a power source potential ($V_{DD}$) and a ground potential GND ($V_{ss}$), an application of external noise causes current to continue flowing between $V_{DD}$ and GND, which leads to destruction.

FIG. 76 is a sectional view schematically showing one example of a parasitic thiristor formed in a CMOS transistor similar to that described with reference to FIG. 75. In FIG. 76, with an n well 5 and a p well 6 having low impurity concentration, an application of surge noise of some kind increases a voltage drop (corresponding to resistors Rn and Rp) caused when current flows through these well regions. As a result, the emitter-base of a parasitic pnp bipolar transistor Q1 and a parasitic npn bipolar transistor Q2 is biased. Operation of these parasitic transistors causes the above-described latch-up effects to be more liable to occur.

The most characteristic technique among the process techniques for constituting a CMOS structure is a well forming technique. For forming an n channel MOS transistor and a p channel MOS transistor on the same semiconductor substrate, respective element regions should be isolated from each other. In other words, p well regions where n channel MOS transistors are formed should be electrically separated from n well regions where p channel MOS transistors are formed. In order to improve resistance to the above-described latch-up effect to suppress narrow channel effects of a MOS transistor and control a threshold voltage, a generally-called retrograde well structure is adopted which has an impurity concentration being changed in stages from the main surface of a semiconductor substrate toward a depth direction. Such a retrograde well is often formed by implanting impurity ions in the semiconductor substrate at a high energy.

A method of forming a retrograde well by implanting impurity ions in a semiconductor substrate at high energy is disclosed in Japanese Patent Laying-Open No. 2-264464, Japanese Patent Laying-Open No. 2-276274 and "A 0.5 μm Isolation Technology Using Advanced Polysilicon Pad LOCOS (APPL)", T. Nishihara et. al, IEDM, 1988, pp. 100–103. FIGS. 77 to 82 are sectional views showing the steps of manufacturing a conventional retrograde well structure. These drawings show only a method of forming a p well where a surface channel type n channel MOS transistor is formed in a CMOS structure. With reference to these drawings, a method of forming a conventional p type retrograde well structure will be described in the following.

With reference to FIG. 77, an underlying oxide film 20 is formed on the surface of a p type silicon substrate 1 by thermal oxidation. A polysilicon film 3 is formed on the underlying oxide film 20 by a CVD method, on which a nitride film 4 is formed. The nitride film 4 and the polysilicon film 3 are selectively removed by photolithography and reactive ion etching. As a result, the polysilicon film 3 and the nitride film 4 are formed in an element region, while the underlying oxide film 20 exposes its surface in the element isolation region.

Then as shown in FIG. 78, the exposed underlying oxide film 20 is thermally oxidized by using the nitride film 4 and the polysilicon film 3 as masks to form a thick isolation oxide film 2. The method of forming the isolation oxide film 2, one of the LOCOS methods, is referred to as a LOPOS process. The formation of the isolation oxide film 2 defines an element region where such elements as MOS transistors are formed. Underlying oxide film 20 is formed under the element region.

Then, the nitride film 4 and the polysilicon film 3 are removed as shown in FIG. 79.

With reference to FIG. 80, boron ions ($B^+$) as p type impurity ions are implanted twice in the silicon substrate 1 at different energies and with different dose amounts from one time to another. As a result, a p type impurity regions is formed which has a first p type impurity concentration peak 61a under the lower surface of the isolation oxide film 2. In addition, a p type impurity region is formed which has a second p type impurity concentration peak 62 at a position deep in the silicon substrate 1. At this time, an impurity region having a p type impurity concentration peak 61b is inevitably formed also in the element region.

As shown in FIG. 81, boron ions are implanted in a region near to the surface of the silicon substrate 1 at low energy by using the isolation oxide film 2 as a mask. As a result, an impurity region having a third p type impurity concentration peak 63 in proximity to the surface of the silicon substrate 1 is formed in the element region. Heat treatment can be given to the silicon substrate in order to activate the regions having the p type impurity concentration peaks 61a, 61b and 62 prior to ion implantation for forming the p type impurity concentration peak 63. A p-well 6 is formed in this manner. The p well 6 has three p type impurity concentration peaks 61a and 61b and 62 and 63. In thus formed p type retrograde well region, the region including the first impurity concentration peak 61a serves as a channel stop region for isolating elements. The region including the second impurity concentration peak 62 formed deep in the silicon substrate 1 is effective in preventing latch-up effects. The region having the third impurity concentration peak 63 prevents punch through in the MOS transistor formed on the region and controls a threshold voltage.

As shown in FIG. 82, after the underlying oxide film 20 is removed, a gate oxide film 7 is again formed by thermal oxidation. A polysilicon layer including phosphorus as n type impurities, for example, is formed on the gate oxide film 7 by a CVD method. The polysilicon layer is selectively removed by photolithography or reactive ion etching to form a gate electrode 8 of an $n^+$ polysilicon layer. n type impurity ions of phosphorus or arsenic are implanted by using the gate electrode 8 as a mask. As a result, $n^+$ impurity regions 10a and 10b are formed. An n channel MOS transistor 60 is formed in the p well 6 region in this manner.

FIG. 83 shows a relationship between the structure of thus formed p well 6 and the n channel MOS transistor 60, and an impurity concentration distribution in a depth direction. An insulation film 11 is formed to cover the n channel MOS transistor 60. The insulation film 11 is provided with contact holes 11a and 11b formed to expose the surface of the $n^+$ impurity regions 10a and 10b. Wiring layers 12a and 12b are formed to be in contact with the $n^+$ impurity regions 10a and 10b through the contact holes 11a and 11b, respectively. The first p type impurity concentration peak 61a is formed in proximity to the lower surface of the isolation oxide film 2 to serve as a channel stop region for isolating elements. The p type impurity concentration peak 63 formed in proximity to the surface of the channel region of the n channel MOS transistor 60 prevents punch through from occurring in the n channel MOS transistor 60 or controls a threshold voltage.

However, according to a conventional method of manufacturing a retrograde well structure shown in FIG. 80, formation of the p type impurity concentration peak 61a as a channel stop region for isolating elements in proximity to the lower surface of the isolation oxide film 2 is inevitably followed by formation of the p type impurity concentration peak 61b in an element region, that is, in a region where the n channel MOS transistor 60 is formed. The p type impurity concentration peak 61b adversely affects the operation of the n channel MOS transistor 60 formed thereon. That is, the p type impurity concentration peak 61b enhances substrate bias effects.

The substrate bias effects are referred to as phenomenon of a threshold voltage of the MOS transistor being changed by an application of a voltage to a silicon substrate on which the MOS transistor is formed. In other words, the threshold voltage is in proportional to the square root of the substrate bias voltage. Such proportional constant is defined as a substrate effect constant. An increase in the above-described substrate bias effect is equivalent to an increase in a substrate effect constant.

FIG. 84 is a graph showing a relationship between a threshold voltage Vth and a substrate bias voltage $V_{BB}$.

When the substrate effect constant is $K_1$ as shown in FIG. 84, a change of the substrate bias voltage $V_{BB}$ is followed by a relatively small change of the threshold voltage Vth. However, with the substrate effect constant being increased from $K_1$ to $K_2$, even a small change in the substrate bias voltage $V_{BB}$ causes the threshold voltage Vth to be greatly increased. The substrate bias voltage might be loaded to the silicon substrate as a result of an application of external noise to the silicon substrate and the like. In such a case, even without a bias voltage being applied to a substrate, noise generated in the substrate or external noise causes such a state that a bias voltage is applied. In a semiconductor device having a conventional retrograde well structure, therefore, a threshold voltage of a MOS transistor is more liable to be changed when applying a bias voltage to the substrate or when a bias voltage is applied to the substrate by external factors. As a result, fluctuation of a threshold voltage is increased during operation of the semiconductor device, which is more liable cause malfunction of such a sense amplifier as requiring highly reliable control of a threshold voltage in particular.

FIG. 85 is a diagram showing an equivalent circuit of a memory cell used in a DRAM. The memory cell comprises one n channel MOS transistor 100 and a capacitor 200. Consideration will be given to a case where a "high" (logical high) level potential stored in the capacitor 200 is read by the n channel MOS transistor 100 in the memory cell. At this time, a voltage of Vcc/2 is being applied to a source electrode 102 of the transistor 100. A voltage of Vcc/2 is also being applied to a cell plate electrode 201 of the capacitor 200. With a "high" level potential stored in the capacitor 200 at this time, a voltage of Vcc is applied to a drain electrode 202. In this state, the n channel MOS transistor 100 is turned on. An effective substrate potential $V_{BB}$, eff of the transistor 100 in this case will be expressed by the following equation.

$$V_{BB}, eff=|V_{BB}|+Vcc/2$$

An absolute value of the effective substrate potential is increased as described above, which is followed by an increase in the threshold voltage of the transistor. The increase rate is proportional to an increase of the substrate effect constant K as shown in FIG. 84. The MOS transistor therefore stops operating to prevent "high" level reading of a memory cell.

Consideration is given to a case where a "high" level potential is written to the capacitor 200 to be refreshed, which capacitor 200 stores a "high" level potential in the memory cell as shown in FIG. 85. A voltage Vcc is applied to the source electrode 102. A voltage of Vcc/2 is applied to the cell plate electrode 201 of the capacitor 200. By applying a predetermined voltage to a gate electrode 101 in this state, the transistor 100 is turned on. The voltage Vcc is applied to the drain electrode 202. The effective substrate potential $V_{BB}$, eff of the transistor 100 at this time will be expressed by the following equation.

$$V_{BB}, eff=|V_{BB}|+Vcc$$

An absolute value of the effective substrate potential is increased as described above, which is followed by an increase of the threshold voltage of the transistor. The increase rate is proportional to an increase of the substrate effect constant K. The MOS transistor therefore stops operating to prevent a "high" level writing in the memory cell. This leads not only to reduction of a high speed operation of the memory cell but also to malfunction of the same.

FIG. 86 is a diagram showing an equivalent circuit of an n channel MOS inverter. The n channel MOS inverter includes a load transistor 300 and a drive transistor 400. Consideration will now be given to a case where an input voltage Vin is inverted from a "high" level to a "low" level. An output voltage Vout is inverted from a "low" level to a "high" level at this time. In this case, a "high" level output voltage Vout is applied to the source electrode of the load transistor 300. An effective substrate potential $V_{BB}$, eff of the load transistor 300 will be expressed by the following equation.

$$V_{BB}, \text{eff}=|V_{BB}|+V_{out}$$

An absolute value of the effective substrate potential is increased as described above, which is followed by an increase in the threshold voltage of the load transistor 300. The rate of increase is proportional to an increase in the substrate effect constant K. The load transistor therefore stops operating to prevent the output voltage from attaining "high" level in the n channel MOS inverter.

As described above, a conventional retrograde well structure adversely affects the characteristics of a MOS transistor formed on a substrate surface.

SUMMARY OF THE INVENTION

A semiconductor device according to one aspect of the present invention includes a semiconductor substrate, an isolation and insulation film and a well region. The semiconductor substrate has a main surface. The isolation and insulation film is formed in an element isolation region so as to isolate element regions on the main surface of the semiconductor substrate. The well region is formed in the main surface of the semiconductor substrate to have an impurity concentration distributed from the main surface of the semiconductor substrate in a direction of depth. The impurity concentration distribution includes a first impurity concentration peak, a second impurity concentration peak and a third impurity concentration peak. The first impurity concentration peak exists only in proximity to the lower surface of the isolation and insulation film, in the element isolation region. The second impurity concentration peak extends from the element isolation region to the element region at a position apart from the lower surface of the isolation and insulation film and from the main surface of the semiconductor substrate. The third impurity concentration peak exists only in proximity to the surface of the element region.

According to the semiconductor device according to one aspect of the present invention, the first impurity concentration peak exists only in proximity to the lower surface of the isolation and insulation film in the element isolation region. Therefore, the first impurity concentration peak serving as a channel stop region for isolating elements is not formed in the element region. Thus, the retrograde well structure according to the present invention prevents substrate bias effects of a MOS transistor formed in the well region from increasing, thereby obtaining a small substrate effect constant. As a result, high speed operation of the semiconductor device employing the retrograde structure according to the present invention can be obtained to reduce malfunction.

In the method of manufacturing a semiconductor device according to one aspect of the present invention, an isolation and insulation film is formed in an element isolation region so as to isolate element regions on a main surface of a semiconductor substrate. By selectively implanting impurities into the semiconductor substrate region from above the main surface of the semiconductor substrate through the isolation and insulation film, a first impurity region is formed to have a first impurity concentration peak existing only in proximity to the lower surface of the isolation and insulation film in the element isolation region. By implanting impurities in the semiconductor substrate region from above the main surface of the semiconductor substrate, a second impurity region is formed to have a second impurity concentration peak extending from the element isolation region to the element region at a position apart from the lower surface of the isolation and insulation film and from the main surface of the semiconductor substrate. By selectively implanting impurities into the element region from above the main surface of the semiconductor substrate, a third impurity region is formed to have a third impurity concentration peak existing only in proximity to the surface of the element region.

According to the method of manufacturing a semiconductor device according to the one aspect of the present invention, when ions are injected under predetermined energy by using a nitride film and a polysilicon film as masks, the first impurity concentration peak exists only in proximity to the lower surface of the isolation oxide film. The method therefore avoids formation of an impurity concentration peak in an element region, which is inevitably formed by a conventional method of manufacturing a retrograde well structure.

In a method of manufacturing a semiconductor device according to a further aspect of the present invention, an isolation and insulation film is first formed in an element isolation region so as to isolate element regions on the main surface of a semiconductor substrate. By implanting impurities into the semiconductor substrate from above the main surface of the semiconductor substrate, a first impurity region having a first impurity concentration peak existing in proximity to the lower surface of the isolation and insulation film and a third impurity region having a third impurity concentration peak existing in proximity to the surface of the element region are simultaneously formed. By implanting impurities into the semiconductor substrate region from above the main surface of the semiconductor substrate, a second impurity region is formed to have a second impurity concentration peak extending from the element isolation region to the element region at a position apart from the lower surface of the isolation and insulation film and from the main surface of the semiconductor-substrate.

According to the method of manufacturing a semiconductor device according to the further aspect of the present invention, the first impurity concentration peak and the third impurity concentration peak are respectively formed in proximity to the lower surface of the isolation oxide film and the surface of the element region at the same time. The method therefore reduces manufacturing steps required by the manufacturing method of the first embodiment and avoids formation of an impurity concentration peak in the element region, which is inevitably formed by a conventional method of forming a retrograde well structure.

In a method of manufacturing a semiconductor device according to still further aspect of the present invention, an isolation and insulation film is first formed in an element isolation region so as to isolate element regions on a main surface of a semiconductor substrate. By implanting impurities of a first conductivity type into the semiconductor substrate region from above the main surface of the semiconductor substrate, a first impurity region is formed to have a first impurity concentration peak extending from the element isolation region to the element region at a first position in proximity to the lower surface of the isolation and insulation film and apart from the main surface of the semiconductor substrate. By implanting the first conductivity type impurities into the semiconductor substrate region from the above the main surface of the semiconductor substrate, a second impurity region is formed to have a second impurity concentration peak extending from the element isolation region to the element region at a second position apart from the lower surface of the isolation and insulation film and located at a deeper position than the first position apart from the main surface of the semiconductor substrate. By selectively implanting impurities of a second conductivity type into the element region from above the main surface of the semiconductor substrate, the first impurity region is left to have the first impurity concentration peak existing only in proximity to the lower surface of the isolation and insulation film. By selectively implanting the first conductivity type impurities into the element region from above the main surface of the semiconductor substrate, a third impurity region is formed to have a third impurity concentration peak existing only in proximity to the surface of the element region.

According to the method of manufacturing a semiconductor device according to the still further aspect of the present invention, first conductivity type impurities are implanted and second conductivity type impurities are further implanted under predetermined energy after formation of an isolation oxide film. As a result, a first impurity concentration peak exists only in proximity to the lower surface of the isolation and insulation film. Thus, the method prevents formation of an impurity concentration peak in an element region inevitably formed by a conventional method of forming a retrograde well structure.

In a method of manufacturing a semiconductor device according to still further aspect of the present invention, a first isolation and insulation film having a first thickness is formed in an element isolation region so as to isolate element regions on a main surface of a semiconductor substrate. By selectively implanting impurities into the semiconductor substrate region through the first isolation and insulation film from above the main surface of the semiconductor substrate, a first impurity region is formed to have a first impurity concentration peak existing only in proximity to the lower surface of the isolation and insulation film in the element isolation region. By processing the first isolation and insulation film, a second isolation and insulation film having a second thickness larger than the first thickness is formed. By implanting impurities into the semiconductor substrate region from above the main surface of the semiconductor substrate, a second impurity region is formed to have a second impurity concentration peak extending from the element isolation region to the element region at a position apart from the lower surface of the isolation and insulation film and from the main surface of the semiconductor substrate. By selectively implanting impurities into the element region from above the main surface of the semiconductor substrate, a third impurity region is formed to have a third impurity concentration peak existing only in proximity to the surface of the element region.

According to the method of manufacturing a semiconductor device according to the still further aspect of the present invention, the first isolation and insulation film having the first thickness is formed. Thereafter, a second isolation and insulation film having the second thickness larger than that of the first isolation and insulation film is formed. This prevents distortion of a nitride film at an edge portion of an isolation oxide film due to growth thereof, thereby preventing destruction of the nitride film. In addition, when ions are implanted under predetermined energy by using the nitride film and the polysilicon film as masks, the first impurity concentration peak exists only in proximity to the lower surface of the isolation oxide film. Therefore, formation of an impurity concentration peak can be avoided which is inevitably formed in an element region as in a conventional method of forming a retrograde well structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
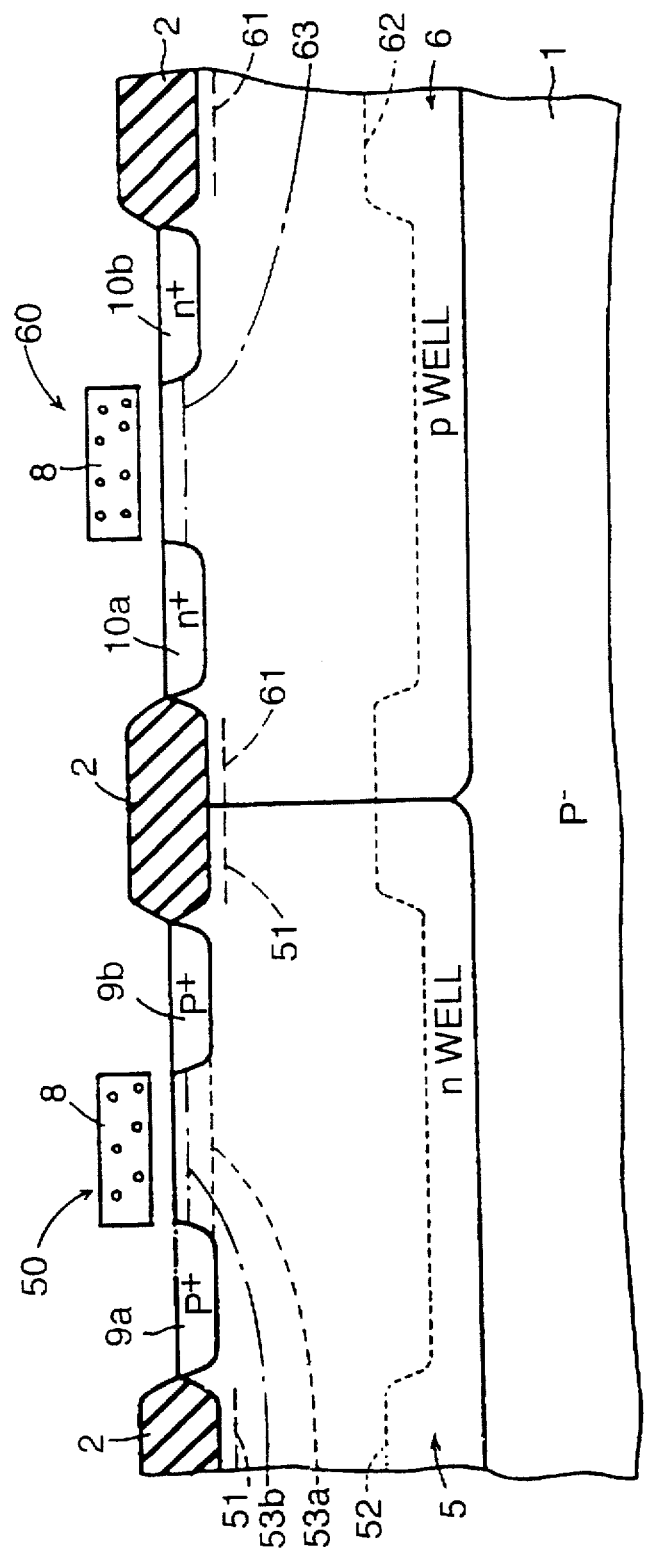
FIG. 1 is a partial sectional view showing the structure of a CMOS semiconductor device according to a first embodiment of the present invention.

One embodiment of the present invention will be described in the following. FIG. 1 is a partial sectional view showing a CMOS semiconductor device using a retrograde well structure according to one embodiment of the present invention.

With reference to FIG. 1, an n well 5 and a p well 6 of conductivity types different from each other are formed on a surface region of a p type silicon substrate 1. An isolation oxide film 2 is formed at a predetermined region on the surface of the n well 5 and the p well 6 to isolate elements. The n well 5 has n type impurity concentration peaks 51, 52 and 53a and a p type impurity concentration peak 53b. The n type impurity concentration peak 51 forms a first impurity concentration peak, the n type impurity concentration peak 52 forms a second impurity concentration peak and the n type impurity concentration peak 53a and the p type concentration peak 53b form a third impurity concentration peak. The n type impurity concentration peak 51 is formed in proximity to the lower surface of the isolation oxide film 2 to serve as a channel stop region for isolating elements. The n type impurity concentration peak 52 exists in a region deep in the silicon substrate 1 to effectively prevent latch-up effects. The n type impurity concentration peak 53a exists only in the element region to prevent punch through of the MOS transistor formed in the region. The p type impurity concentration peak 53b exists only in the element region to set the threshold voltage of the MOS transistor formed in the region to an optimum value. A p channel MOS transistor 50 is formed on the surface of thus structured n well 5. The p channel MOS transistor 50 is a buried channel type field effect transistor. The buried channel type field effect transistor is a field effect transistor including a carrier passing region provided not on a surface of a semiconductor but on the inside thereof. The p channel MOS transistor 50 includes a gate electrode 8 and a pair of $p^+$ impurity regions 9a and 9b spaced apart from each other with the gate electrode provided therebetween.

The p well 6 has p type impurity concentration peaks 61, 62 and 63. The first p type impurity concentration peak 61 exists only in proximity to the lower surface of the isolation oxide film 2 to serve as a channel stop region for isolating elements. The second p type impurity concentration peak 62 exists in a region deep in the silicon substrate 1 to prevent latch-up effects. The third p type impurity concentration peak 63 exists in proximity to the surface of the element region to prevent punch through of the MOS transistor formed in the region and set a threshold voltage to an optimum value. An n channel MOS transistor 60 is formed on the surface of the p well 6. The n channel MOS transistor 60 includes a gate electrode 8 and a pair of $n^+$ impurity regions 10a and 10b spaced apart from each other with the gate electrode provided therebetween. The n channel MOS transistor 60 is a surface channel type field effect transistor with a region where carriers called channels pass provided along the surface of a semiconductor.

Although FIG. 1 shows one transistor in each of the n well 5 and the p well 6, these wells are provided with a plurality of MOS transistors and other function elements in actuality.

FIGS. 2 to 7 are partial sectional views showing sequential steps of a method of manufacturing only the p well 6 region shown in FIG. 1. The following is a description of the method of manufacturing a p well 6 according to one embodiment of the present invention.

Figure 2:
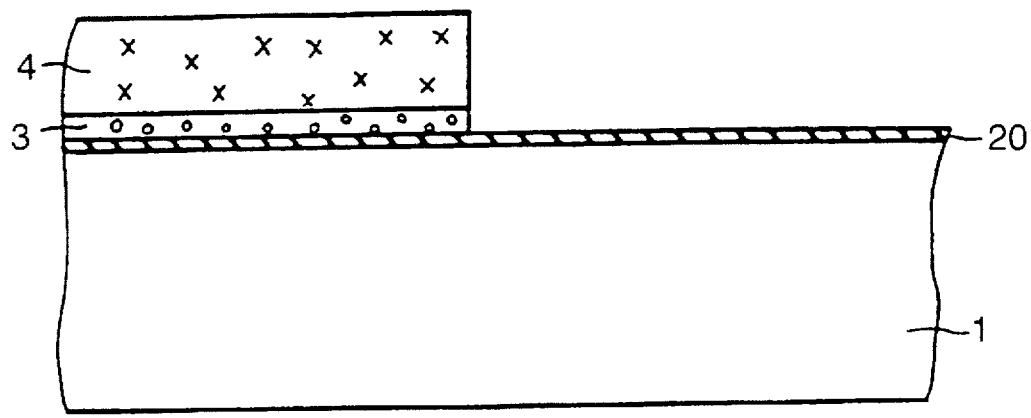
FIG. 2 is a partial sectional view showing a first step of a method of forming a p type well according to the first embodiment of the present invention.

With reference to FIG. 2, an underlying oxide film 20 is formed on the surface of a silicon substrate 1 by thermal oxidation. A polysilicon film 3 and a nitride film 4 are formed on the underlying oxide film 20 by a CVD method. The nitride film 4 and the polysilicon film 3 are selectively removed by photolithography and reactive ion etching. As a result, the underlying oxide film 20 exposes its surface at an element isolation region, while the nitride film 4 and the polysilicon film 3 are left in an element region.

Figure 3:
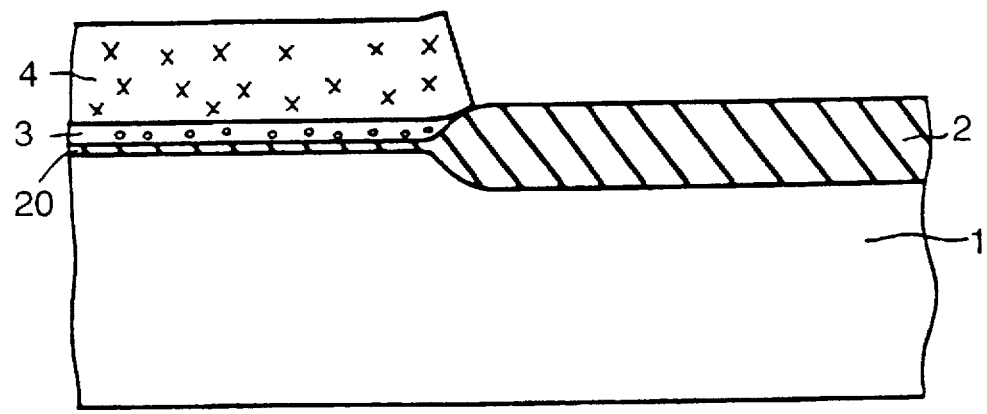
FIG. 3 is a partial sectional view showing a second step of the method of forming a p well according to the first embodiment of the present invention.

With reference to FIG. 3, a thick isolation oxide film 2 is formed by thermally oxidizing the underlying oxide film 20 with its surface exposed.

Figure 4:
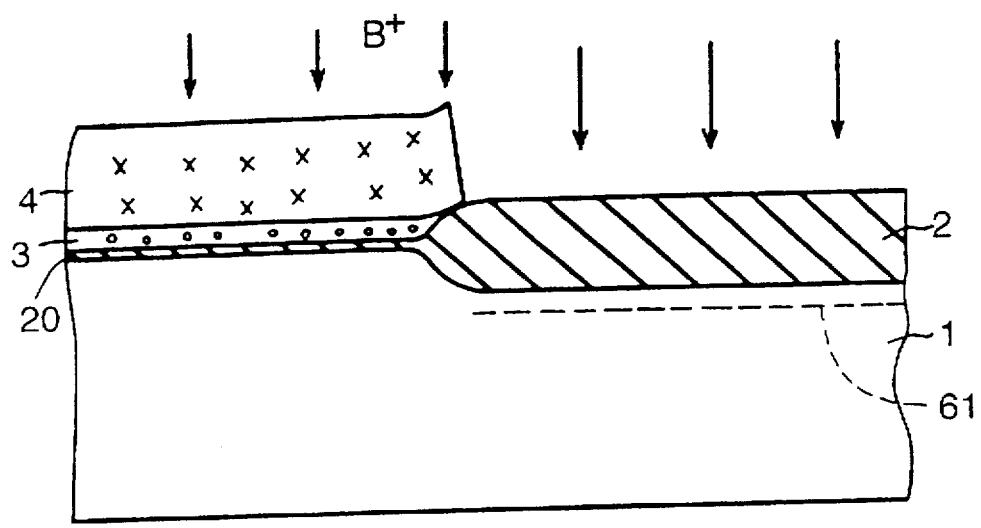
FIG. 4 is a partial sectional view showing a third step of the method of forming a p well according to the first embodiment of the present invention.

Thereafter, boron ions ($B^+$) as p type impurity ions are implanted in the silicon substrate 1 by using the nitride film 4 and the polysilicon film 3 as masks as shown in FIG. 4. Such first ion implantation for forming a retrograde well is carried out with a dose of $1.0 \times 10^{12} - 1.0 \times 10^{13}$ cm$^{-2}$ under 120–180 keV. As a result, an impurity region having the first p type impurity concentration peak 61 (the concentration of which is up to about $10^{17}$ cm$^{-3}$) is formed only in proximity to the lower surface the isolation oxide film 2 in the element isolation region.

Figure 5:
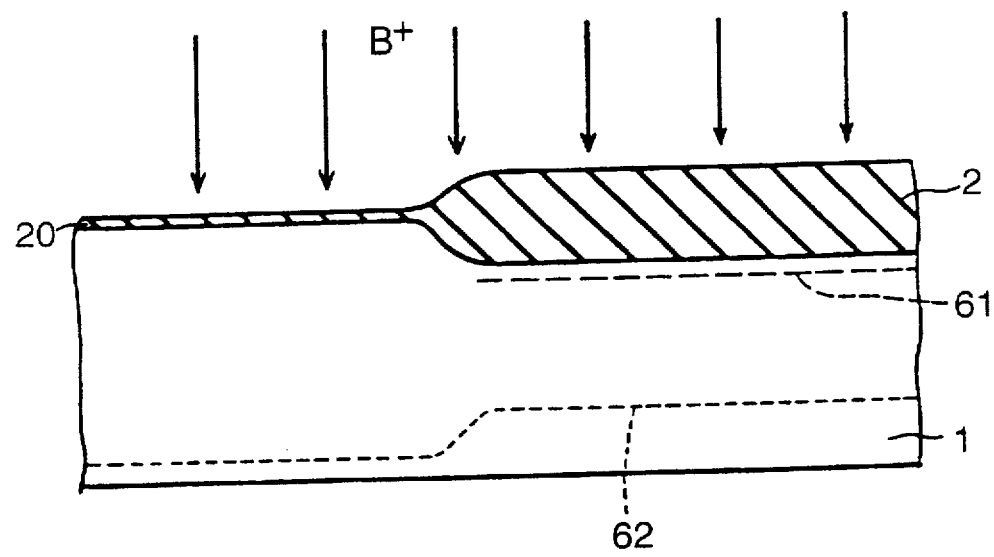
FIG. 5 is a partial sectional view showing a fourth step of the method of forming a p well according to the first embodiment of the present invention.

With reference to FIG. 5, the nitride film 4 and the polysilicon film 3 are removed. Another boron ions is implanted in the silicon substrate 1. The second ion implantation is carried out with a dose of $1.0 \times 10^{13} - 1.0 \times 10^{14}$ cm$^{-2}$ under 500–700 keV. As a result, an impurity region having the second p type impurity concentration peak 62 (the concentration of which is up to about $10^{18}$ cm$^{-3}$) is formed deep in the silicon substrate 1 from the element isolation region toward the element region.

Figure 6:
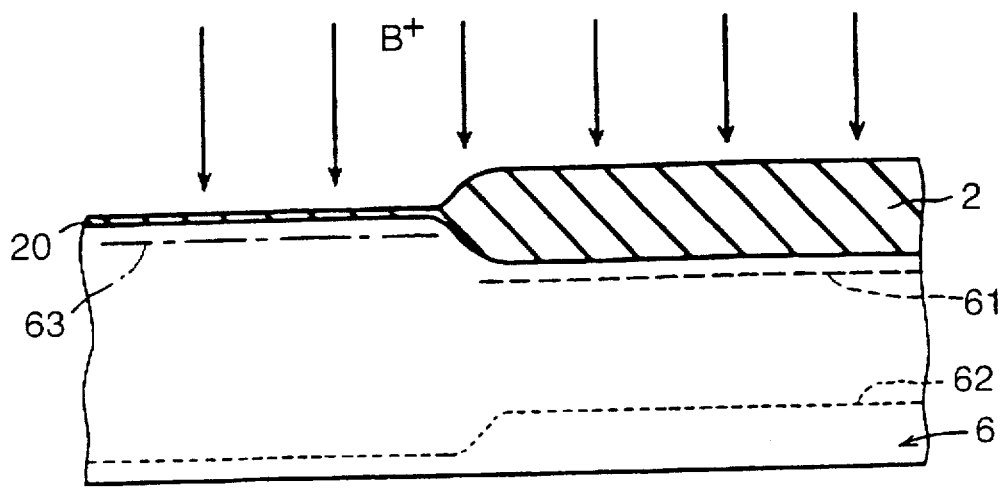
FIG. 6 is a partial sectional view showing a fifth step of the method of forming a p well according to the first embodiment of the present invention.

With reference to FIG. 6, boron ions are implanted in the silicon substrate 1 by using the isolation oxide film 2 as a mask. The third ion implantation is carried out with a dose amount of $1.0 \times 10^{12} - 1.0 \times 10^{13}$ cm$^{-2}$ under 30–70 keV. As a result, an impurity region having the third p type impurity concentration peak 63 (the concentration of which is up to about $10^{17}$ cm$^{-3}$) is formed only in proximity to the surface of the element region. The p type retrograde well 6 having the p type impurity concentration peaks 61, 62 and 63 is formed in this manner. Thermal treatment can be given to the silicon substrate in order to activate the regions having the first and the second p type impurity concentration peaks 61 and 62 prior to the implantation of boron ions for forming the region having the p type impurity concentration peak 63 to serve to control a threshold voltage.

Figure 7:
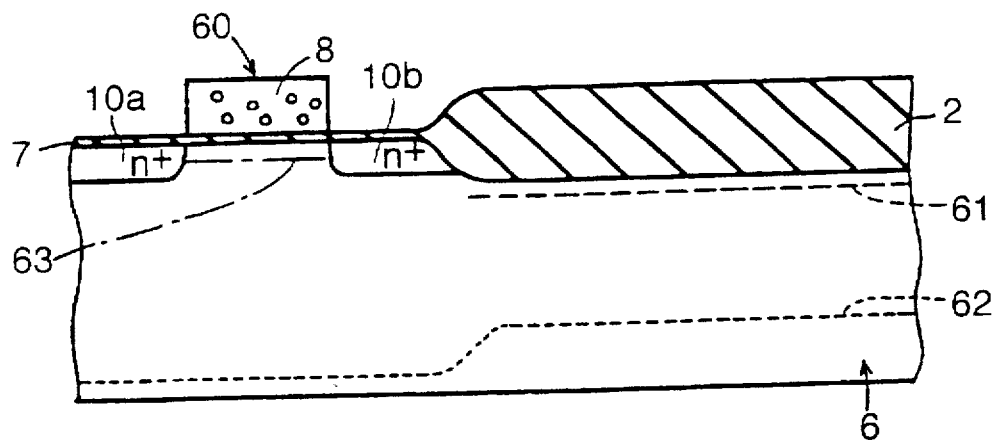
FIG. 7 is a partial sectional view showing a sixth step of the method of forming a p well according to the embodiment of the present invention.

As shown in FIG. 7, the underlying oxide film 20 in the element region is removed and then a gate oxide film 7 is formed in the region. A polysilicon layer including phosphorus, for example, as n type impurities is formed on the gate oxide film 7 by the CVD method. The polysilicon layer is selectively removed by photolithography and reactive ion etching to form a gate electrode 8 of an $n^+$ polysilicon layer. Phosphorus or arsenic ions as n type impurities are implanted in the region of the p well 6 by using the gate electrode 8 as a mask. As a result, $n^+$ impurity regions 10a and 10b are formed. An n channel MOS transistor 60 is formed in the region of the p well 6 in this manner. While an n channel MOS transistor having a single drain structure is formed in this embodiment, an n channel MOS transistor having a LDD structure can be formed.

Figure 8:
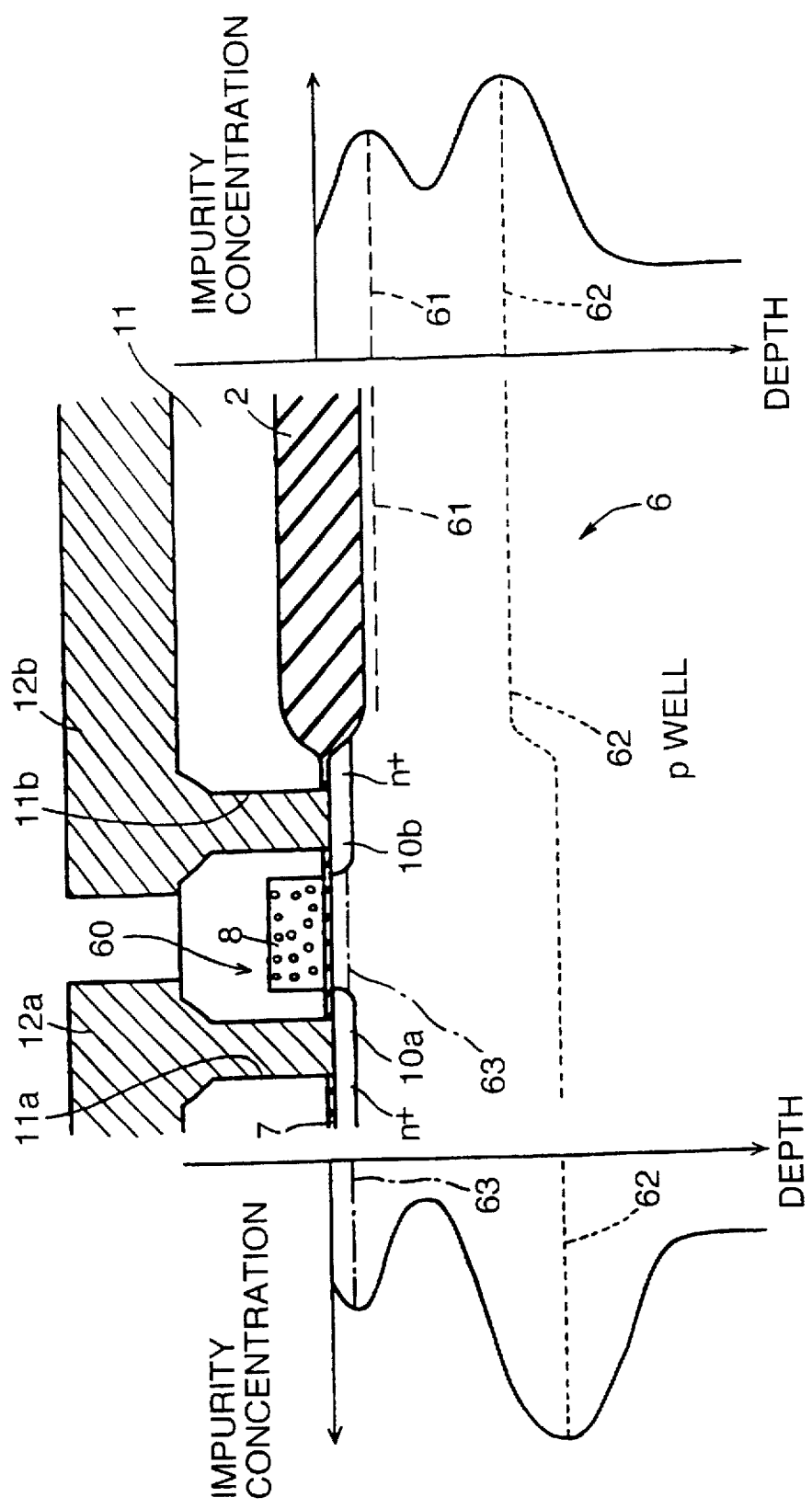
FIG. 8 is a diagram showing a relationship between a p well structure and an impurity concentration in the direction of depth according to the first embodiment of the present invention.
Figure 9:
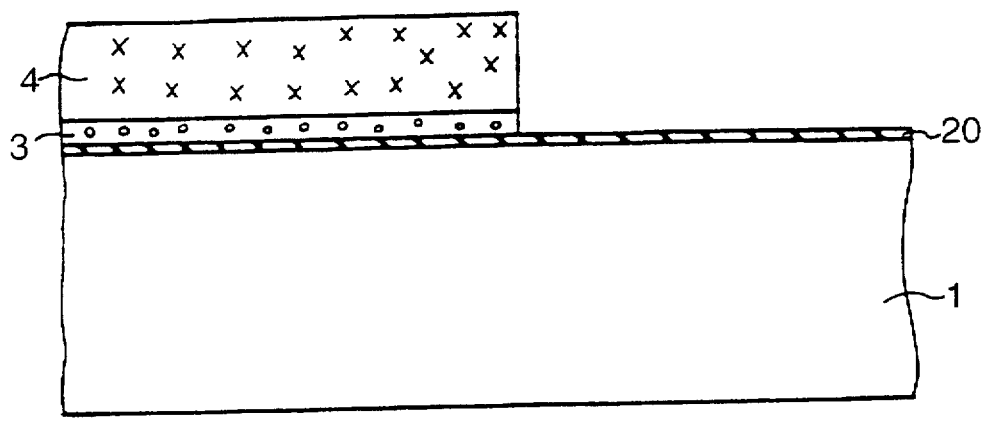
FIG. 9 is a partial sectional view showing a first step of a method of forming an n well according to the first embodiment of the present invention.

FIG. 8 shows a relationship between the structures of thus formed p type retrograde well 6 and n channel MOS transistor 60 and a concentration of the impurities in the depth direction. As shown in FIG. 8, an isolation film 11 is formed to cover the n channel MOS transistor 60. The isolation film 11 is provided with contact holes 11a and 11b to expose the surfaces of the $n^+$ impurity regions 10a and 10b. Wiring layers 12a and 12b are formed to be connected with the $n^+$ impurity regions 10a and 10b through the contact holes 11a and 11b, respectively.

As shown in FIG. 4, according to the method of forming a retrograde well structure of the present invention, the nitride film 4 and the polysilicon film 3 are not removed after a formation of the isolation oxide film 2 but are used as masks for ion implantation. Therefore, implantation of boron ions with predetermined energy by using the nitride film 4 and the polysilicon film 3 as masks results in a formation of the p type impurity concentration peak 61 only in proximity to the lower surface of the isolation oxide film 2. Unlike a conventional method of forming a retrograde well structure, such a p type impurity concentration peak can be avoided which is inevitably formed in an element region. As a result, since there exists no p type impurity concentration peak extending from the first p type impurity concentration peak 61 into the element region as shown in FIG. 8, a substrate effect constant of the n channel MOS transistor 60 formed in the element region can be decreased. Consequently, the threshold voltage of the n channel MOS transistor 60 will not greatly fluctuate even if a substrate bias voltage is applied due to noise generated in the substrate or external noise.

FIGS. 9 to 14 are partial sectional views showing sequential steps of the method of manufacturing the n well 5 and the buried channel type p channel MOS transistor 50 of FIG. 1. The following is a description of a method of forming an n type retrograde well according to one embodiment of the present invention.

An underlying oxide film 20 is formed on a surface of a p type silicon substrate by thermal oxidation. A polysilicon film 3 and a nitride film 4 are formed on the underlying oxide film 20 by the CVD method. The nitride film 4 and the polysilicon film 3 are selectively removed by photolithography and reactive ion etching. As a result, the underlying oxide film 20 exposes its surface in an element isolation region, while the polysilicon film 3 and the nitride film 4 are left in an element region.

Figure 10:
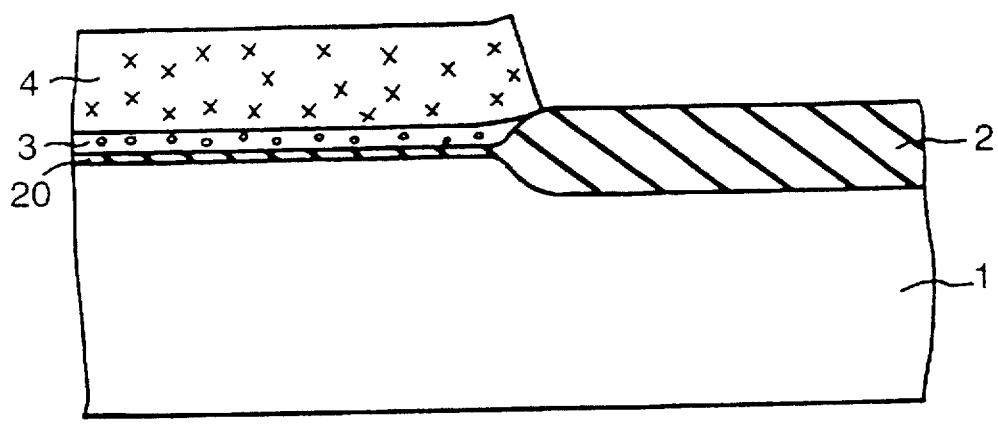
FIG. 10 is a partial sectional view showing a second step of the method of forming an n well according to the first embodiment of the present invention.

Then as shown in FIG. 10, the underlying oxide film 20 is thermally oxidized by using the nitride film 4 and the polysilicon film 3 as masks to form a thick isolation oxide film 2.

Figure 11:
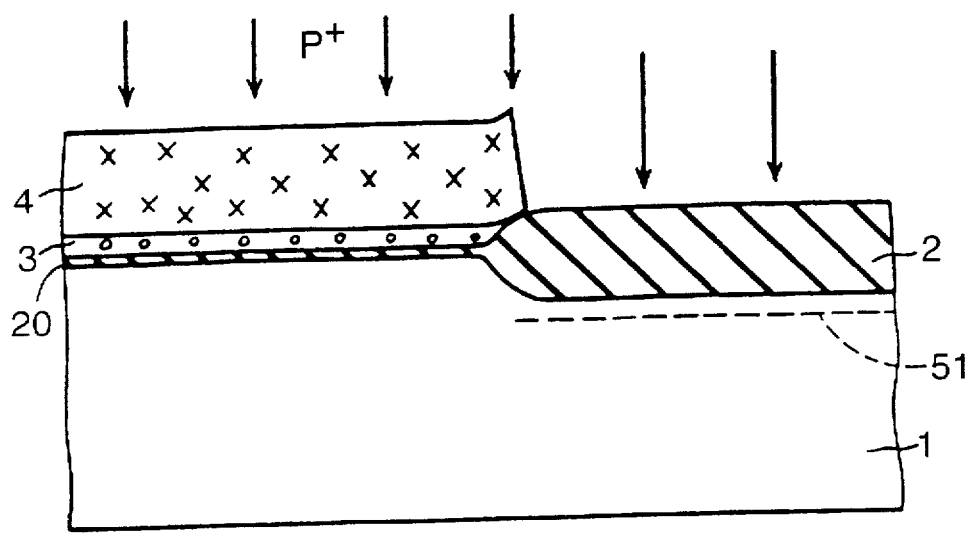
FIG. 11 is a partial sectional view showing a third step of the method of forming an n well according to the first embodiment of the present invention.

Then as shown in FIG. 11, phosphorus ions ($p^+$) as n type impurity ions are implanted in the silicon substrate 1 by using the nitride film 4 and the polysilicon film 3 as masks.

Such first ion implantation is carried out with a dose of $1.0 \times 10^{12}$–$1.0 \times 10^{13}$ cm$^{-2}$ under 400–450 keV. As a result, an impurity region having a first n type impurity concentration peak 51 (the concentration of which is up to about $10^{17}$ cm$^{-3}$) is formed only in proximity to the lower surface of the isolation oxide film 2.

Figure 12:
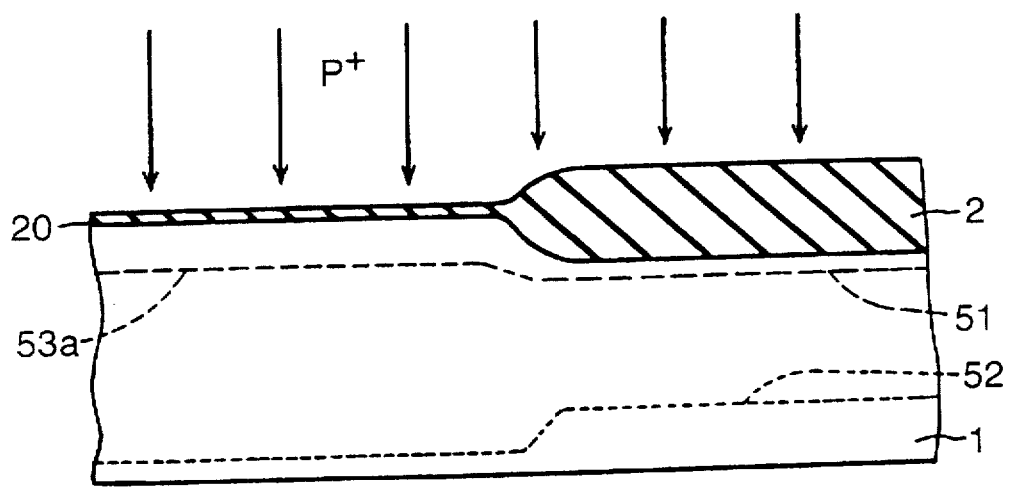
FIG. 12 is a partial sectional view showing a fourth step of the method of forming an n well according to the first embodiment of the present invention.

As shown in FIG. 12, the nitride film 4 and the polysilicon film 3 are removed. Phosphorus ions are implanted twice in the whole surface of the silicon substrate 1. The second ion implantation is carried out with a dose of $1.0 \times 10^{13}$–$1.0 \times 10^{14}$ cm$^{-2}$ under 1.0–1.5 MeV. As a result, an impurity region having a second n type impurity concentration peak 52 (the concentration of which is up to about $10^{18}$ cm$^{-3}$) at a region deep in the silicon substrate 1 is formed extending from the element isolation region to the element region. Third ion implantation is carried out with a dose of $1.0 \times 10^{12}$–$1.0 \times 10^{13}$ cm$^{-2}$ under 150–200 keV. As a result, an impurity region having an n type impurity concentration peak 53a (the concentration of which is up to about $10^{17}$ cm$^{-3}$) and constituting a part of the third impurity concentration peak is formed only at a shallow region of the element region.

Figure 13:
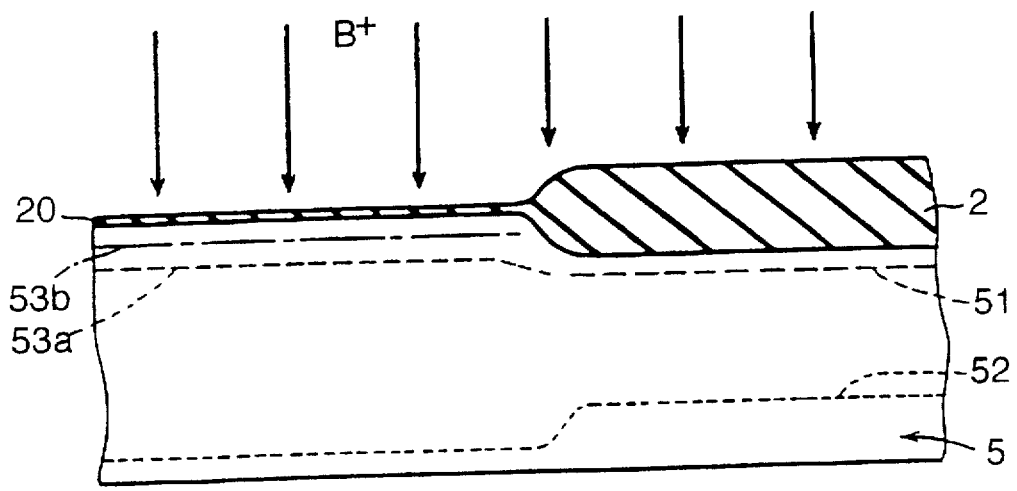
FIG. 13 is a partial sectional view showing a fifth step of the method of forming an n well according to the first embodiment of the present invention.
Figure 14:
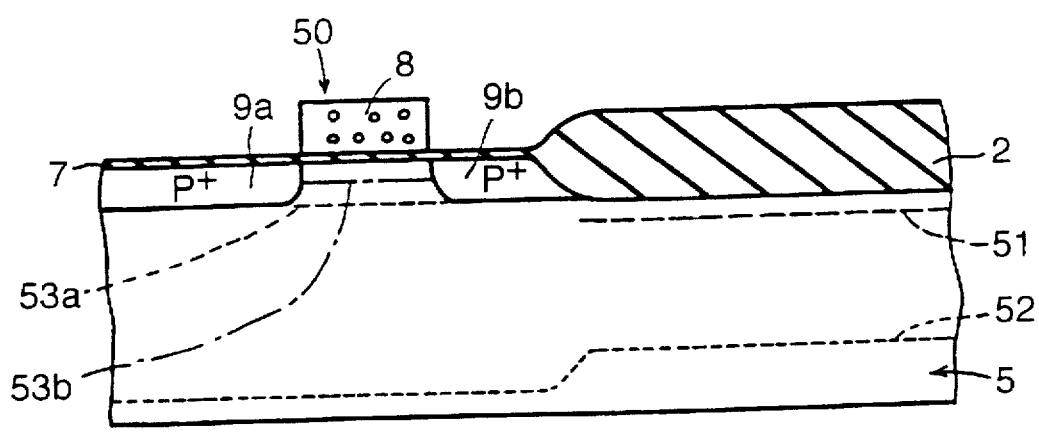
FIG. 14 is a partial sectional view showing a sixth step of the method of forming an n well according to the first embodiment of the present invention.

As shown in FIG. 13, boron ions (B$^+$) as p type impurity ions are further implanted in the silicon substrate 1. Such fourth ions implantation is carried out with a dose of $1.0 \times 10^{12}$–$1.0 \times 10^{13}$ cm$^{-2}$ under 20–50 keV. As a result, an impurity region having a p type impurity concentration peak 53b constituting a part of the third impurity concentration peak is formed only in proximity to the surface of the element region. An n well 5 having the impurity concentration peaks 51, 52, 53a and 53b is formed in this manner. At this time, heat treatment can be given to the silicon substrate prior to implanting boron ions for controlling a threshold voltage in order to activate the region having the impurity concentration peaks 51, 52 and 53a.

A gate oxide film 7 is formed on the surface of the element region after the removal of the underlying oxide film 20. A polysilicon layer including phosphorus, for example, as n type impurities, is formed on the gate oxide film 7 by the CVD method. The polysilicon layer is selectively removed by photolithography and reactive ion etching to form a gate electrode 8 of n$^+$ polysilicon layer. Boron or boron fluoride ions are implanted as p type impurities in the n type well 5 by using the gate electrode 8 as a mask. As a result, p$^+$ impurity regions 9a and 9b are formed. A buried channel type p channel MOS transistor 50 is formed in the region of the n type retrograde well 5 in this manner. While the above described embodiment forms a p channel MOS transistor of single drain structure, a p channel MOS transistor of any drain structure can be formed.

Figure 15:
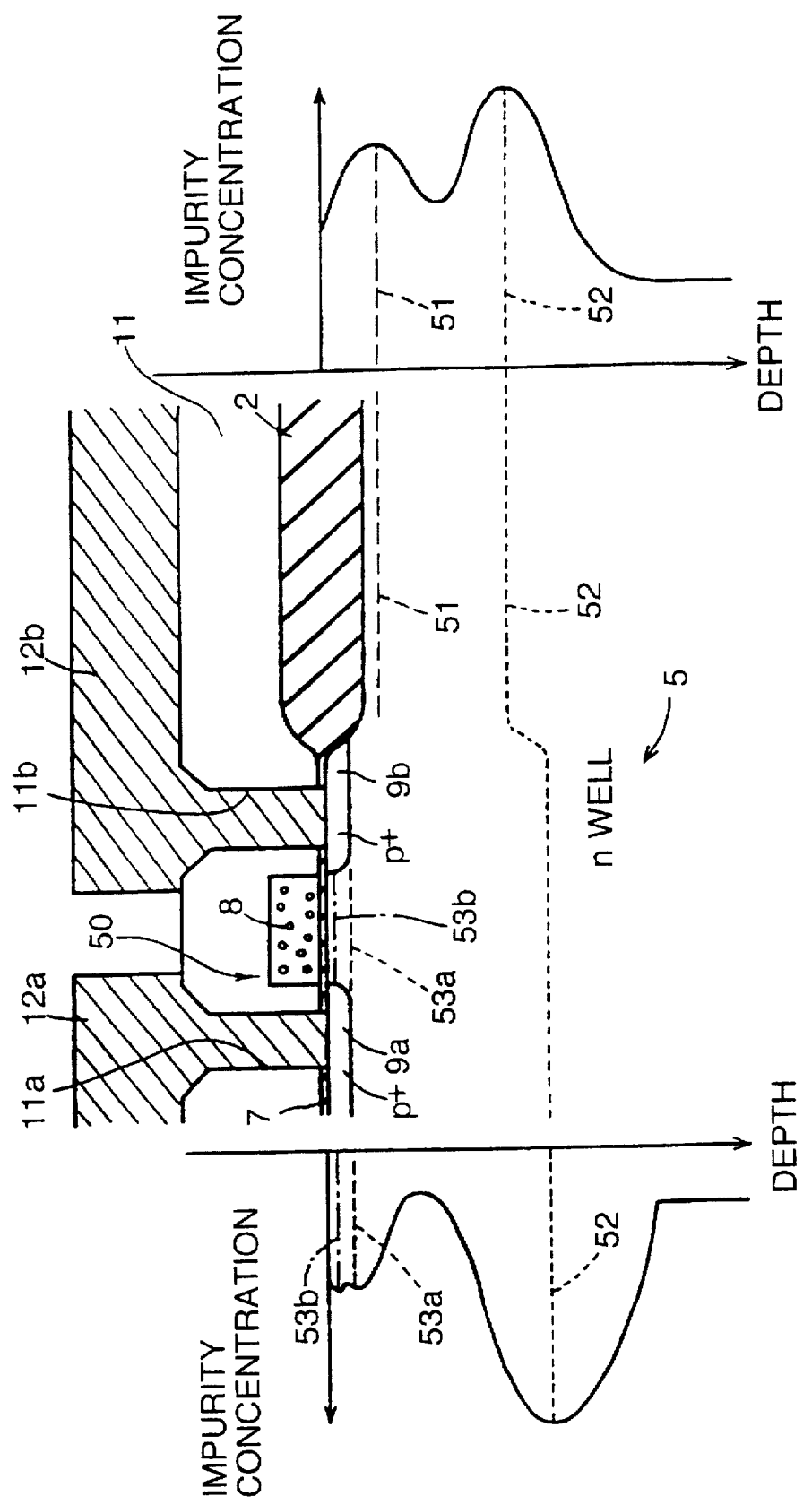
FIG. 15 is a diagram showing a relationship between an n well structure and an impurity concentration distribution in the direction of depth according to the first embodiment of the present invention.

FIG. 15 shows a relationship between the structures of thus formed n well 5 and p channel MOS transistor 50 and an impurity concentration distribution in the depth direction.

In order to manufacture the CMOS semiconductor device of FIG. 1, the p well 6 is formed through the steps shown in FIGS. 2 to 6, with the n well region covered with a resist, while the n well 5 is formed through the steps of FIGS. 9 to 13, with the p well region covered with a resist. Either of the p well 6 and the n well 5 can be formed first. After the formation of the p well 6 and the n well 5, the n channel MOS transistor 60 is formed in the p well 6 region by the step shown in FIG. 7, with the region of the n well 5 covered with a resist, while the p channel MOS transistor 50 is formed in the n well region 5 through the step shown in FIG. 14, with the region of the p well 6 covered with a resist.

Although the above-described embodiment forms a surface channel type n channel MOS transistor and a buried channel type p channel MOS transistor in the regions of a p type retrograde well and an n type retrograde well, respectively, such retrograde well structure is also applicable to a formation of a surface channel type p channel MOS transistor and a buried channel type n channel MOS transistor.

Description will be made of a method of manufacturing a semiconductor device according to a second embodiment of the present invention.

FIGS. 16 to 20 are partial sectional views showing steps of a method of manufacturing only a p well 6 region of FIG. 1. The following is a description of a method of manufacturing a p well 6 according to the second embodiment of the present invention.

Figure 16:
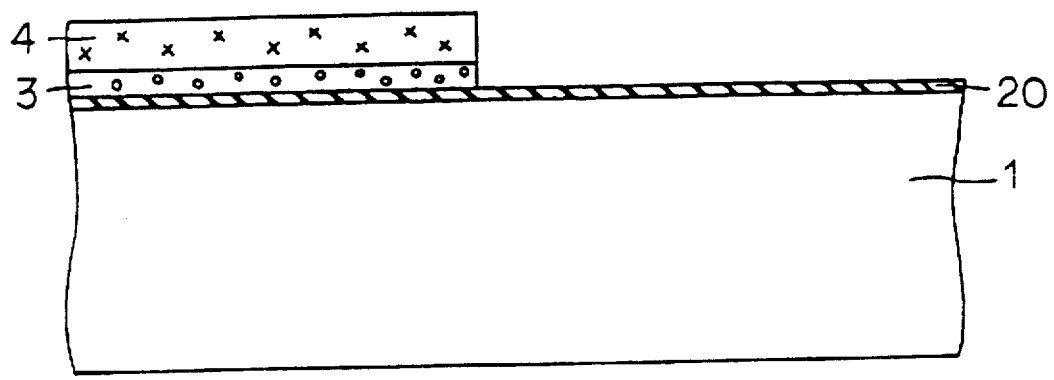
FIG. 16 is a partial sectional view showing a first step of a method of forming a p well according to a second embodiment of the present invention.

First with reference to FIG. 16, an underlying oxide film 20 is formed on a surface of a silicon substrate 1 by thermal oxidation. A polysilicon film 3 is formed on the underlying oxide film 20 by the CVD method. Further formed on the surface of the polysilicon film 3 is a nitride film 4 of 1500 Å–3000 Å by the CVD method. The nitride film and the polysilicon film 3 are selectively removed by photolithography and reactive ion etching. As a result, the underlying oxide film 20 exposes its surface in the element isolation region where the nitride film 4 and the polysilicon film 3 are left.

Figure 17:
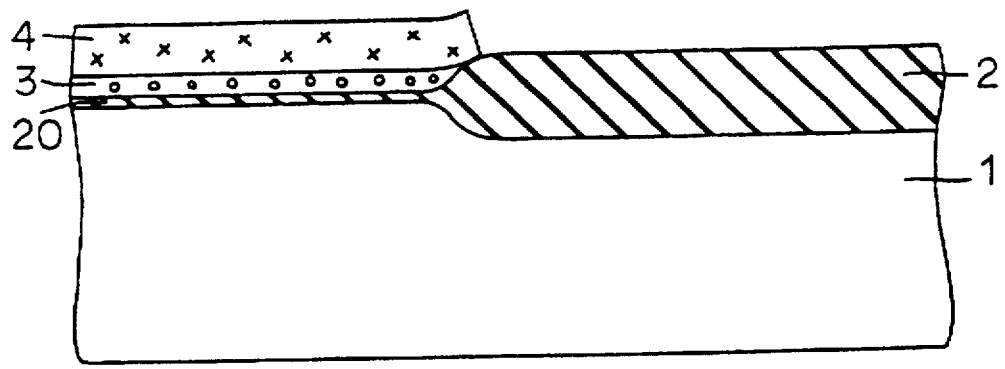
FIG. 17 is a partial sectional view showing a second step of the method of forming a p well according to the second embodiment of the present invention.

Then with reference to FIG. 17, an isolation oxide film 2 of a thickness of 3000 Å–5000 Å is formed by thermally oxidizing the underlying oxide film 20 with its surface exposed.

Figure 18:
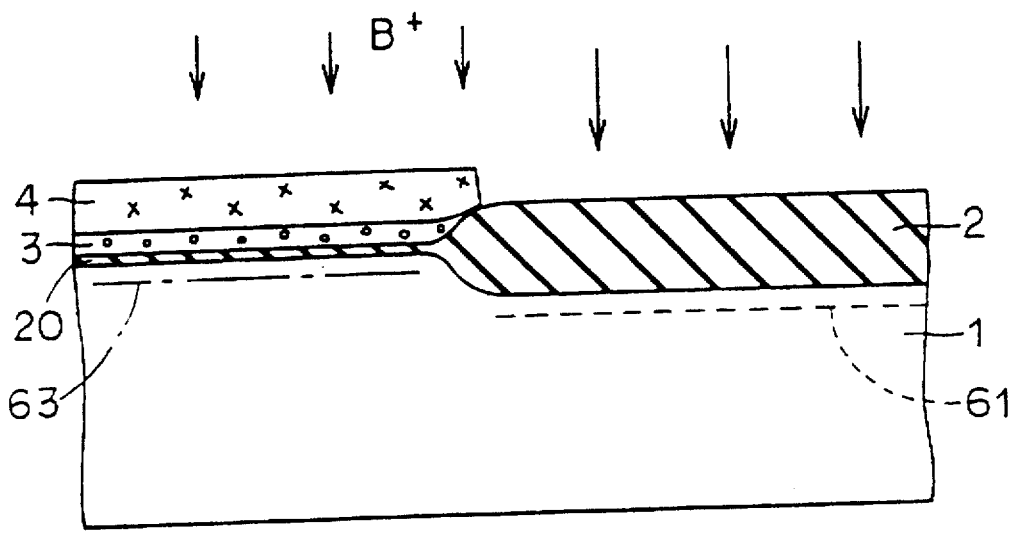
FIG. 18 is a partial sectional view showing a third step of the method of forming a p well according to the second embodiment of the present invention.

Thereafter as shown in FIG. 18, boron ions (B$^+$), as p type impurity ions, are implanted in the entire surface of the silicon substrate 1. At this time, the ion implantation is carried out with a dose of $1.0 \times 10^{12}$–$1.0 \times 10^{13}$ cm$^{-2}$ under 90–180 keV. As a result, an impurity region having a first p type impurity concentration peak 61 (the concentration of which is up to about $10^{17}$ cm$^{-3}$) is formed in proximity to the lower surface of the isolation oxide film 2 in the element isolation region and at the same time, an impurity region having a third p type impurity concentration peak 63 (the concentration of which is up to about $10^{17}$ cm$^{-3}$) is formed in proximity to the surface of the element region.

Figure 19:
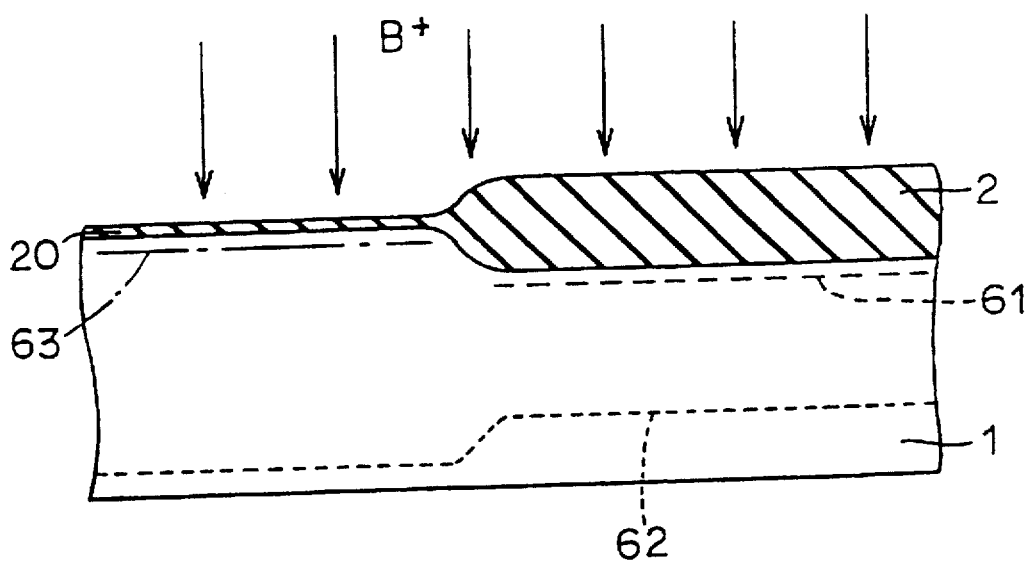
FIG. 19 is a partial sectional view showing a fourth step of the method of forming a p well according to the second embodiment of the present invention.

Then with reference to FIG. 19, the nitride film 4 and the polysilicon film 3 are removed. Another boron ions is implanted in the silicon substrate 1. The second ion implantation is carried out with a dose of $1.0 \times 10^{13}$–$1.0 \times 10^{14}$ cm$^{-2}$ under 500–700 keV. As a result, an impurity region having an impurity concentration peak 62 of the second type (the concentration of which is up to about $10^{18}$ cm$^{-3}$) at a region deep in the silicon substrate 1 is formed extending from the element isolation region toward the element region. Thus, a p type retrograde well 6 is formed having the p type impurity concentration peaks 61, 62 and 63.

Figure 20:
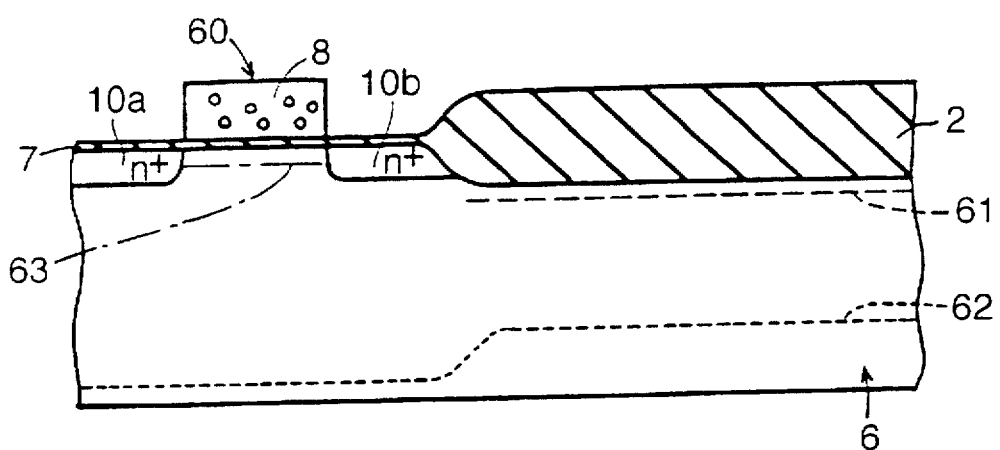
FIG. 20 is a partial sectional view showing a fifth step of the method of forming a p well according to the second embodiment of the present invention.

Lastly as shown in FIG. 20, a gate oxide film 7 is formed on a region from which the underlying oxide film 20 in the element region is removed. A polysilicon layer including phosphorus as n type impurities, for example, is formed on the gate oxide film 7 by the CVD method. Selective removal of the polysilicon layer by photolithography and reactive ion etching forms a gate electrode 8 of a n$^+$ polysilicon layer. Furthermore, phosphorus or arsenic ions are implanted as n type impurities in the region of the p well 6 by using the gate electrode 8 as a mask. As a result, n$^+$ impurity regions 10a and 10b are formed. A n channel MOS transistor 60 is formed in the region of the p well 6 in this manner. Although an n channel MOS transistor having a single drain structure is formed in this embodiment, an n channel MOS transistor having a LDD structure may be formed.

The structures and impurity concentration in depth direction of thus formed p type retrograde well 6 and n channel MOS transistor 60 can be the same as those of the first embodiment shown in FIG. 8. In addition, as shown in FIG. 8, an insulation film 11 is also formed to cover the n channel MOS transistor 60 in this second embodiment. The insulation film 11 is provided with contact holes 11a and 11b to expose the surfaces of n$^+$ impurity regions 10a and 10b. Wiring layers 12a and 12b are formed to be connected with the n$^+$ impurity regions 10a and 10b through the contact holes 11a and 11b, respectively.

As shown in FIG. 18, according to the method of forming a retrograde well structure of the present embodiment, after the formation of the insulation oxide film 2, ions are implanted in the entire substrate surface without removing the nitride film 4 and the polysilicon film. At this time, with the nitride film 4 having a predetermined thickness, implantation of the boron ions by predetermined energy results in a formation of the p type impurity concentration peak 61 in proximity to the lower surface of the isolation oxide film 2 and a formation of the third p type impurity concentration peak 63 in proximity to the surface of the element region. Therefore, it is possible to reduce the steps of forming third p type impurity concentration peak as compared with the first embodiment. In addition, a p type impurity concentration peak, which is inevitably formed in the conventional method of forming a retrograde well structure, can be avoided. As a result, there exists no p type impurity concentration peak extending from the first p type impurity concentration peak 61 into the element region as shown in FIG. 8, so that a substrate effect constant of the n channel MOS transistor 60 formed in the element region can be decreased. Consequently, a threshold voltage of the n channel MOS transistor 60 will not greatly fluctuate even if a substrate bias voltage is applied due to noise generated in the substrate or external noise.

FIGS. 21 to 25 are partial sectional views showing sequential steps of the method of manufacturing the n well 5 and the buried channel type p channel MOS transistor 50 of FIG. 1. The following is a description of a method of forming an n type retrograde well according to a second embodiment of the present invention.

Figure 21:
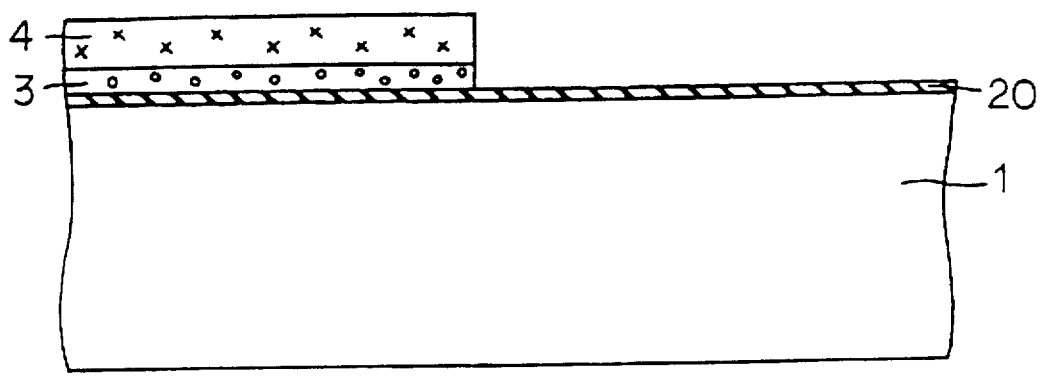
FIG. 21 is a partial sectional view showing a first step of a method of forming a n well according to the second embodiment of the present invention.

With reference to FIG. 21, an underlying oxide film 20 is formed on a surface of a p type silicon substrate 1 by thermal oxidation. A polysilicon film 3 is formed on the underlying oxide film 20 by the CVD method. A nitride film 4 is formed on the surface of the polysilicon film 3 to have a thickness of 1500 Å–3000Å by the CVD method. The nitride film 4 and the polysilicon film 3 are selectively removed by photolithography and reactive ion etching. As a result, the underlying oxide film 20 exposes its surface in an element isolation region, while the polysilicon film 3 and the nitride film 4 are left in an element region.

Figure 22:
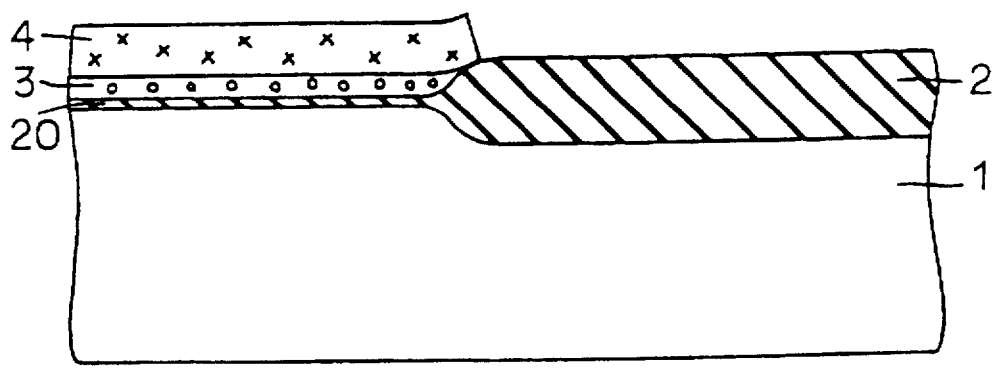
FIG. 22 is a partial sectional view showing a second step of the method of forming a n well according to the second embodiment of the present invention.

Then as shown in FIG. 22, the underlying oxide film 20 is thermally oxidized by using the nitride film 4 and the polysilicon film 3 as masks to form an isolation oxide film 2 with a thickness of 3000 Å–5000 Å.

Figure 23:
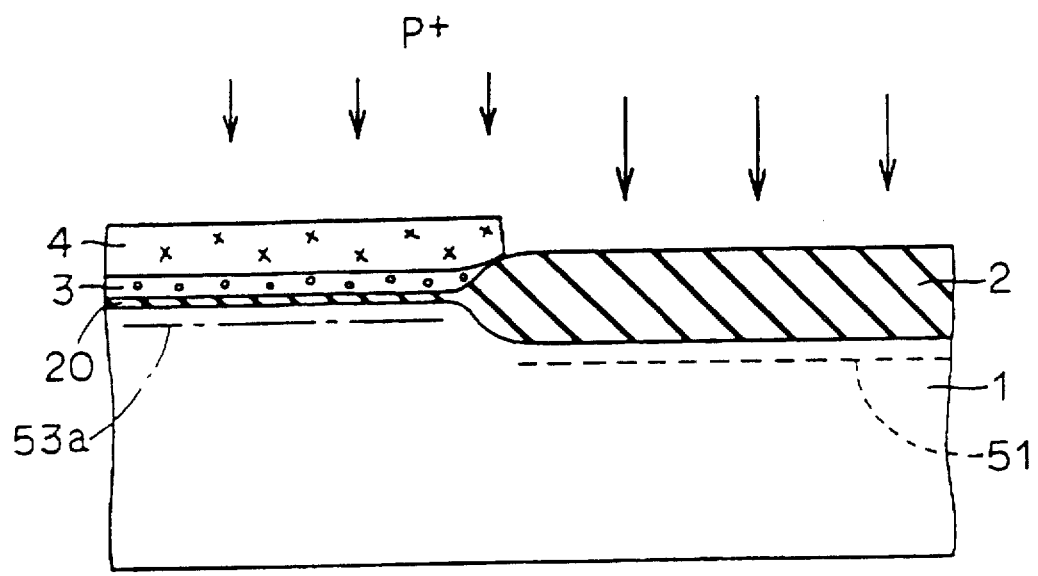
FIG. 23 is a partial sectional view showing a third step of the method of forming a n well according to the second embodiment of the present invention.

Thereafter, as shown in FIG. 23, phosphorus ions (P$^+$) as n type impurity ions are implanted in the entire silicon substrate 1. The ion implantation is carried out with a dose of $1.0 \times 10^{12}$–$1.0 \times 10^{13}$ cm$^{-2}$ under 250–450 keV. As a result, impurity regions are simultaneously formed, one having a first n type impurity concentration peak 51 (the concentration of which is up to about $10^{17}$ cm$^{-3}$) formed in proximity to the lower surface of the isolation oxide film 2 and the other having a n type impurity concentration peak 53a (concentration of which is up to about $10^{17}$ cm$^{-3}$) constituting a part of the third impurity concentration peak formed only in a shallow region of the element region.

Figure 24:
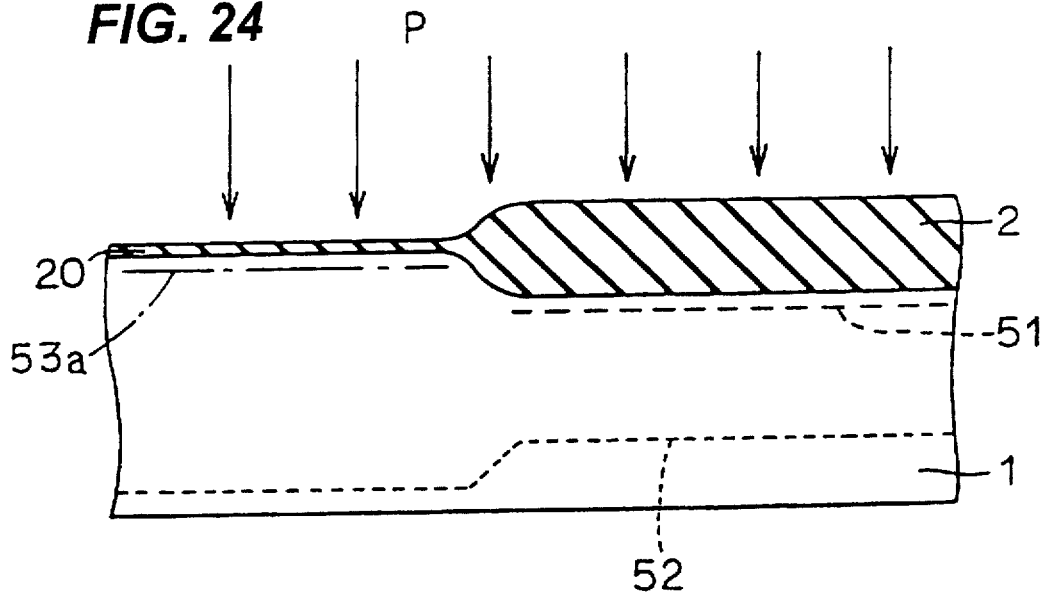
FIG. 24 is a partial sectional view showing a fourth step of the method of forming a n well according to the second embodiment of the present invention.

As shown in FIG. 24, the nitride film 4 and the polysilicon film 3 are removed. Phosphorus ions are implanted in the entire surface of the silicon substrate 1. The ion implantation is carried out with a dose of $1.0 \times 10^{13}$–$1.0 \times 10^{14}$ cm−2 under 1.0–1.5 MeV. As a result, an impurity region having a second n type impurity concentration peak 52 (the concentration of which is up to about $10^{18}$ cm$^{-3}$) formed at a position deep in the silicon substrate 1 is formed extending from the element isolation region to the element region.

Figure 25:
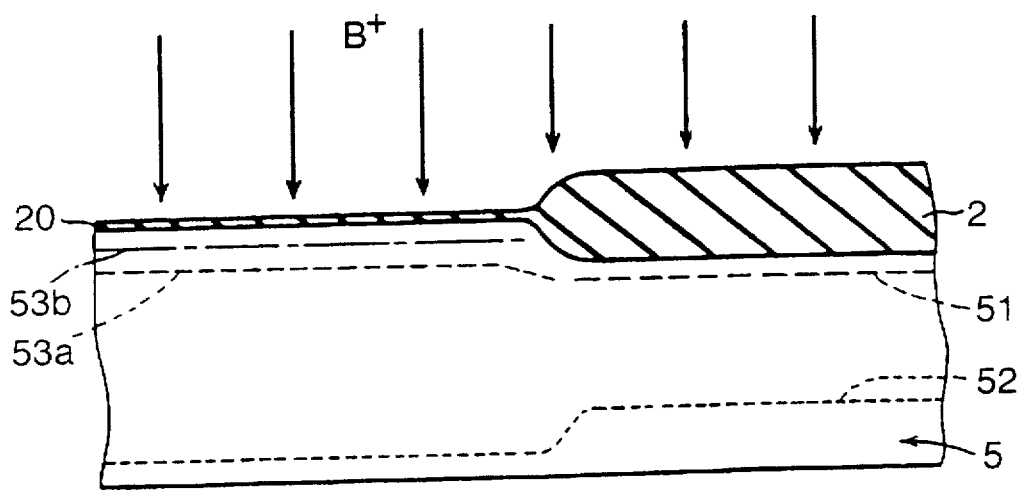
FIG. 25 is a partial sectional view showing a fifth step of the method of forming a n well according to the second embodiment of the present invention.

As shown in FIG. 25, boron ions (B$^+$) as p type impurity ions are implanted in the silicon substrate 1. The ion implantation is carried out with a dose of $1.0 \times 10^{12}$–$1.0 \times 10^{13}$ cm$^{-2}$ under 10–50 keV. As a result, an impurity region having a p type impurity concentration peak 53B constituting a part of the third impurity concentration peak is formed only in proximity to the surface of the element region. An n well 5 having the impurity concentration peaks 51, 52, 53a and 53b is formed in this manner. At this time, in order to activate the region having the impurity concentration peaks 51, 52 and 53a, heat treatment can be given to the silicon substrate prior to implanting boron ions for controlling a threshold voltage.

Figure 26:
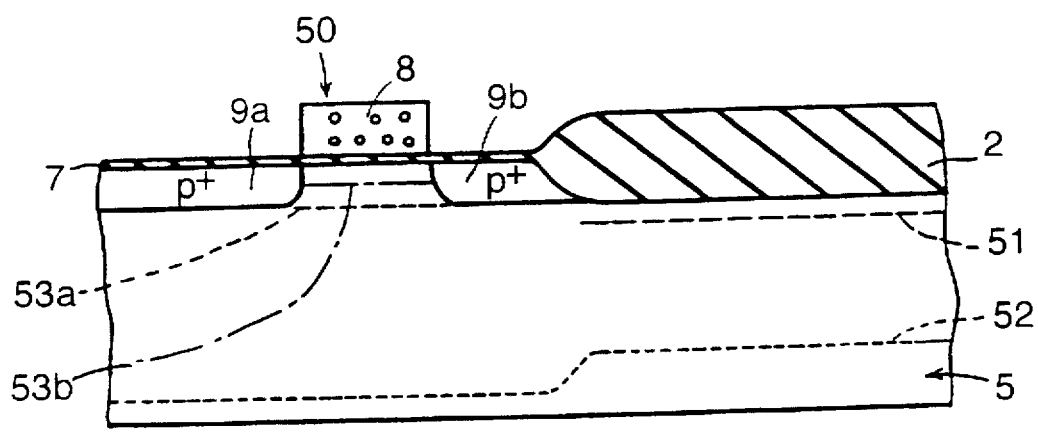
FIG. 26 is a partial sectional view showing a sixth step of the method of forming a n well according to the second embodiment of the present invention.

Lastly as shown in FIG. 26, after the underlying oxide film 20 is removed, a gate oxide film 7 is again formed on the surface of the element region. A polysilicon layer including phosphorus as n type impurities, for example, is formed on the gate oxide film 7 by the CVD method. The polysilicon layer is selectively removed by photolithography and reactive ion etching to form a gate electrode 8 of an n$^+$ polysilicon layer. Boron or boron fluoride ions are implanted as p type impurities in the n type well 5 by using the gate electrode 8 as a mask. As a result, p$^+$ impurity regions 9a and 9b are formed. A buried channel type p channel MOS transistor 50 is formed in the region of the n type retrograde well 5 in this manner. While a p channel MOS transistor having a single drain structure is formed in the above-described embodiment, a p channel MOS transistor having any drain structure can be formed.

The above-described n well 5 and p channel MOS transistor 50 can be formed to have the same structure and impurity concentration distribution in a depth direction as those of the first embodiment shown in FIG. 15.

In the second embodiment, in order to manufacture the CMOS semiconductor device of FIG. 1, the p well 6 is formed through the steps shown in FIGS. 16 to 19, with the n well region covered with a resist, while the n well 5 is formed through the steps shown in FIGS. 21 to 25, with the p well region covered with a resist. Either of the p well 6 and the n well 5 can be formed first. After the formation of the p well 6 and the n well 5, the n channel MOS transistor 60 is formed in the p well 6 region by the step of FIG. 20, with the region of the n well 5 covered with a resist, and the p channel MOS transistor 50 is formed in the n well 5 region by the step of FIG. 26, with the p well 6 region covered with a resist.

Although in the above-described second embodiment, a surface channel type n channel MOS transistor and a buried channel type p channel MOS transistor are formed in a p type retrograde well region and an n type retrograde well region, respectively, such retrograde well structure is also applicable to a formation of a surface channel type p channel MOS transistor and a buried channel type n channel MOS transistor.

A method of manufacturing a semiconductor device according to a third embodiment of the present invention will be described in the following.

FIGS. 27 to 32 are partial sectional view showing sequential steps of a method of manufacturing a p well 6 region of FIG. 1. The following is a description of a method of manufacturing a p well 6 according to a third embodiment.

Figure 27:
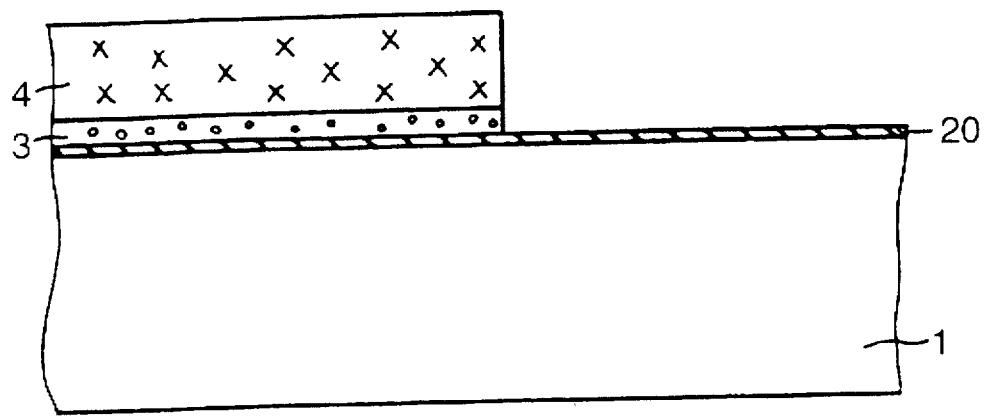
FIG. 27 is a partial sectional view showing a first step of a method of forming a p well according to a third embodiment of the present invention.

First with reference to FIG. 27, an underlying oxide film 20 is formed on a surface of a silicon substrate 1 by thermal oxidation. A polysilicon layer 3 is formed on the underlying oxide film 20 by the CVD method. A nitride film 4 is formed to have a thickness of 1500 Å–3000 Å on the surface of the polysilicon film 3 by the CVD method. The nitride film 4 and the polysilicon film 3 are selectively removed by photolithography and reactive ion etching. As a result, the underlying oxide film 20 exposes its surface in an element isolation region, while the nitride film 4 and the polysilicon film 3 are left in an element region.

Figure 28:
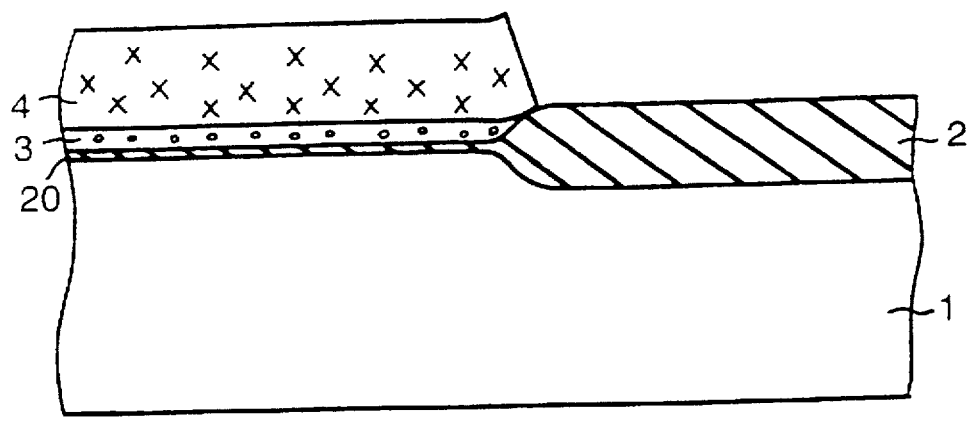
FIG. 28 is a partial sectional view showing a second step of the method of forming a p well according to the third embodiment of the present invention.

With reference to FIG. 28, the underlying oxide film 20 with its surface exposed is thermally oxidized to form an isolation oxide film 2 with a thickness of 3000 Å–5000 Å.

Figure 29:
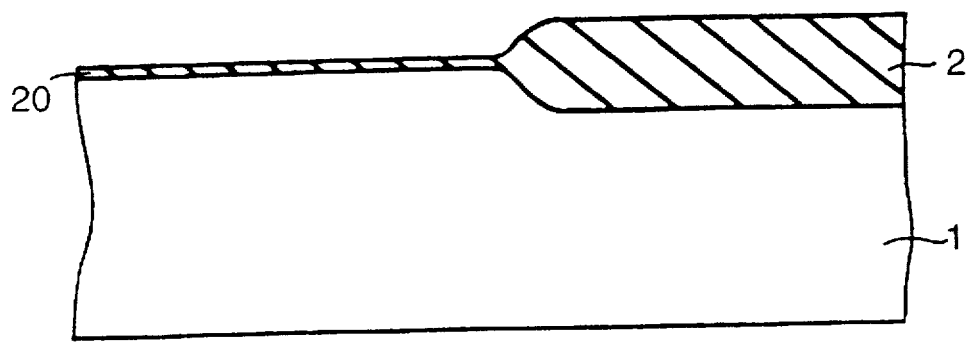
FIG. 29 is a partial sectional view showing a third step of the method of forming a p well according to the third embodiment of the present invention.

Thereafter, the nitride film 4 and the polysilicon film 3 are removed as shown in FIG. 29.

Figure 30:
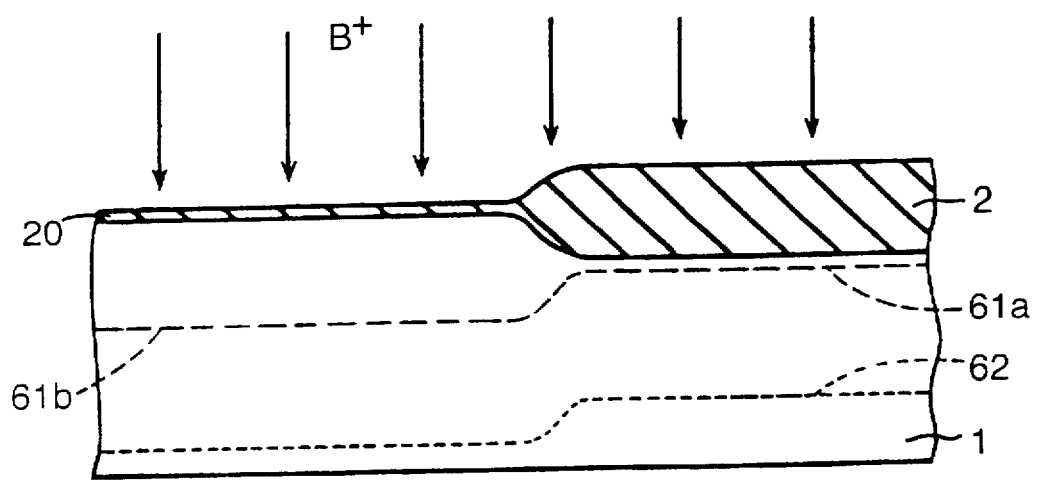
FIG. 30 is a partial sectional view showing a fourth step of the method of forming a p well according to the third embodiment of the present invention.

With reference to FIG. 30, boron ions (B$^+$) as p type impurity ions are implanted twice in the silicon substrate 1. The first ion implantation is carried out with a dose of $1.0 \times 10^{12}$–$1.0 \times 10^{13}$ cm$^{-2}$ under 90–180 keV. As a result, a p type impurity region having a first p type impurity concentration peak 61a is formed under the isolation oxide film 2. At this time, an impurity region having a p type impurity concentration peak 61b is inevitably formed also in the element region. The second ion implantation is carried out with a dose of $1.0 \times 10^{13}$–$1.0 \times 10^{14}$ cm$^{-2}$ under 500–700 keV. As a result, a p type impurity region having a second p type impurity concentration peak 62 at a region deep in the silicon substrate 1 is formed.

Figure 31:
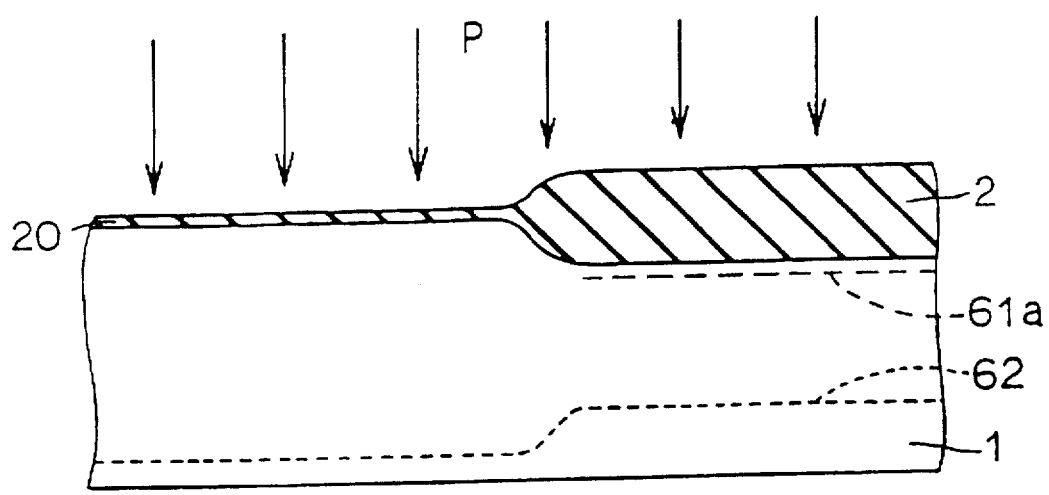
FIG. 31 is a partial sectional view showing a fifth step of the method of forming a p well according to the third embodiment of the present invention.

With reference to FIG. 31, phosphorus ions (P$^+$) are implanted as n type impurity ions in the silicon substrate 1. The ion implantation is carried out with a dose of $1.0 \times 10^{12}$–$1.0 \times 10^{13}$ cm$^{-2}$ under 200/250 keV, thereby canceling the p type impurity concentration peak 61b formed in the element region.

Figure 32:
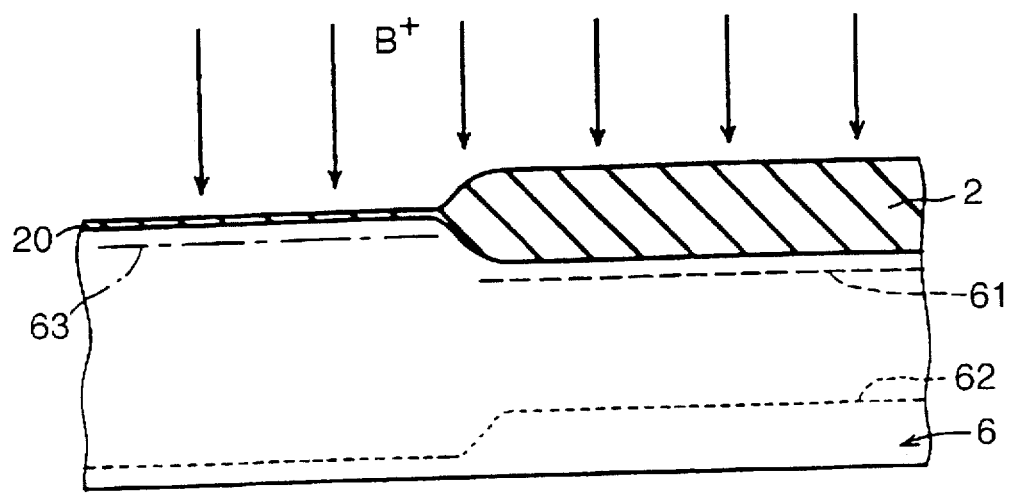
FIG. 32 is a partial sectional view showing a sixth step of the method of forming a p well according to the third embodiment of the present invention.

With reference to FIG. 32, boron ions are implanted in the silicon substrate 1 by using the oxide film 2 as a mask. The ion implantation is carried out with a dose of $1.0 \times 10^{12}$–$1.0 \times 10^{13}$ cm$^{-2}$ under 10–70 keV. As a result, an impurity region having a third p type impurity concentration peak 63 (the concentration of which is up to about $10^{17}$ cm$^{-3}$) is formed only in proximity to the surface of the element region. A p type retrograde well 6 having the p type impurity concentration peaks 61, 62, and 63 is formed in this manner.

Figure 33:
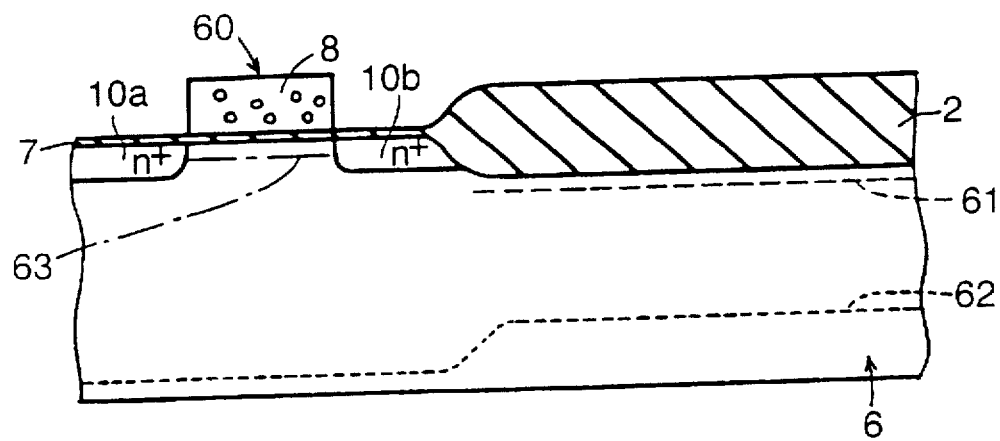
FIG. 33 is a partial sectional view showing a seventh step of the method of forming a p well according to the third embodiment of the present invention.

Lastly as shown in FIG. 33, after the underlying oxide film 20 in the element region is removed, a gate oxide film 7 is again formed in that region. A polysilicon layer including phosphorus as n type impurities, for example, is formed on the gate oxide film 7 by the CVD method. The polysilicon layer is selectively removed by photolithography and reactive ion etching to form a gate electrode 8 of an n$^+$ polysilicon layer. Furthermore, phosphorus or arsenic ions as n type impurities are implanted in the p well 6 by using the gate electrode 8 as a mask. As a result, n$^+$ impurity regions 10a and 10b are formed. An n channel MOS transistor 60 is formed in the p well 6 region in this manner. While an n channel MOS transistor having a single drain structure is formed in the present embodiment, an n channel MOS transistor having a LDD structure can be also formed.

The p type retrograde well 6 and the n channel MOS transistor 60 described above can be formed to have the same structure and impurity concentration in a depth direction as those of the first embodiment shown in FIG. 8. In addition, as shown in FIG. 8, the insulation film 11 is formed to cover the n channel MOS transistor 60. The isolation film 11 is provided with the contact holes 11a and 11b to expose the surfaces of the n$^+$ impurity regions 10a and 10b. The wiring layers 12a and 12b are formed to be connected with the n$^+$ impurity regions 10a and 10b through the contact holes 11a and 11b, respectively.

As shown in FIG. 32, according to the method of forming a retrograde well structure of the present invention, the nitride film and the polysilicon layer are removed after a formation of the isolation oxide film. Thereafter, impurities of a first conductivity type are implanted, which is followed by implantation of impurities of a second conductivity type under predetermined energy. As a result, the first conductivity type impurity region in the element region can be canceled. The p type impurity concentration peak 61 therefore exists only in proximity to the lower surface of the isolation oxide film 2. It is therefore possible to avoid a formation of a p type impurity concentration peak which is inevitably formed in an element region according to a conventional method of forming a retrograde well structure. As a result, as shown in FIG. 8, there exists no p type impurity concentration peak extending from the first p type impurity concentration peak 61 into the element region, a substrate effect constant of the n channel MOS transistor 60 formed in the element region can be decreased. The threshold voltage of the n channel MOS transistor 60 will not greatly fluctuate even if a substrate bias voltage is applied due to noise generated in the substrate or external noise.

FIGS. 34 to 40 are partial sectional views showing sequential steps of the method of manufacturing the n well 5 and the buried channel type p channel MOS transistor 50 of FIG. 1. The following is a description of a method of forming an n type retrograde well according to a third embodiment of the present invention.

Figure 34:
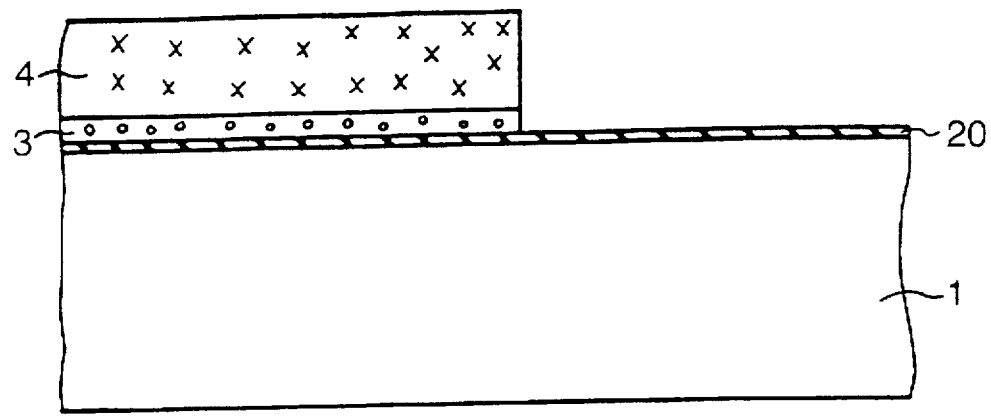
FIG. 34 is a partial sectional view showing a first step of a method of forming a n well according to the third embodiment of the present invention.

With reference to FIG. 34, an underlying oxide film 20 is formed on a surface of a p type silicon substrate 1 by thermal oxidization. A polysilicon film 3 is formed on the underlying oxide film 20 by the CVD method. A nitride film 4 is formed on the surface of the polysilicon film 3 to have a thickness of 1500 Å–3000 Å by the CVD method. The nitride film 4 and the polysilicon film 3 are selectively removed by photolithography and reactive ion etching. As a result, the underlying oxide film 20 exposes its surface in the element isolation region, while the polysilicon film 3 and the nitride film 4 are left in the element region.

Figure 35:
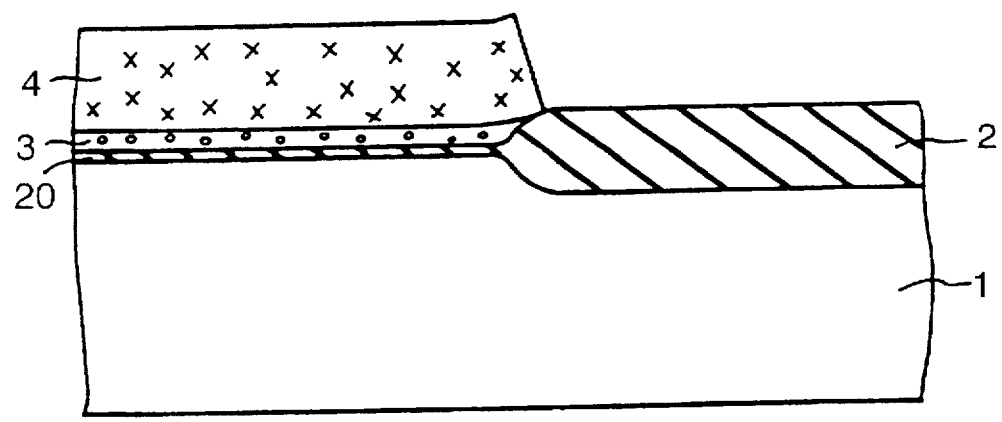
FIG. 35 is a partial sectional view showing a second step of the method of forming a n well according to the third embodiment of the present invention.

Then as shown in FIG. 35, the underlying oxide film 20 is thermally oxidized by using the nitride film 4 and the polysilicon film 3 as masks to form an isolation oxide film 2 having a thickness of 3000 Å–5000 Å.

Figure 36:
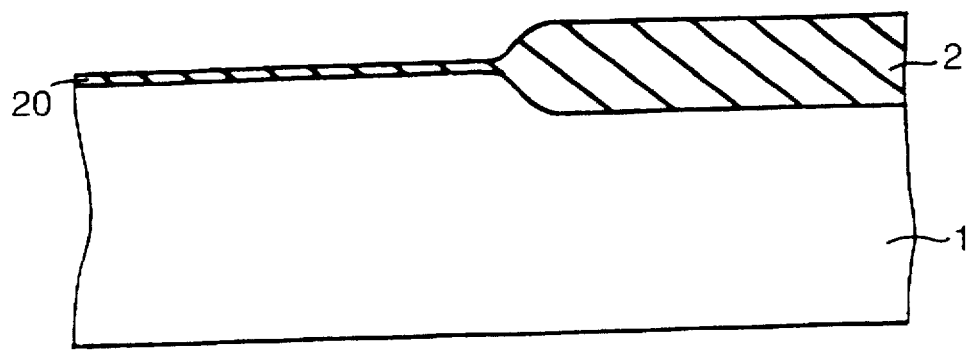
FIG. 36 is a partial sectional view showing a third step of the method of forming a n well according to the third embodiment of the present invention.

Thereafter as shown in FIG. 36, the nitride film 4 and the polysilicon film 3 are removed.

Figure 37:
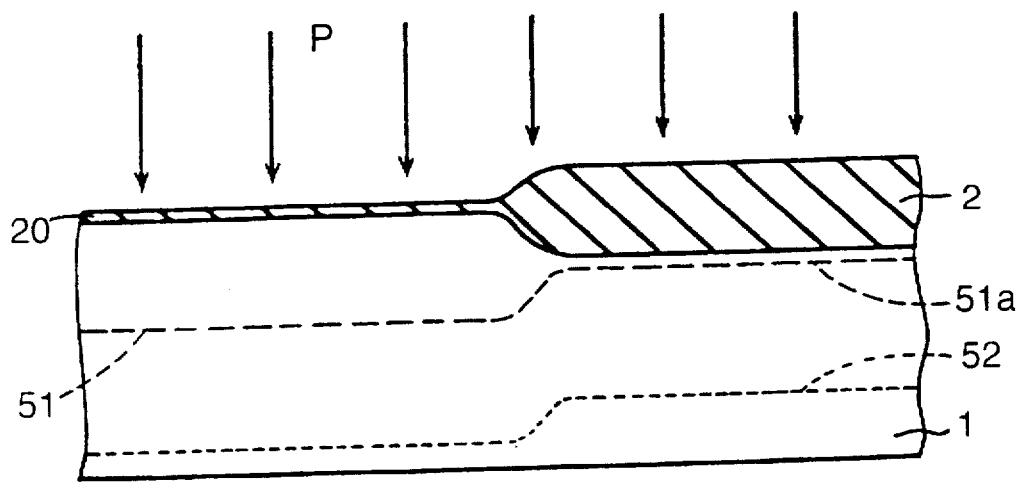
FIG. 37 is a partial sectional view showing a fourth step of the method of forming a n well according to the third embodiment of the present invention.

Then, with reference to FIG. 37, phosphorus ions (P$^+$) are implanted twice as n type impurity ions in the silicon substrate 1. The first ion implantation is carried out with a dose of $1.0 \times 10^{12}$–$1.0 \times 10^{13}$ cm$^{-2}$ under 250–450 keV. As a result, an n type impurity region having a first n type impurity concentration peak 51a is formed under the surface of the isolation oxide film 2. At this time, an impurity region having an n type impurity concentration peak 51b is inevitably formed in the element region. The second ion implantation is carried out with a dose of $1.0 \times 10^{13}$–$1.0 \times 10^{14}$ cm$^{-2}$ under 1.0–1.5 MeV. As a result, an n type impurity region having a second n type impurity concentration peak 52 at a region deep in the silicon substrate 1 is formed.

Figure 38:
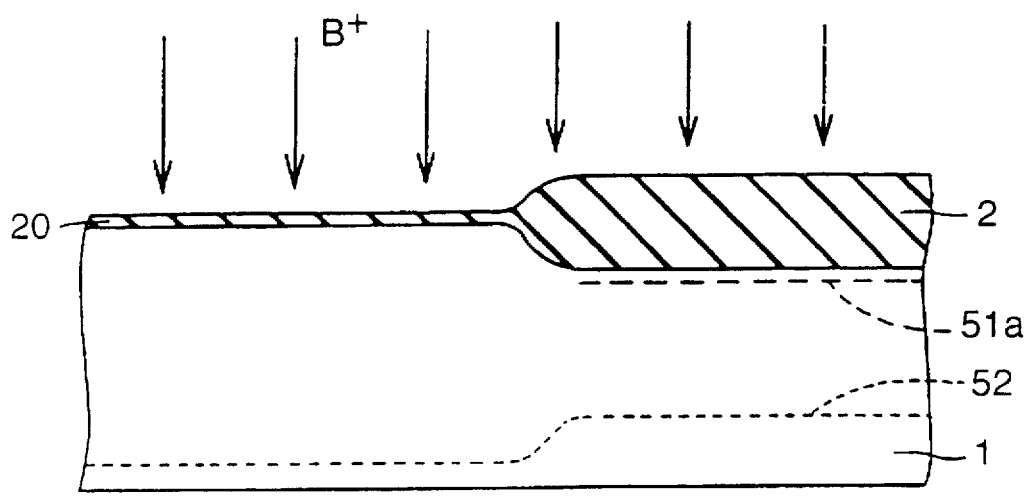
FIG. 38 is a partial sectional view showing a fifth step of the method of forming a n well according to the third embodiment of the present invention.

With reference to FIG. 38, boron ions (B$^+$) are implanted as p type impurity ions in the silicon substrate 1. The ion implantation is carried out with a dose of $1.0 \times 10^{12} - 1.0 \times 10^{13}$ cm$^{-2}$ under 70–90 keV, thereby canceling the n type impurity concentration peak 51b formed in the element region.

Figure 39:
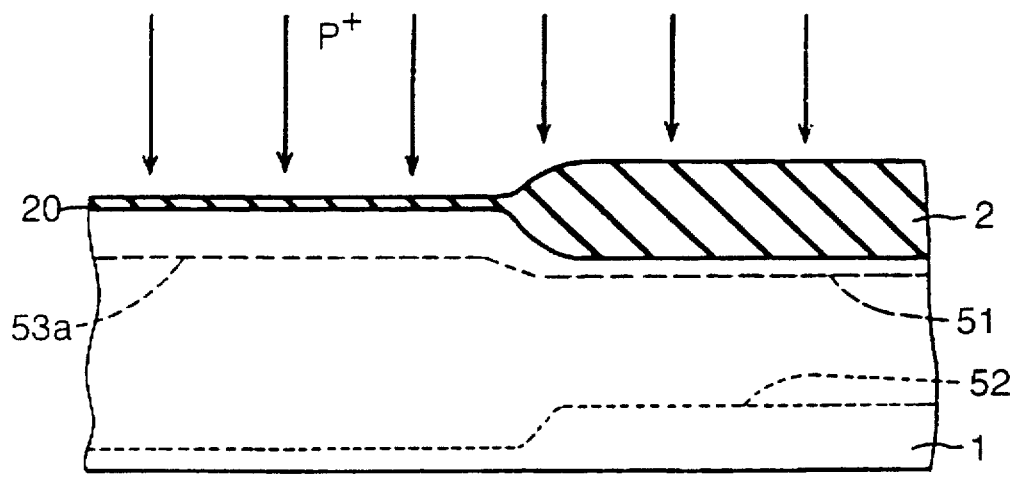
FIG. 39 is a partial sectional view showing a sixth step of the method of forming a n well according to the third embodiment of the present invention.

As shown in FIG. 39, phosphorus ions are implanted in the entire surface of the silicon substrate 1. The ion implantation is carried out with a dose of $1.0 \times 10^{12} - 1.0 \times 10^{13}$ cm$^{-2}$ under 150–200 keV. As a result, an impurity region having an n type impurity concentration peak 53a (the concentration of which is up to about $10^{17}$ cm$^{-3}$) constituting a part of the third impurity concentration peak is formed only at a shallow region of the element region.

Figure 40:
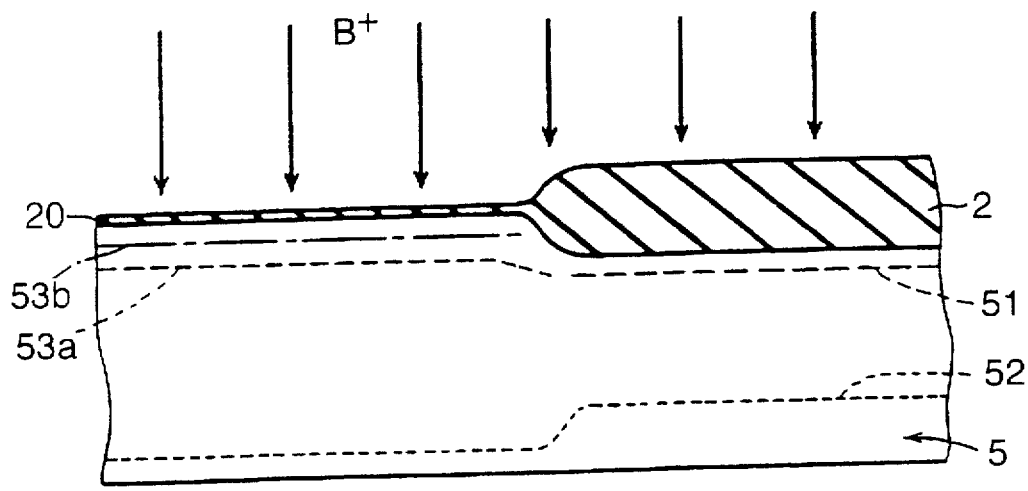
FIG. 40 is a partial sectional view showing a seventh step of the method of forming a n well according to the third embodiment of the present invention.

As shown in FIG. 40, boron ions (B$^+$) are further implanted as p type impurity ions in the silicon substrate 1. The ion implantation is carried out with a dose of $1.0 \times 10^{12} - 1.0 \times 10^{13}$ cm$^{-2}$ under 10–50 keV. As a result, an impurity region having a p type impurity concentration peak 53b constituting a part of the third impurity concentration peak is formed only in proximity to the surface of the element region. An n well 5 having the impurity concentration peaks 51, 52, 53a and 53b is formed in this manner. At this time, in order to activate the region having the impurity concentration peaks 51, 52 and 53a, the silicon substrate may be subjected to heat treatment prior to implanting boron ions for controlling a threshold voltage.

Figure 41:
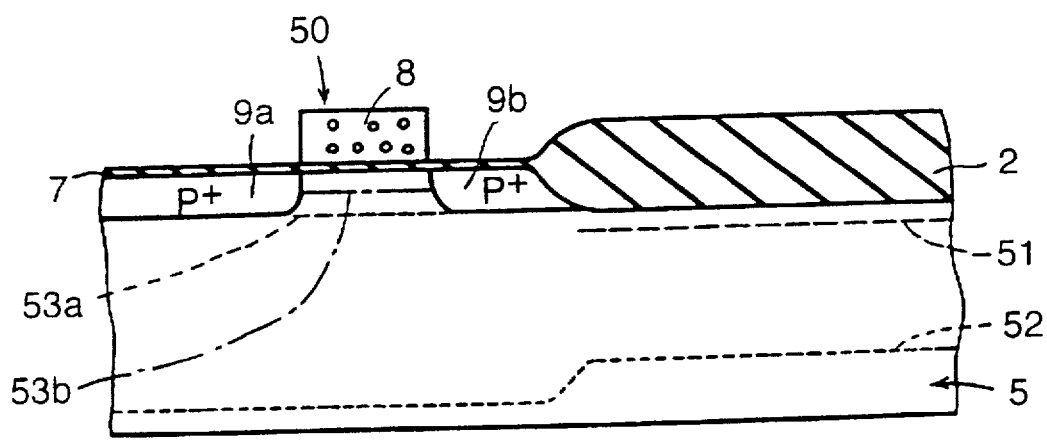
FIG. 41 is a partial sectional view showing an eighth step of the method of forming a n well according to the third embodiment of the present invention.

Lastly as shown in FIG. 41, a gate oxide film 7 is again formed on the surface of the element region after the removal of the underlying oxide film 20. A polysilicon layer including phosphorus as n type impurities, for example., is formed on the gate oxide film 7 by the CVD method. The polysilicon layer is selectively removed by photolithography and reactive ion etching to form a gate electrode 8 of an n$^+$ polysilicon layer. Boron or boron fluoride ions are implanted as p type impurities in the n type well 5 by using the gate electrode 8 as a mask. As a result, p$^+$ impurity regions 9a and 9b are formed. A buried channel type p channel MOS transistor 50 is formed in the region of the n type retrograde well 5 in this manner. Although a p channel MOS transistor having a single drain structure is formed in the above embodiment, a p channel MOS transistor having any drain structure can be formed.

Thus formed n well 5 and p channel MOS transistor 50 can be formed to have the same structure and impurity concentration distribution in a depth direction as those of the first embodiment shown in FIG. 15.

In order to manufacture the CMOS semiconductor device of FIG. 1, the p well 6 is formed through the steps of FIGS. 27 to 32, with the n well region covered with a resist, and the n well 5 is formed through the steps of FIGS. 34 to 40, with the p well region covered with a resist. Either of the p well 6 and the n well 5 can be formed first. After the formation of the p well 6 and the n well 5, the n channel MOS transistor 60 is formed in the region of the p well 6 by the step of FIG. 33, with the region of the n well 5 covered with a resist, and the p channel MOS transistor 50 is formed in the region of the n well 5 by the step of FIG. 41, with the region of the p well 6 covered with a resist.

Although in the above-described third embodiment, a surface channel type n channel MOS transistor and a buried channel type p channel MOS transistor are formed in a region of a p type retrograde well and a region of an n type retrograde well, respectively, such retrograde well structure is also applicable to a formation of a surface channel type p channel MOS transistor and a buried channel type n channel MOS transistor.

A method of manufacturing a semiconductor device according to a fourth embodiment of the present invention will be described.

The method of manufacturing a semiconductor device according to the fourth embodiment is directed to solving the problems of the first and the second embodiments.

In the first embodiment, a nitride oxide film is formed to have a relatively large thickness in order to prevent ions from being introduced in an element region at the time of ion implantation for forming the first p type impurity concentration peak 61. With reference to FIG. 3, the nitride film 4 is raised at an edge portion of the isolation oxide film 2 as the isolation oxide film 2 is grown. This causes distortion of the semiconductor substrate in proximity to the edge of the isolation oxide film as a result of counteraction.

In the second embodiment, impurities are implanted in the substrate through the oxide film 4. The nitride film therefore requires a film thickness that produces high controllability.

FIGS. 42 to 47 are partial sectional views showing sequential steps of a method of manufacturing a p well 6 region of FIG. 1. The following is a description of a method of manufacturing a p well 6 according to a fourth embodiment.

Figure 42:
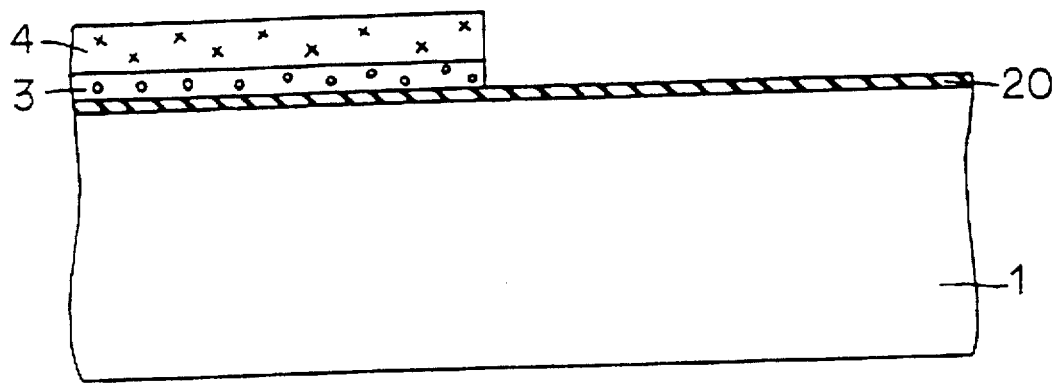
FIG. 42 is a partial sectional view showing a first step of a method of forming a p well according to a fourth embodiment of the present invention.

First with reference to FIG. 42, an underlying oxide film 20 is formed on a surface of a silicon substrate 1 by thermal oxidization. A polysilicon film 3 is formed on the underlying oxide film 20 by the CVD method. A nitride film 4 is formed to have a thickness of 1500 Å–3000 Å on the surface of the polysilicon film 3 by the CVD method. The nitride film 4 and the polysilicon film 3 are selectively removed by photolithography and reactive ion etching. As a result, the underlying oxide film exposes its surface in an element isolation region, while the nitride film 4 and the polysilicon film 3 are left in an element region.

Figure 43:
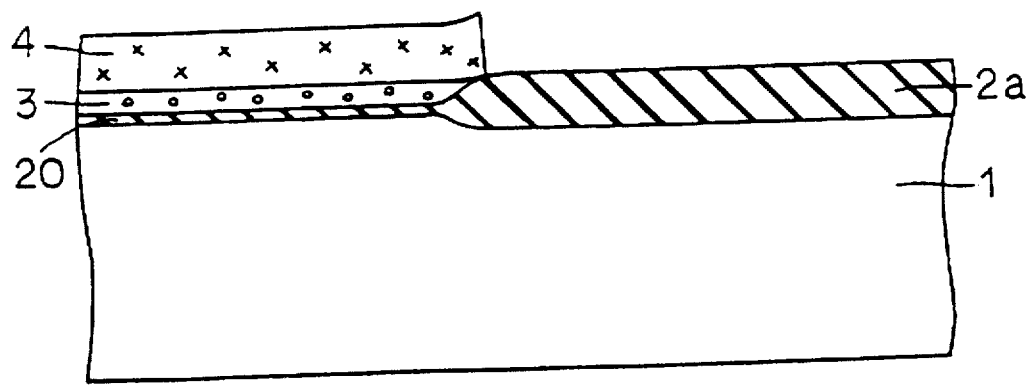
FIG. 43 is a partial sectional view showing a second step of the method of forming a p well according to the fourth embodiment of the present invention.

With reference to FIG. 43, the underlying oxide film 20 with its surface exposed is thermally oxidized to form an isolation oxide film 2a having a first thickness of 500 Å–1500 Å.

Figure 44:
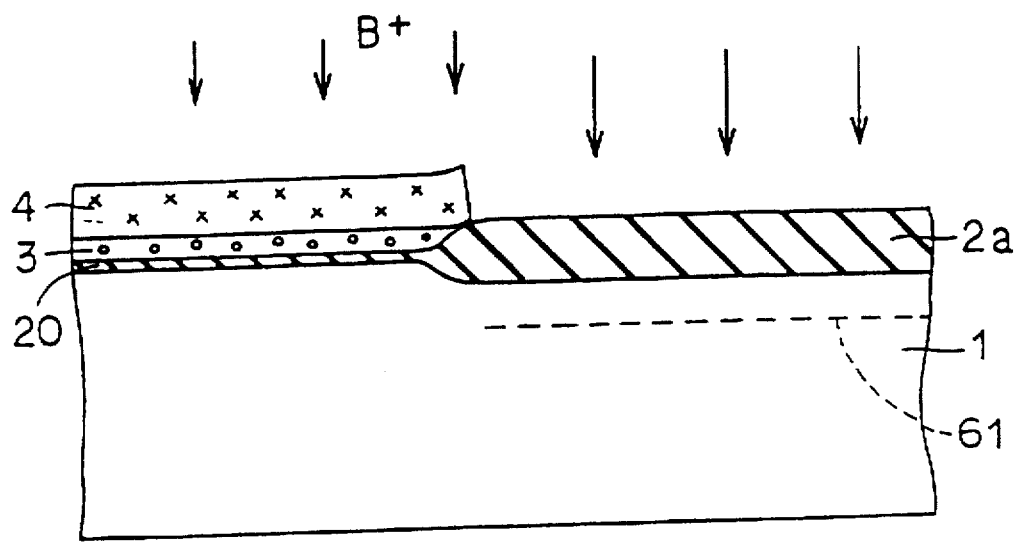
FIG. 44 is a partial sectional view showing a third step of the method of forming a p well according to the fourth embodiment of the present invention.
Figure 45:
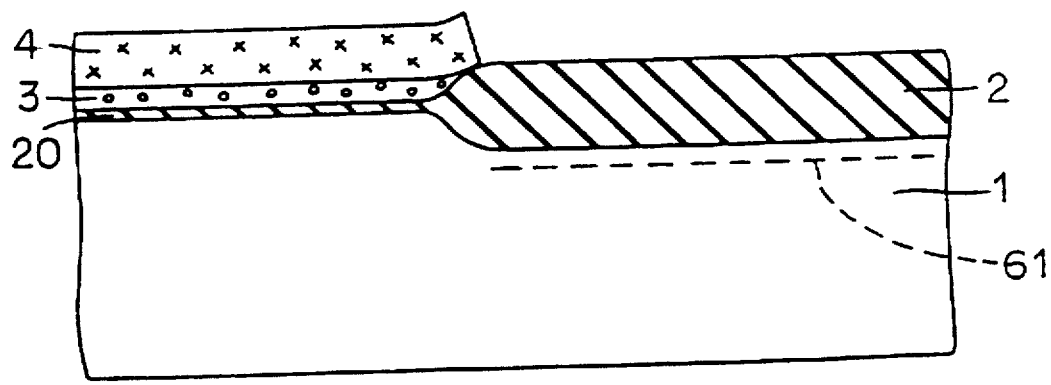
FIG. 45 is a partial sectional view showing a fourth step of the method of forming a p well according to the fourth embodiment of the present invention.

Thereafter, as shown in FIG. 44, boron ions (B$^+$) are implanted as p type impurity ions in the silicon substrate 1 by using the nitride film 4 and the polysilicon film 3 as masks. The first ion implantation for forming the retrograde well is carried out with a dose of $1.0 \times 10^{13} - 1.0 \times 10^{14}$ cm$^{-2}$ under 30–70 keV. As a result, an impurity region having a first p type impurity concentration peak 61 (the concentration of which is up to about $10^{17}$ cm$^{-3}$) is formed only in proximity to the lower surface of the isolation oxide film 2 in the element isolation region. Then with reference to FIG. 45, the isolation oxide film 2a is thermally oxidized to form an isolation oxide film 2 having a second thickness of 3000 Å–5000 Å.

Figure 46:
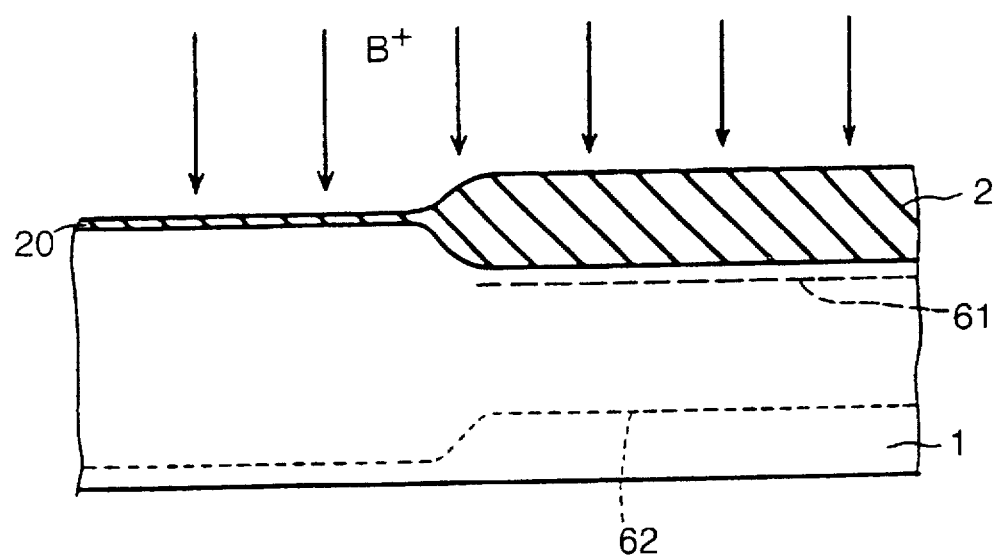
FIG. 46 is a partial sectional view showing a fifth step of the method of forming a p well according to the fourth embodiment of the present invention.

With reference to FIG. 46, the nitride film 4 and the polysilicon film 3 are removed. Another boron ions is implanted in the silicon substrate 1. The second ion implantation is carried out with a dose of $1.0 \times 10^{13} - 1.0 \times 10^{14}$ cm$^{-2}$ under 500–700 keV. As a result, an impurity region having a second p type impurity concentration peak 62 (the concentration of which is up to about $10^{18}$ cm$^{-3}$) is formed extending from the element isolation region to the element region at a region deep in the silicon substrate 1.

Figure 47:
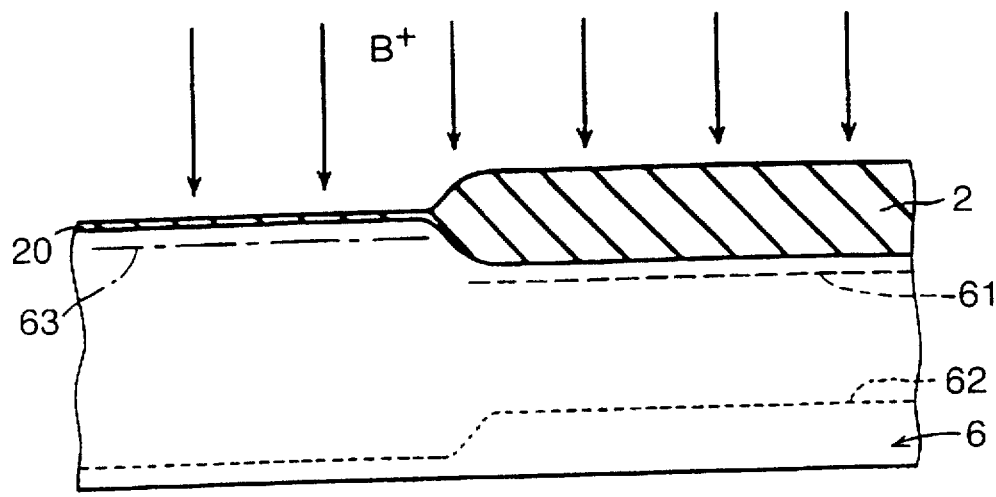
FIG. 47 is a partial sectional view showing a sixth step of the method of forming a p well according to the fourth embodiment of the present invention.

With reference to FIG. 47, boron ions are implanted in the silicon substrate 1 by using the isolation oxide film 2 as a mask. The third ion implantation is carried out with a dose of $1.0\times10^{12}$–$1.0\times10^{13}$ cm$^{-2}$ under 15–70 keV. As a result, an impurity region having a third p type impurity concentration peak 63 (the concentration of which is up to about $10^{17}$ cm$^{-3}$) is formed only in proximity to the surface of the element region. A p type retrograde well 6 having the p type impurity concentration peaks 61, 62 and 63 is formed in this manner. In order to activate the region having the first and the second p type impurity concentration peaks 61 and 62, heat treatment may be applied to the silicon substrate prior to boron ion implantation for forming the region having the p type impurity concentration peak 63 for controlling a threshold voltage.

Figure 48:
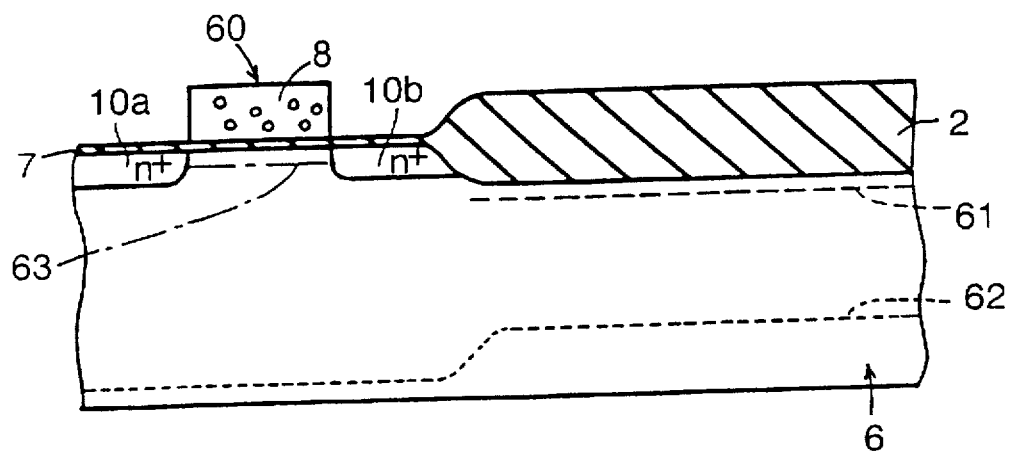
FIG. 48 is a partial sectional view showing a seventh step of the method of forming a p well according to the fourth embodiment of the present invention.

As shown in FIG. 48, the underlying oxide film 20 in the element region is removed and a gate oxide film 7 is formed in that region. A polysilicon layer including phosphorus, for example, as n type impurities is formed on the gate oxide film 7 by the CVD method. The polysilicon layer is selectively removed by photolithography and reactive ion etching to form a gate electrode 8 of an n$^+$ polysilicon layer. Phosphorus or arsenic ions as n type impurities are implanted in the p well 6 region by using the gate electrode 8 as a mask. As a result, n$^+$ impurity regions 10a and 10b are formed. An n channel MOS transistor 60 is formed in the p well 6 region in this manner. Although an n channel MOS transistor having a single drain structure is manufactured in the present embodiment, an n channel MOS transistor having a LDD structure can be also manufactured.

The above p type retrograde well 6 and n channel MOS transistor 60 can be formed to have the same structure and the same impurity concentration in a depth direction as those of the first embodiment shown in FIG. 8.

As described in the foregoing, according to a method of forming a retrograde well structure of the fourth embodiment, after a first isolation and insulation film having a first thickness is formed, relatively thin nitride film and polysilicon are not removed but used as masks for ion implantation. Thereafter, the first isolation and insulation film is made into a second isolation and insulation film having a second thickness larger than the first thickness, thereby preventing the semiconductor substrate from distorting at an edge portion of the isolation oxide film due to growth of the isolation oxide film. In addition, it is not necessary to implant ions in the substrate through the nitride film, neither is control of the film thickness of the nitride film. Furthermore, a formation of a p type impurity concentration peak inevitably formed in an element region by a conventional method of forming a retrograde well structure, can be avoided. As a result, there exists no p type impurity concentration peak extending from the first p type impurity concentration peak 61 into the element region, as shown in FIG. 8, so that a substrate effect constant of the n channel MOS transistor 60 formed in the element region can be reduced. Therefore, the threshold voltage of the n channel MOS transistor 60 would not greatly fluctuate even if a substrate bias voltage is applied due to noise generated in the substrate or external noise.

FIGS. 49 to 54 are partial sectional views showing sequential steps of a method of manufacturing the n well 5 and the buried channel p channel MOS transistor 50 of FIG. 1. The following is a description of a method of forming an n type retrograde well according to the fourth embodiment.

Figure 49:
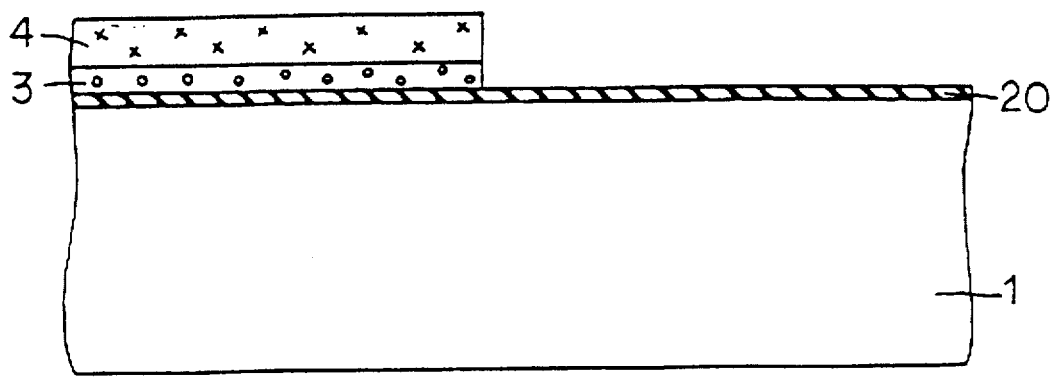
FIG. 49 is a partial sectional view showing a first step of an n well forming method according to the fourth embodiment of the present invention.

First with reference to FIG. 49, an underlying oxide film 20 is formed on the surface of the p type silicon substrate 1 by thermal oxidation. A polysilicon film 3 is formed on the underlying oxide film 20 by the CVD method. A nitride film 4 is formed to have a thickness of 1500 Å–3000 Å on the surface of the polysilicon film 3 by the CVD method. The nitride film 4 and the polysilicon film 3 are selectively removed by photolithography and reactive ion etching. As a result, the underlying oxide film 20 exposes its surface in an element isolation region, while the polysilicon film 3 and the nitride film 4 are left in an element region.

Figure 50:
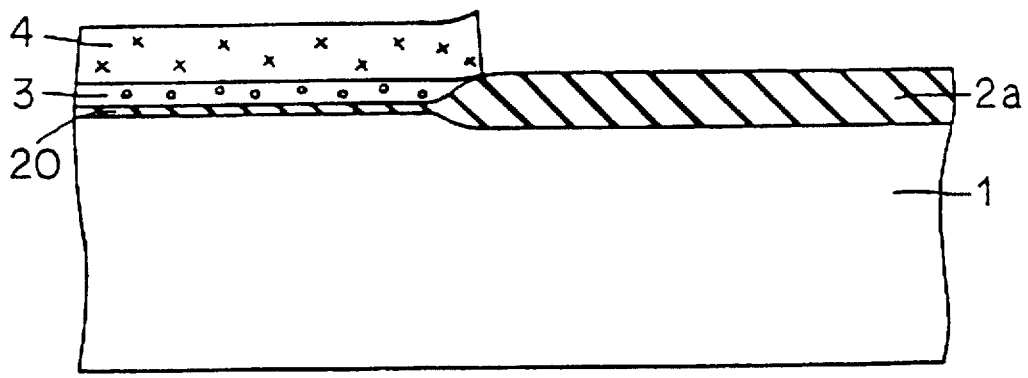
FIG. 50 is a partial sectional view showing a second step of the n well forming method according to the fourth embodiment of the present invention.

Then as shown in FIG. 50, the underlying oxide film 20 is thermally oxidized by using the nitride film 4 and the polysilicon film 3 as masks to form an isolation oxide film 2a having a first thickness of 500 Å–1500 Å.

Figure 51:
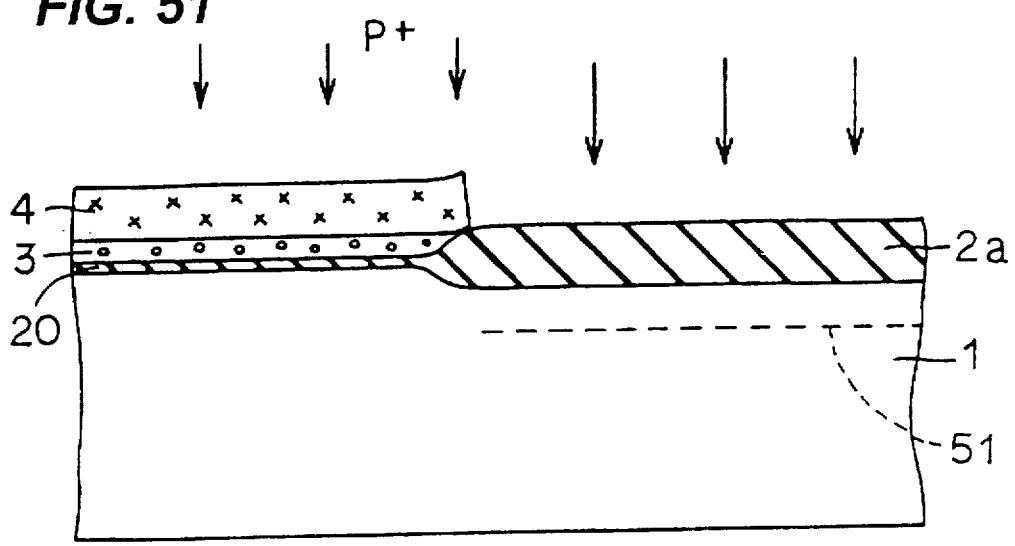
FIG. 51 is a partial sectional view showing a third step of the n well forming method according to the fourth embodiment of the present invention.

Thereafter, as shown in FIG. 51, phosphorus ions as n type impurity ions are implanted in the silicon substrate 1 by using the nitride film 4 and the polysilicon film 3 as masks. This first ion implantation is carried out with a dose of $1.0\times10^{13}$–$1.0\times10^{14}$ cm$^{-2}$ under 90–210 keV. As a result, an impurity region having a first n type impurity concentration peak 51 (the concentration of which is up to about $10^{17}$ cm$^{-3}$) only in proximity to the lower surface of the isolation oxide film 2.

Figure 52:
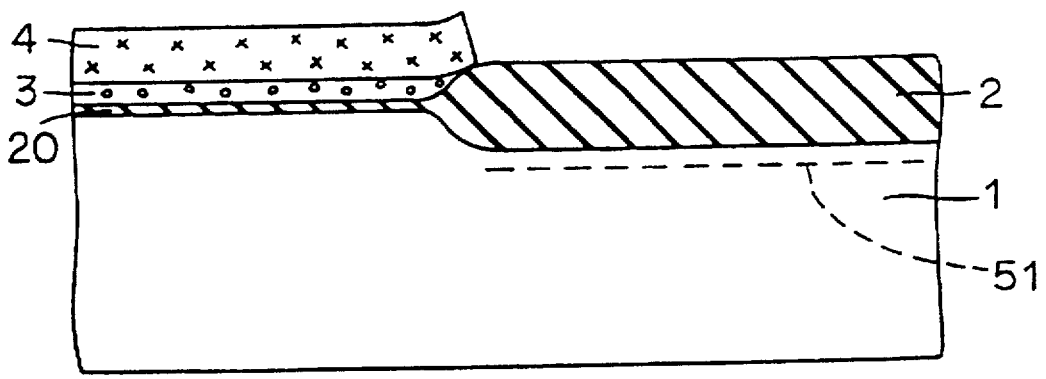
FIG. 52 is a partial sectional view showing a fourth step of the n well forming method according to the fourth embodiment of the present invention.

As shown in FIG. 52, the isolation oxide film 2a is formed into an insulation oxide film 2 having a second thickness of 3000 Å–5000Å, by further using the nitride film 4 and the polysilicon film 3 as masks.

Figure 53:
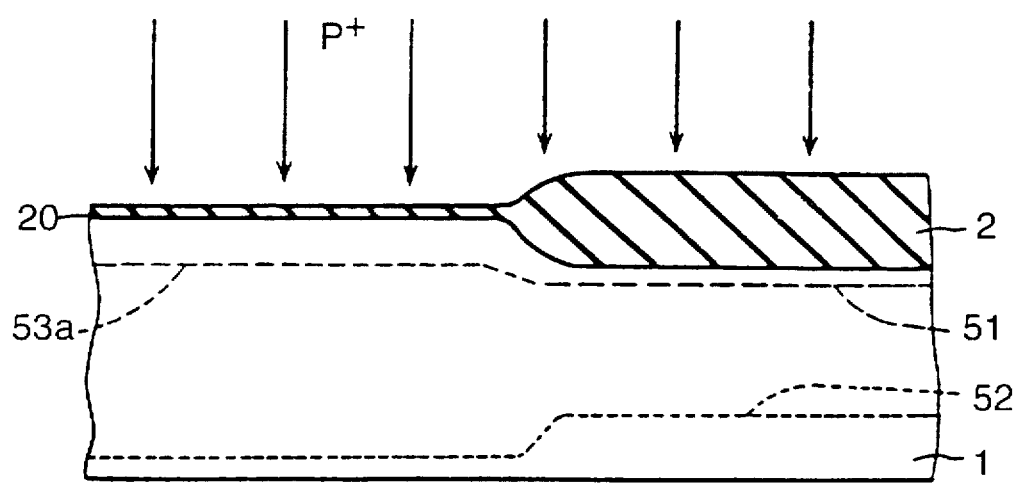
FIG. 53 is a partial sectional view showing a fifth step of the n well forming method according to the fourth embodiment of the present invention.

As shown in FIG. 53, the nitride film 4 and the polysilicon film 3 are removed. Phosphorus ions are implanted twice in the entire surface of the silicon substrate 1. This second ion implantation is carried out with a dose of $1.0\times10^{13}$–$1.0\times10^{14}$ cm$^{-2}$ under 1.0–1.5 MeV. As a result, an impurity region having a second n type impurity concentration peak 52 (the concentration of which is up to about $10^{18}$ cm$^{-3}$) at a region deep in the silicon substrate 1 is formed extending from the element isolation region to the element region. A third ion implantation is carried out with a dose of $1.0\times10^{12}$–$1.0\times10^{13}$ cm$^{-2}$ under 150–200 keV. As a result, an impurity region having an n type impurity concentration peak 53a (the concentration of which is up to about $10^{17}$ cm$^{-3}$) constituting a part of the third impurity concentration peak is formed only in a shallow region of the element region.

Figure 54:
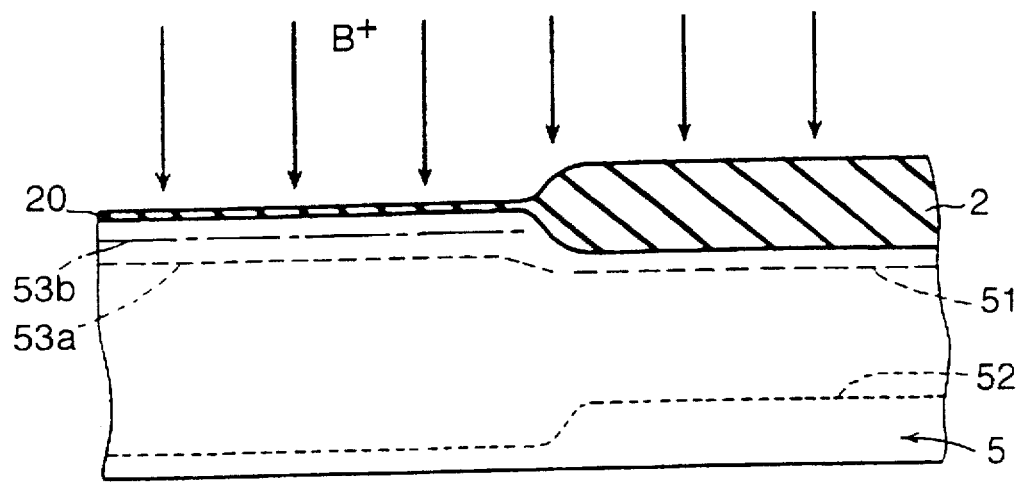
FIG. 54 is a partial sectional view showing a sixth step of the n well forming method according to the fourth embodiment of the present invention.

As shown in FIG. 54, boron ions (B$^+$) as p type impurity ions are further implanted in the silicon substrate 1. This fourth ion implantation is carried out with a dose of $1.0\times10^{12}$–$1.0\times10^{13}$ cm$^{-2}$ under 10–50 keV. As a result, an impurity region having a p type impurity concentration peak 53b constituting a part of the third impurity concentration peak is formed only in proximity to the surface of the element region. An n well 5 having the impurity concentration peaks 51, 52, 53a and 53b is formed in this manner. At this time, in order to activate the region having the impurity concentration peaks 51, 52 and 53a, the silicon substrate may be subjected to heat treatment prior to implanting boron ions for controlling a threshold voltage.

Figure 55:
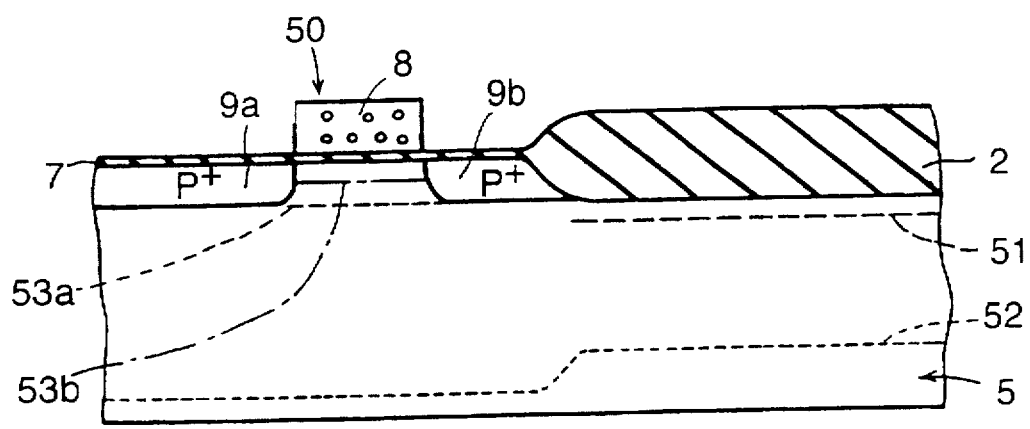
FIG. 55 is a partial sectional view showing a seventh step of the n well forming method according to the fourth embodiment of the present invention.

Lastly with reference to FIG. 55, after the underlying oxide film 20 is removed, a gate oxide film 7 is again formed on the surface of the element region. A polysilicon layer including phosphorus, for example, as n type impurities is formed on the gate oxide film 7 by the CVD method. The polysilicon layer is selectively removed by photolithography and reactive ion etching to form a gate electrode 8 of an n$^+$ polysilicon layer. Boron or boron fluoride ions as p type impurities are implanted in the n type well 5 by using the gate electrode 8 as a mask, thereby forming p$^+$ impurity regions 9a and 9b. A buried channel type p channel MOS transistor 50 is formed in the region of the n type retrograde well 5 in this manner. Although a p channel MOS transistor having a single drain structure is formed in the above-described embodiment, it is also possible to form a p channel MOS transistor having any drain structure.

The above n well 5 and p channel MOS transistor 50 can be formed to have the same structure and the same impurity concentration distribution in a depth direction as those of the first embodiment shown in FIG. 15.

A method of forming a CMOS semiconductor device according to the above-described fourth embodiment will be described. FIGS. 56 to 61 are partial sectional views showing sequential steps of a method of manufacturing a well region of the CMOS semiconductor device.

Figure 56:
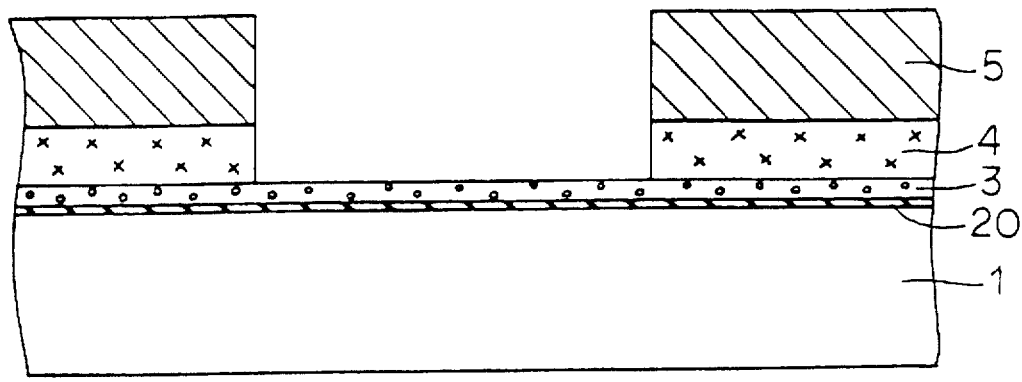
FIG. 56 is a partial sectional view showing a first step of a method of manufacturing a CMOS semiconductor device according to the fourth embodiment of the present invention.

First with reference to FIG. 56, an underlying oxide film 20 is formed on the surface of a silicon substrate 1 by thermal oxidation. A polysilicon film 3 is formed on the underlying oxide film 20 by the CVD method. A nitride film 4 is formed to have a thickness of 1500 Å–3000 Å on the surface of the polysilicon film 3 by the CVD method. The nitride film 4 and the polysilicon film 3 are selectively removed by photolithography and reactive ion etching. As a result, the underlying oxide film 20 exposes its surface in an element isolation region, while the nitride film 4 and the polysilicon film 3 are left in an element region.

Figure 57:
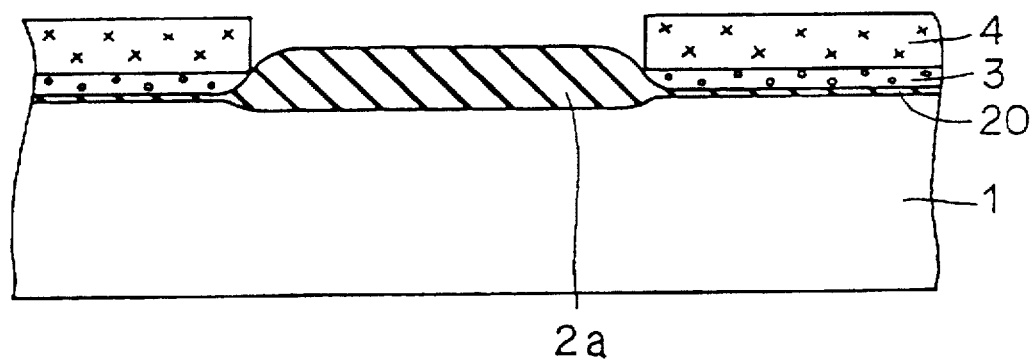
FIG. 57 is a partial sectional view showing a second step of the CMOS semiconductor device manufacturing method according to the fourth embodiment of the present invention.

Then with reference to FIG. 57, the underlying oxide film 20 with its surface exposed is thermally oxidized to form an isolation oxide film $2a$ having a first thickness of 500 Å–1500 Å.

Figure 58:
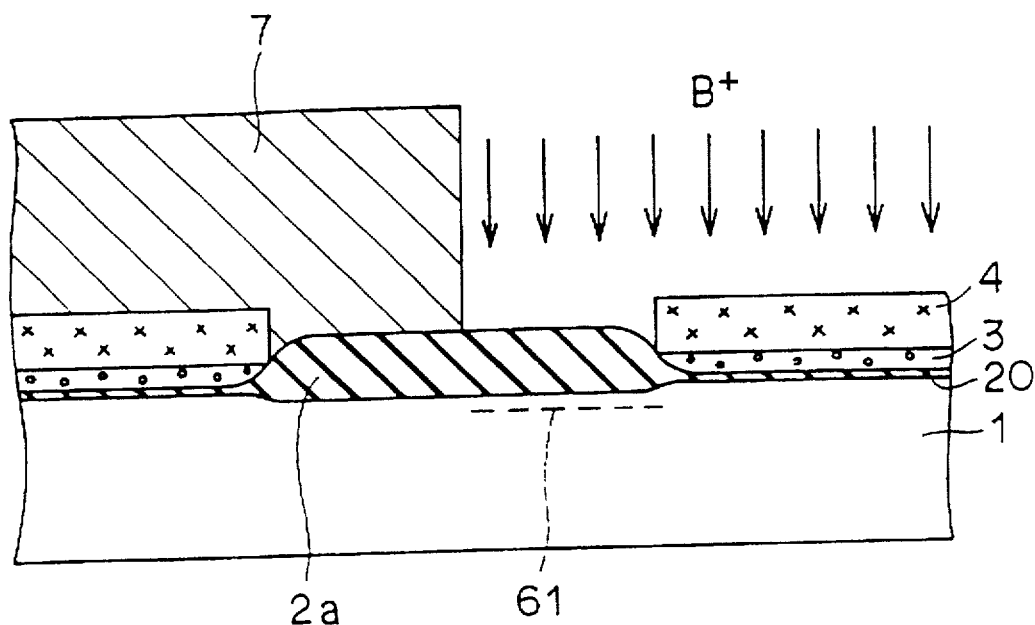
FIG. 58 is a partial sectional view showing a third step of the CMOS semiconductor device manufacturing method according to the fourth embodiment of the present invention.

Then as shown in FIG. 58, a resist film 7 is formed only in an n well region. Thereafter, boron ions ($B^+$) as p type impurity ions are implanted in the silicon substrate 1 by using the nitride film 4 and the polysilicon film 3 as masks. This first ion implantation for forming a retrograde well is carried out with a dose of $1.0 \times 10^{13}$–$1.0 \times 10^{14}$ cm$^{-2}$ under 30–70 kev. As a result, an impurity region having a first p type impurity concentration peak 61 (the concentration of which is up to about $10^{17}$ cm$^{-3}$) is formed only in proximity to the lower surface of the isolation oxide film $2a$ in the element isolation region.

Figure 59:
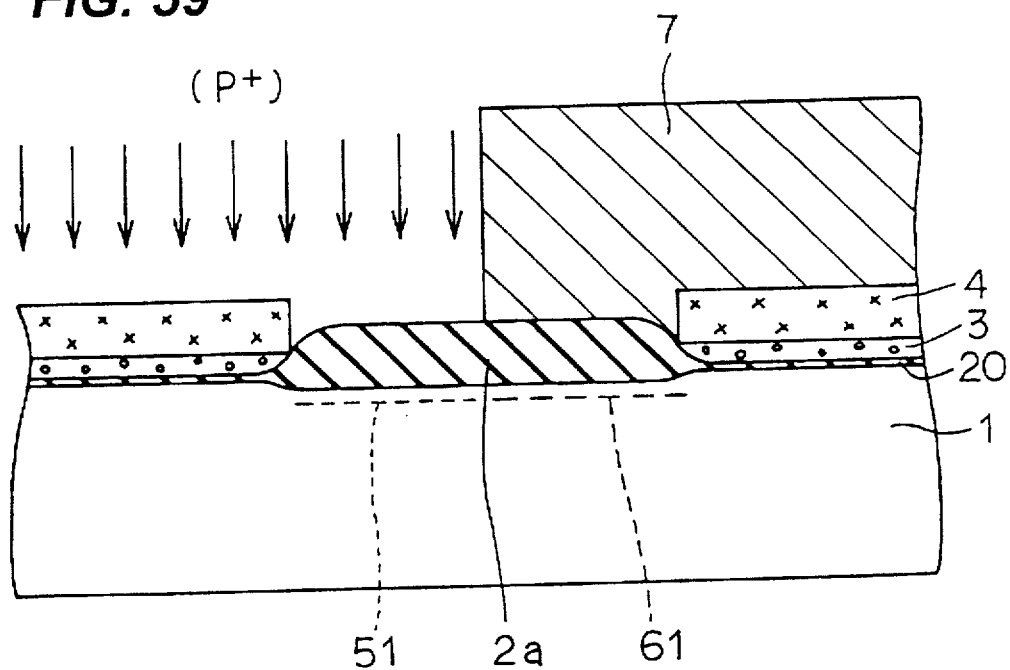
FIG. 59 is a partial sectional view showing a fourth step of the CMOS semiconductor device manufacturing method according to the fourth embodiment of the present invention.

With reference to FIG. 59, the resist film 7 is removed to be left only in the p well region. Thereafter, phosphorus ions ($P^+$) as n type impurity ions are implanted in the silicon substrate 1 by using the nitride film 4 and the polysilicon film 3 as masks. This second ion implantation is carried out with a dose of $1.0 \times 10^{13}$–$1.0 \times 10^{14}$ cm$^{-2}$ under 90–210 keV. As a result, an impurity region having a first n type impurity concentration peak 51 (the concentration of which is up to about $10^{17}$ cm$^{-3}$) only in proximity to the lower surface of the isolation oxide film 2.

Figure 60:
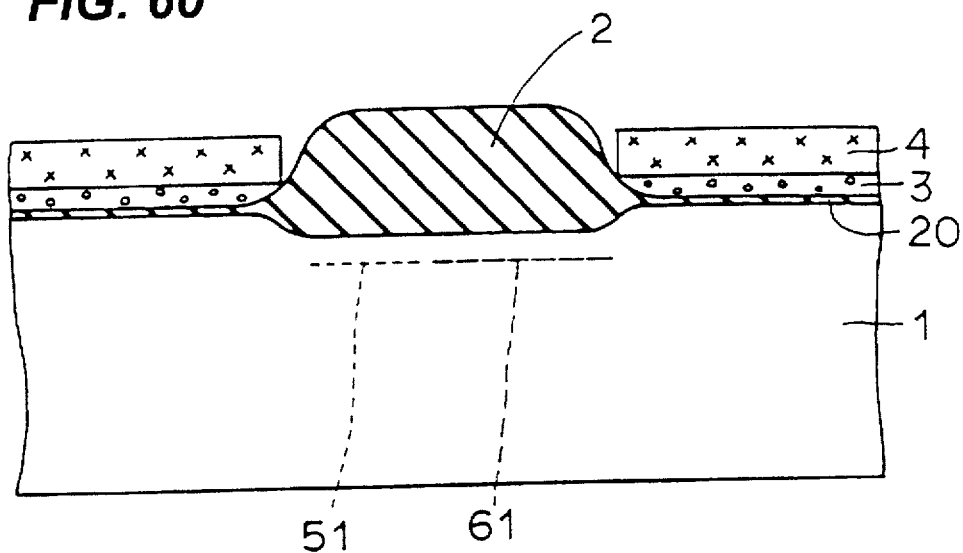
FIG. 60 is a partial sectional view showing a fifth step of the CMOS semiconductor device manufacturing method according to the fourth embodiment of the present invention.

With reference to FIG. 60, after the resist film 7 is removed, the isolation oxide film $2a$ is further oxidized thermally by using the nitride film 4 and the polysilicon film 3 as masks to form an isolation oxide film 2 having a second thickness of 3000 Å–5000 Å.

Figure 61:
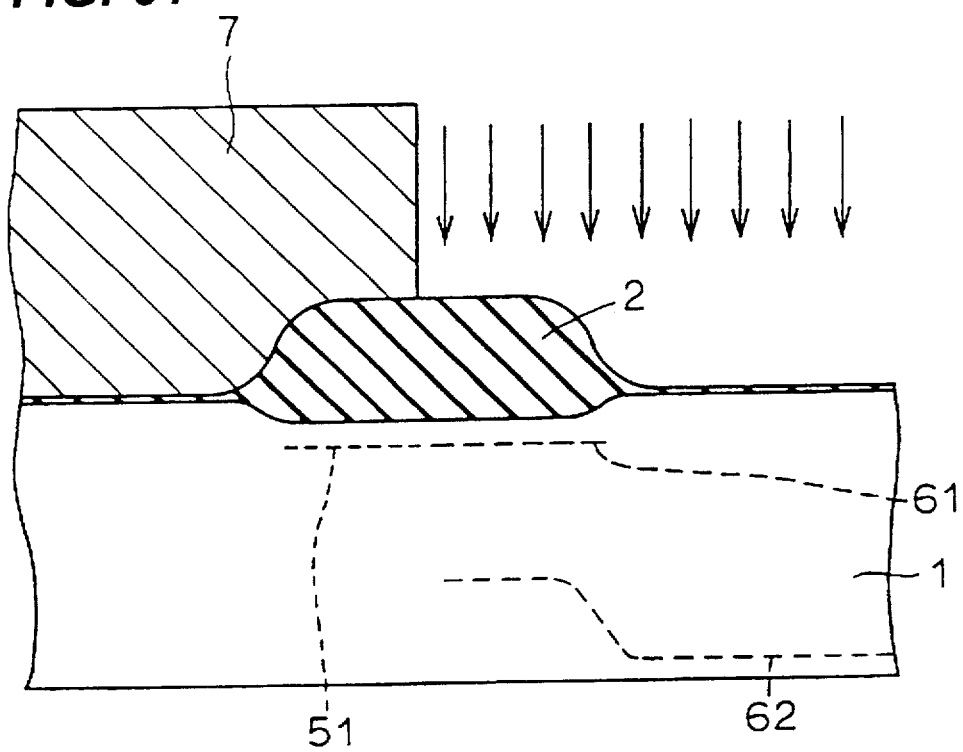
FIG. 61 is a partial sectional view showing a sixth step of the CMOS semiconductor device manufacturing method according to the fourth embodiment of the present invention.

Then with reference to FIG. 61, the nitride film 4 and the polysilicon film 3 are removed. A resist film 7 is again formed only in the n well region. Thereafter, with the resist film as a mask, boron ions ($B^+$) as p type impurity ions are implanted in the silicon substrate 1. This third ion implantation is carried out with a dose of $1.0 \times 10^{13}$–$1.0 \times 10^{14}$ cm$^{-3}$ under 500–700 kev. As a result, an impurity region having a second p type impurity concentration peak 62 (the concentration of which is up to about $10^{18}$ cm$^{-3}$) at a region deep in the silicon substrate 1 is formed extending from the element isolation region to the element region.

Figure 62:
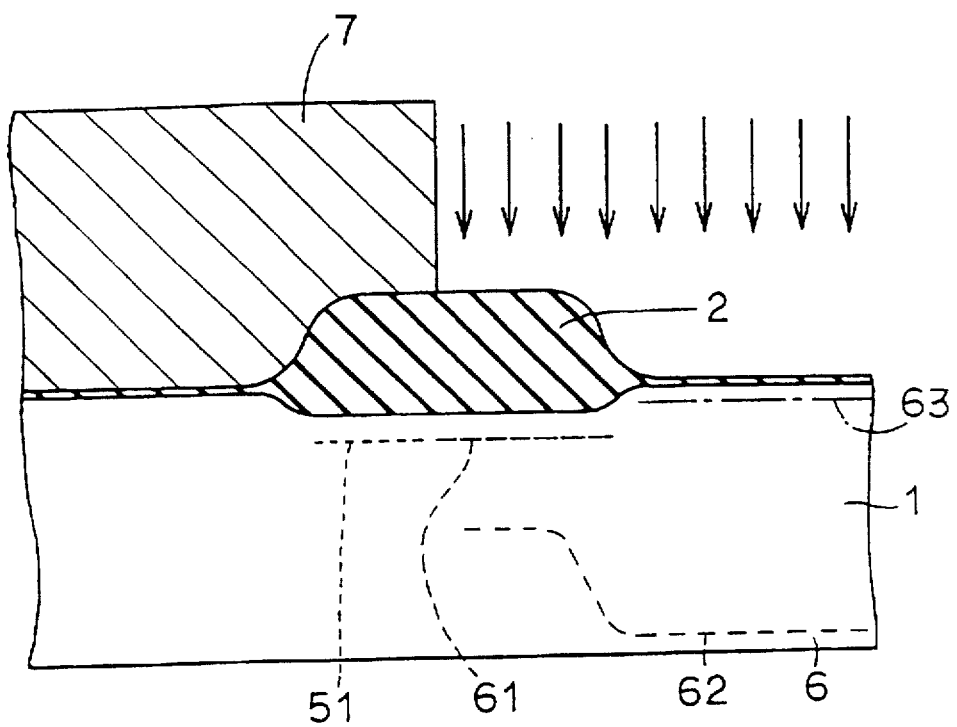
FIG. 62 is a partial sectional view showing a seventh step of the CMOS type semiconductor device manufacturing method according to the fourth embodiment of the present invention.

With reference to FIG. 62, boron ions are implanted in the silicon substrate 1 by using the resist film 7 as a mask. This fourth ion implantation is carried out with a dose of $1.0 \times 10^{12}$–$1.0 \times 10^{13}$ cm$^{-2}$ under 15–70 keV. As a result, an impurity region having a third p type impurity concentration peak 63 (the concentration of which is up to about $10^{17}$ cm$^{-3}$) is formed only in proximity to the surface of the element region. A p type retrograde well 6 having the p type impurity concentration peaks 61, 62 and 63 is formed in this manner.

Figure 63:
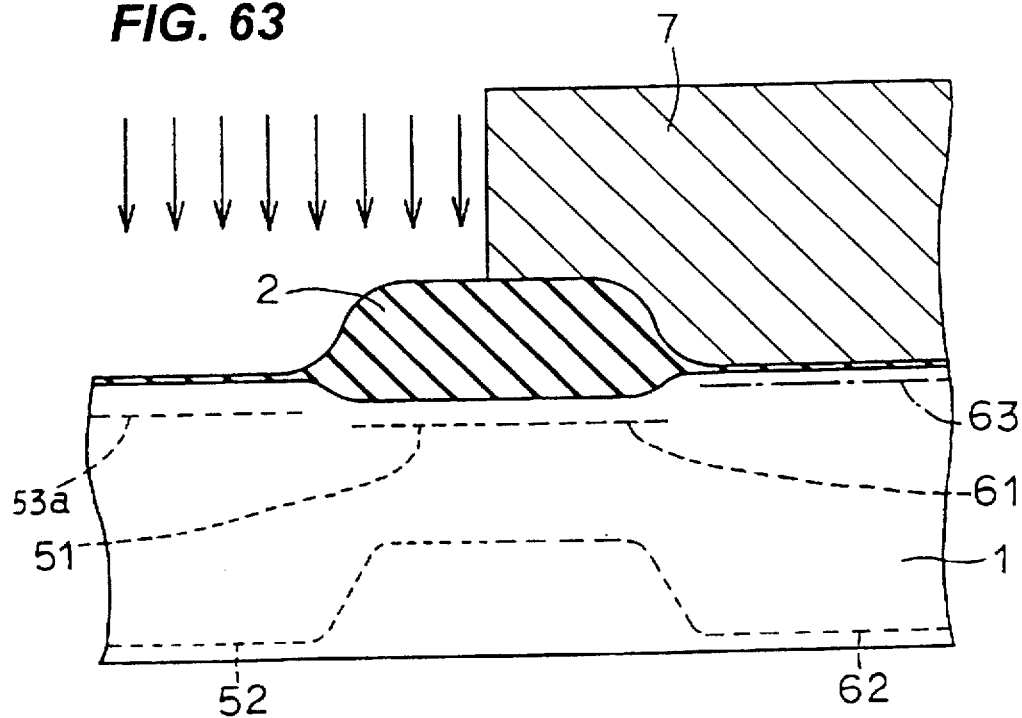
FIG. 63 is a partial sectional view showing an eighth step of the CMOS semiconductor device manufacturing method according to the fourth embodiment of the present invention.

With reference to FIG. 63, a resist film 7 is removed to be left only in the p well region. Thereafter, phosphorus ions are implanted twice in the silicon substrate 1 by using the resist film 7 as a mask. This fifth ion implantation is carried out with a dose of $1.0 \times 10^{13}$–$1.0 \times 10^{14}$ cm$^{-2}$ under 1.0–1.5 MeV. As a result, an impurity region having a second n type impurity concentration peak 52 (the concentration of which is up to about $10^{18}$ cm$^{-3}$) at a region deep in the silicon substrate 1 is formed extending from the element isolation region to the element region. In addition, sixth ion implantation is carried out with a dose of $1.0 \times 10^{12}$–$1.0 \times 10^{13}$ cm$^{-2}$ under 150–200 keV. As a result, an impurity region having an n type impurity concentration peak 53$a$ (the concentration of which is up to about $10^{17}$ cm$^{-3}$) constituting a part of the third impurity concentration peak is formed only at a shallow region of the element region.

Figure 64:
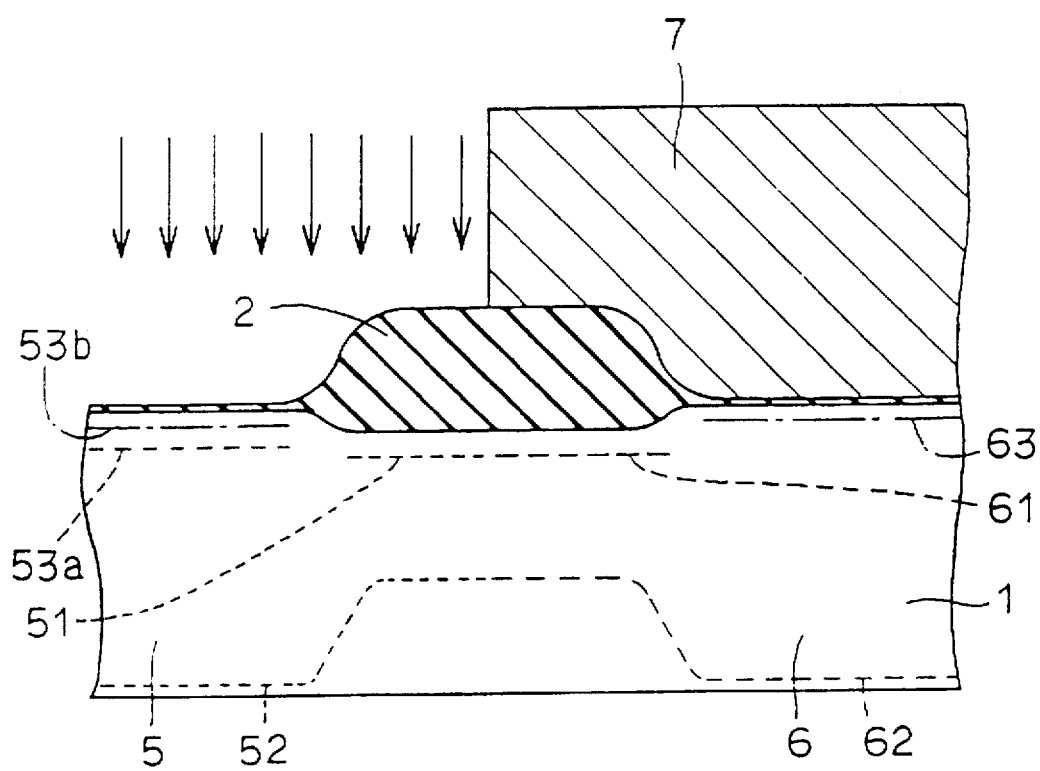
FIG. 64 is a partial sectional view showing a ninth step of the CMOS semiconductor device manufacturing method according to the fourth embodiment of the present invention.

As shown in FIG. 64, boron ions ($B^+$) are implanted as p type impurity ions in the silicon substrate 1. This sixth ion implantation is carried out with a dose of $1.0 \times 10^{12}$–$1.0 \times 10^{13}$ cm$^{-2}$ under 10–50 keV. As a result, an impurity region having a p type impurity concentration peak 53$b$ constituting a part of the third impurity concentration peak is formed only in proximity to the surface of the element region. An n type well 5 having the impurity concentration peaks 51, 52, 53$a$ and 53$b$ is formed in this manner.

The foregoing steps complete a formation of a well region of the CMOS semiconductor device. Thereafter, with the n well 5 region covered with a resist, an n channel MOS transistor 6 is formed in the p well 6 region by the step shown in FIG. 7, while a p channel MOS transistor 50 is formed in the n well 5 region by the step shown in FIG. 14 with the p well 6 region covered with a resist. As a result, the CMOS semiconductor device is completed.

A method of manufacturing a semiconductor device according to a fifth embodiment of the present invention will be described.

The basic idea of the manufacturing method resides in that an isolation oxide film has two kinds of film thicknesses. As a first example, a thin element isolation oxide film is used for such a memory cell portion as having an element region small in width. A thick isolation oxide film is used for regions having an element region relatively large in width other than the memory cell portion. The reason is as follows. A bird's beak of the isolation oxide film is increased with an increase of the isolation oxide film in thickness. Therefore, in order to increase an effective active region width in an element region having a small width such as a memory cell portion after a formation of an isolation oxide film, it is effective to make the film thickness of the isolation oxide film small.

As a second example, there is a case where a film thickness of an isolation oxide film in a p well region supplied with a negative potential is reduced and a film thickness of an isolation oxide film in each of growded p well and n well regions is increased in a triple well structure (a triple well structure, in a case of a p type semiconductor substrate, for example, includes an n well (a p channel region to which a positive potential is applied), a p well (an n channel region which is grounded) and a p well surrounded by the n well (an n channel region to which a negative potential is applied at this time, the n well surrounding the p well is supplied with a positive potential). The reason is as follows. Element isolating capability of the p well supplied with a negative potential is greater than that of the grounded p well or the grounded n well. Therefore, even if the film thickness of the isolation oxide film of the region to which a negative potential is applied is reduced, it is possible to obtain element isolation capability almost the same as that of the isolation oxide film having a larger film thickness in other regions.

A method of manufacturing a semiconductor device according to the present embodiment will be described in the following. Herein, description is given only to a part concerning an n channel region of the manufacturing method. According to this manufacturing method, a CMOS semiconductor device can be formed in the same manner as in the above-described fourth embodiment. For the purpose of simplicity, it is assumed herein that a p well region which is surrounded by an n well supplied with a positive potential and is supplied with a negative potential is referred to as a Vbb region, and that the Vbb region includes an element region of a small width including a memory cell portion. It is further assumed that the grounded p well region is referred to as a Vss region and the Vss region includes an element region of a large width. Such assumptions are supported by the above-described first and second examples.

FIGS. 65 to 70 are partial sectional views showing sequential steps of a method of manufacturing an n channel region only.

Figure 65:
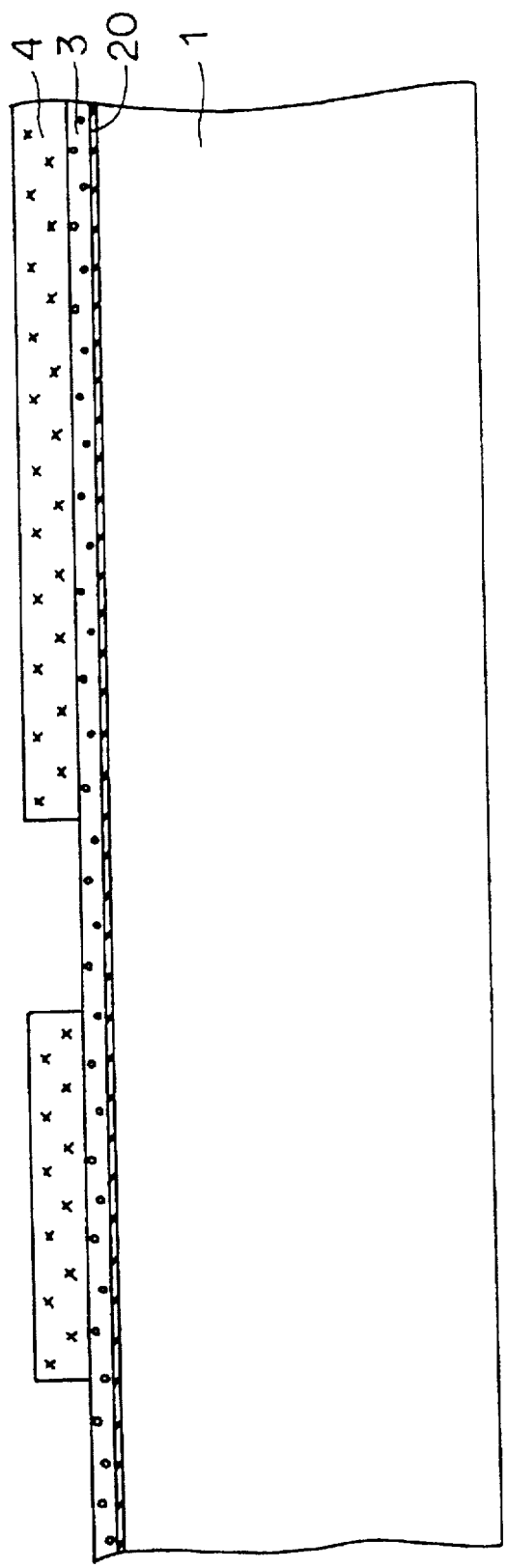
FIG. 65 is a partial sectional view showing a first step of a method of manufacturing a semiconductor device according to a fifth embodiment of the present invention.

First with reference to FIG. 65, an underlying oxide film 20 is formed on a surface of a silicon substrate 1 by thermal oxidation. A polysilicon film 3 is formed on the underlying oxide film 20 by the CVD method. A nitride film 4 is formed to have a thickness of 1500 Å–3000 Å on the surface of the polysilicon film 3 by the CVD method. The nitride film 4 and the polysilicon film 3 are selectively removed by photolithography and reactive ion etching. As a result, the underlying oxide film 20 exposes its surface in an element isolation region of the Vss region, while the nitride film 4 and the polysilicon film 3 are left in element regions of the Vbb region and the Vss region.

Figure 66:
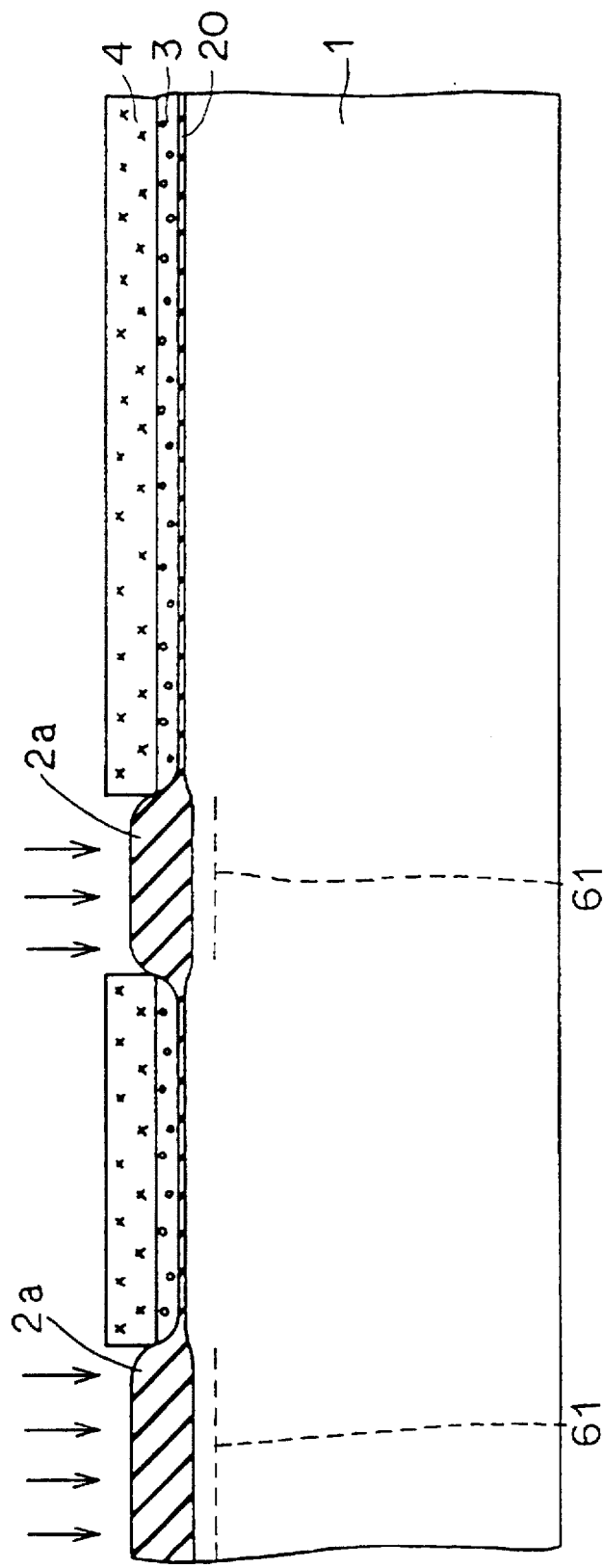
FIG. 66 is a partial sectional view showing a second step of the semiconductor device manufacturing method according to the fifth embodiment of the present invention.

Then with reference to FIG. 66, the underlying oxide film 20 with its surface exposed is thermally oxidized to form an isolation oxide film 2a having a first thickness of 500 Å–1500 Å. Thereafter, boron ions (B$^+$) are implanted as p type impurity ions in the silicon substrate 1 by using the nitride film 4 and the polysilicon film 3 as masks. This first ion implantation for forming a retrograde well is carried out with a dose of $1.0\times10^{13}$–$1.0\times10^{14}$ cm$^{-2}$ under 30–70 keV. As a result, an impurity region having a first p type impurity concentration peak 61 (the concentration of which is up to about $10^{17}$ cm$^{-3}$) is formed only in proximity to the lower surface of the isolation oxide film 2a of the Vss region.

Figure 67:
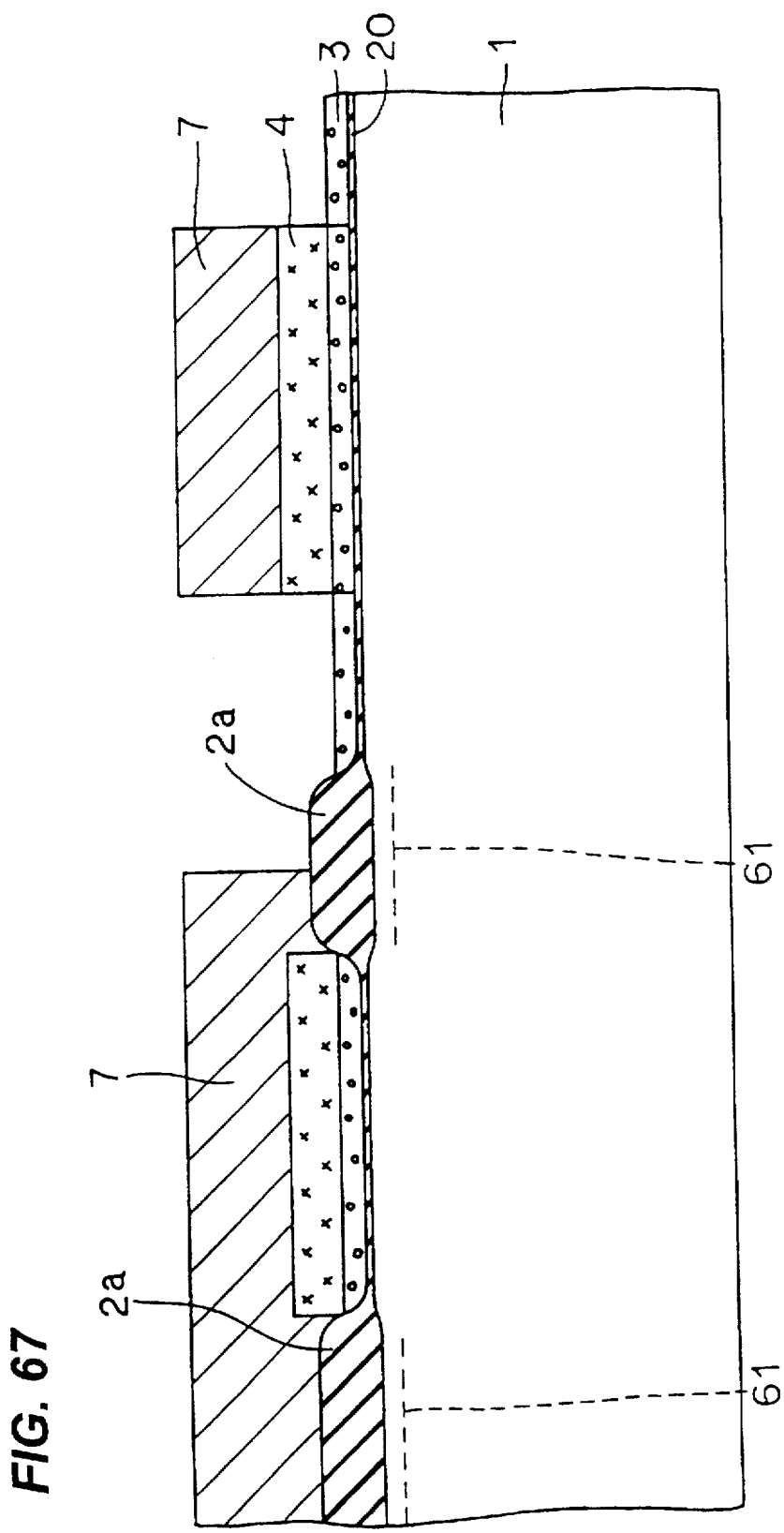
FIG. 67 is a partial sectional view showing a third step of the semiconductor device manufacturing method according to the fifth embodiment of the present invention.

With reference to FIG. 67, a resist film 7 is applied to the entire surface of the silicon substrate 1 and photolithography is carried out to leave the resist film 7 only in the element regions of the Vss region and the Vbb region. Furthermore, the nitride film and the polysilicon film 3 in the element isolation region of the Vbb region are selectively removed by reactive ion etching by using the resist film 7 as a mask.

Figure 68:
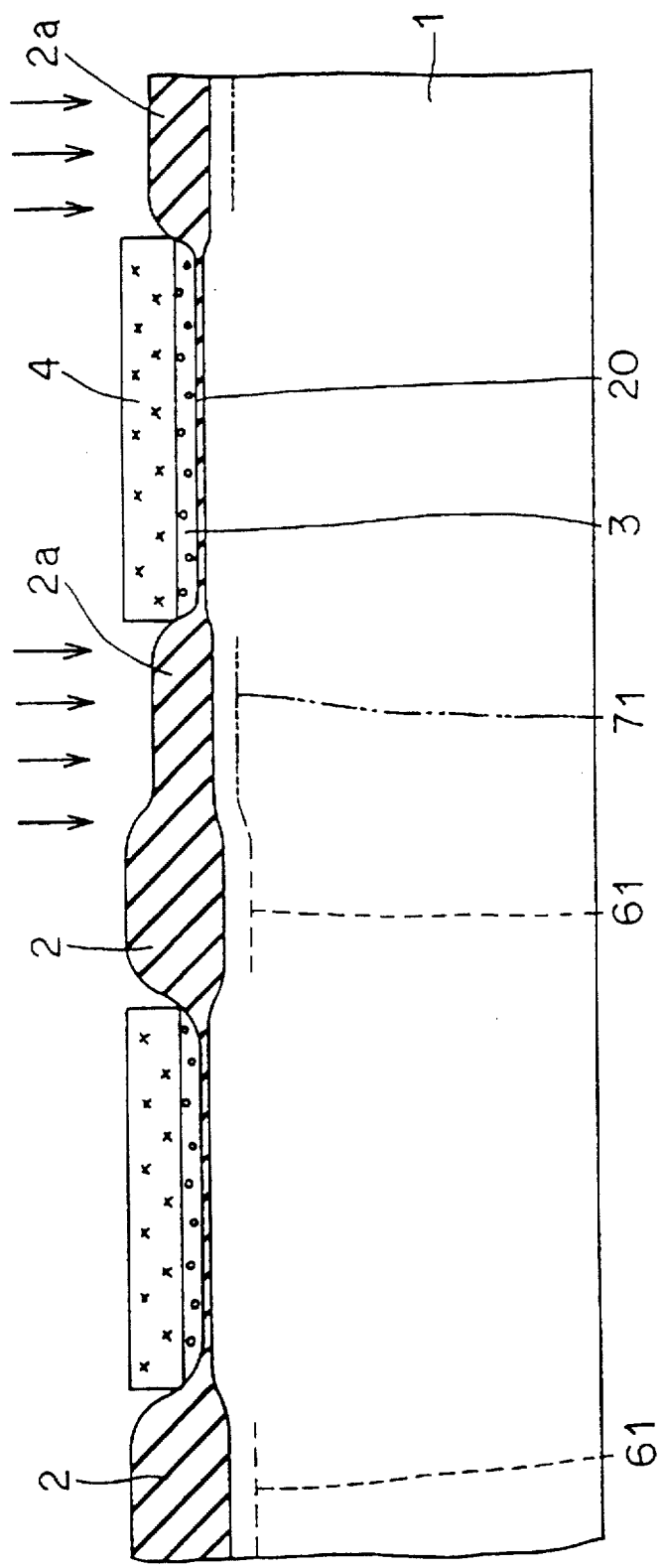
FIG. 68 is a partial sectional view showing a fourth step of the semiconductor device manufacturing method according to the fifth embodiment of the present invention.

With reference to FIG. 68, after the resist film 7 is removed, the isolation oxide film 2a and the underlying oxide film 20 are further oxidized thermally by using the nitride film 4 as a mask. As a result, the oxide film 20 in the Vbb region is formed into an isolation oxide film 2a having the first thickness of 500 Å–1500 Å. At this time, the isolation oxide film 2a in the Vss region is also thermally oxidized to be made into an isolation oxide film 2 having a second thickness of 1000 Å–2000 Ålarger than the first thickness.

Thereafter, boron ions (B$^+$) are implanted as p type impurity ions in the silicon substrate 1 by using the nitride film 4, the polysilicon film 3 and the isolation oxide film 2 of the Vss region as masks. This ion implantation is carried out with a dose of $1.0\times10^{13}$–$1.0\times10^{14}$ cm$^{-2}$ under 30–70 keV. As a result, an element isolation ion implantation layer 71 is formed only in a region directly under the isolation oxide film 2a of the Vbb region.

Figure 69:
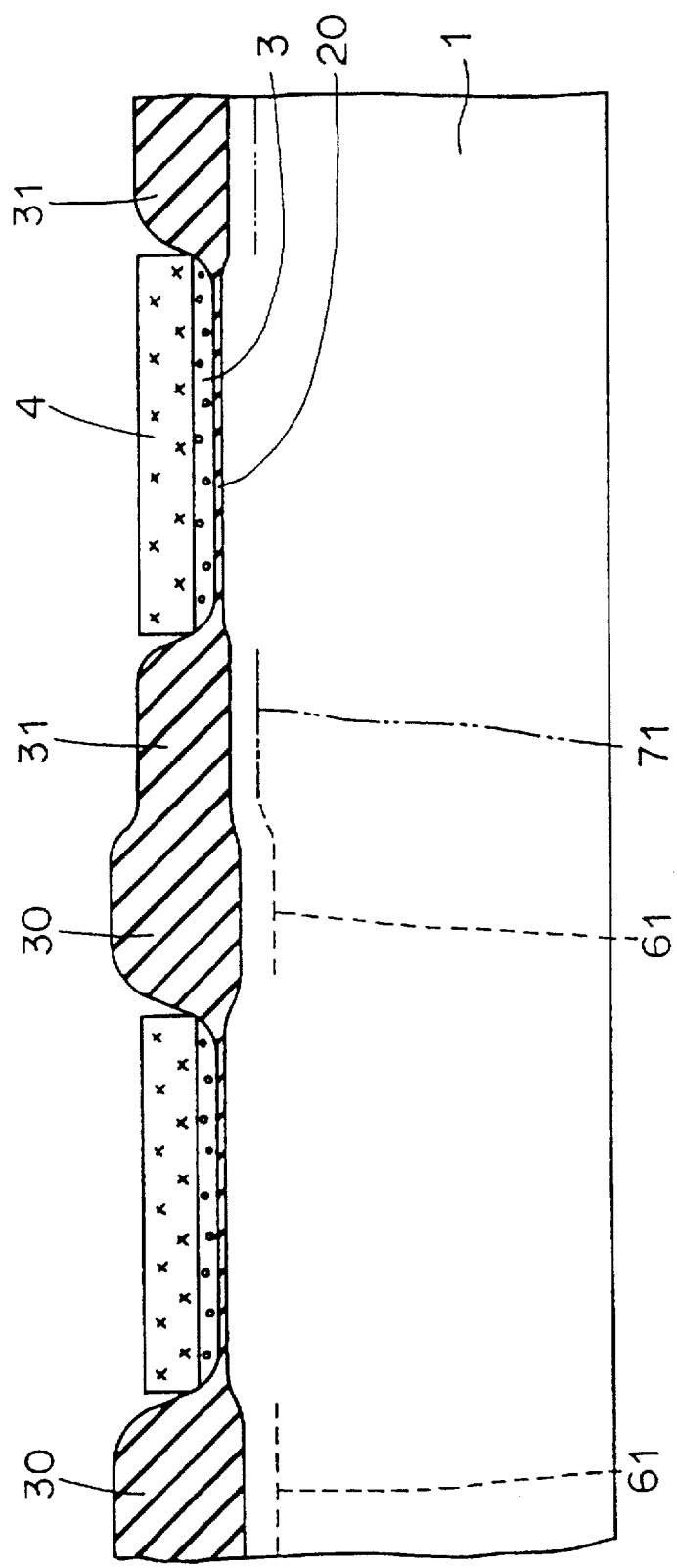
FIG. 69 is a partial sectional view showing a fifth step of the semiconductor device manufacturing method according to the fifth embodiment of the present invention.

Further with reference to FIG. 69, third thermal oxidation is carried out in order to form isolation oxide films 30 and 31 having an ultimate predetermined film thickness in the Vbb region and the Vss region. At this time, the isolation oxide film 30 of the Vss region has a film thickness larger than that of the isolation oxide film 31 of the Vbb region.

Figure 70:
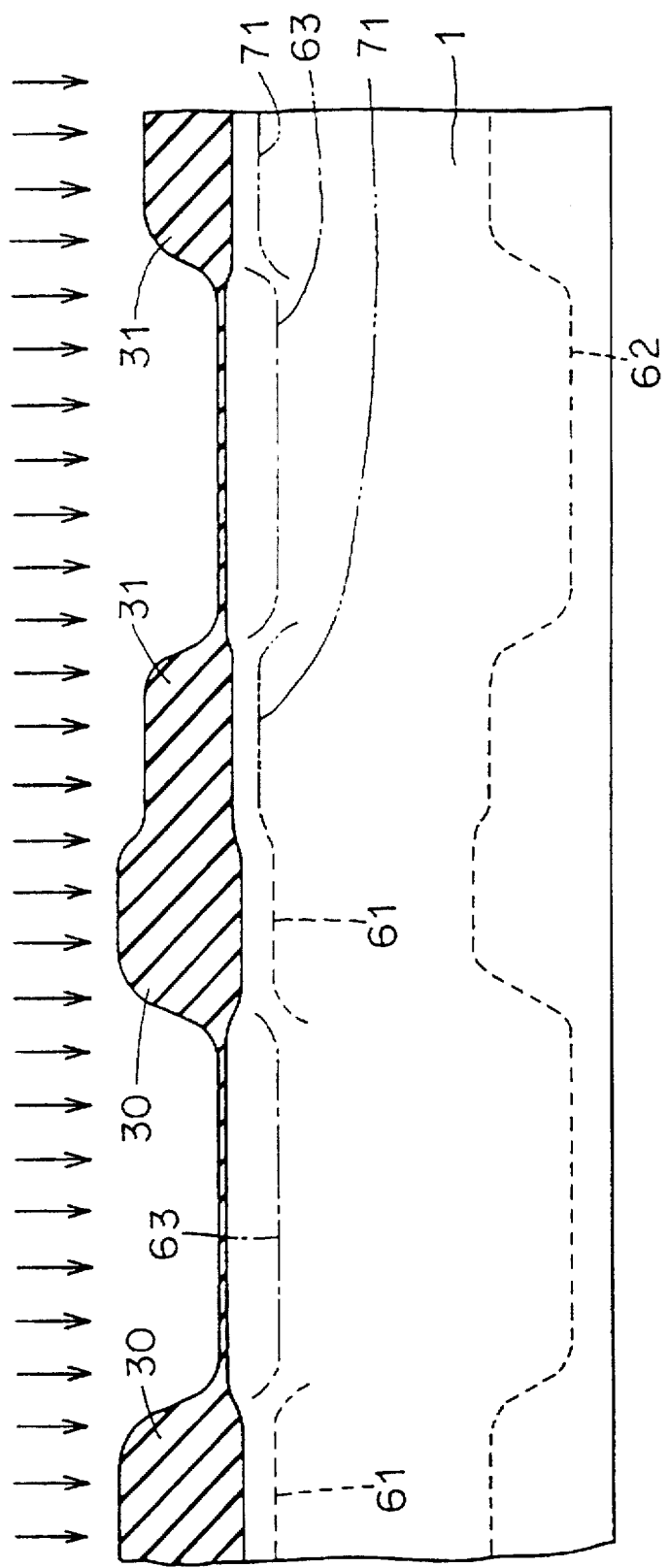
FIG. 70 is a partial sectional view showing a sixth step of the semiconductor device manufacturing method according to the fifth embodiment of the present invention.

With reference to FIG. 70, the nitride film 4 and the polysilicon 3 are removed. Another boron ions are implanted twice in the silicon substrate 1. This first ion implantation is carried out with a dose of $1.0\times10^{13}$–$1.0\times10^{14}$ cm$^{-2}$ under 500–700 keV. As a result, an impurity region having a second p type impurity concentration peak 62 (the concentration of which is up to about $10^{18}$ cm$^{-3}$) at a region deep in the silicon substrate 1 is formed extending from the activation regions to the element isolation regions of the Vss region and the Vbb region.

Furthermore, boron ions are implanted in the silicon substrate 1 by using the isolation oxide film 30 and the isolation oxide film 31 as masks. The ion implantation is carried out with a dose of $1.0\times10^{12}$–$1.0\times10^{13}$ cm$^{-2}$ under 15–70 keV. As a result, an impurity region having a third p type impurity concentration peak 63 (the concentration of which is up to about $10^{17}$ cm$^{-3}$) is formed only in proximity to the surface of the activation regions of the Vbb and the Vss regions.

The foregoing steps complete the formation of the n channel region.

A sixth embodiment of the present invention will be described in the following.

A semiconductor device according to the sixth embodiment has a fourth impurity concentration peak between a first impurity concentration peak and a second impurity concentration peak to extend from an element isolation region to an element region.

Figure 71:
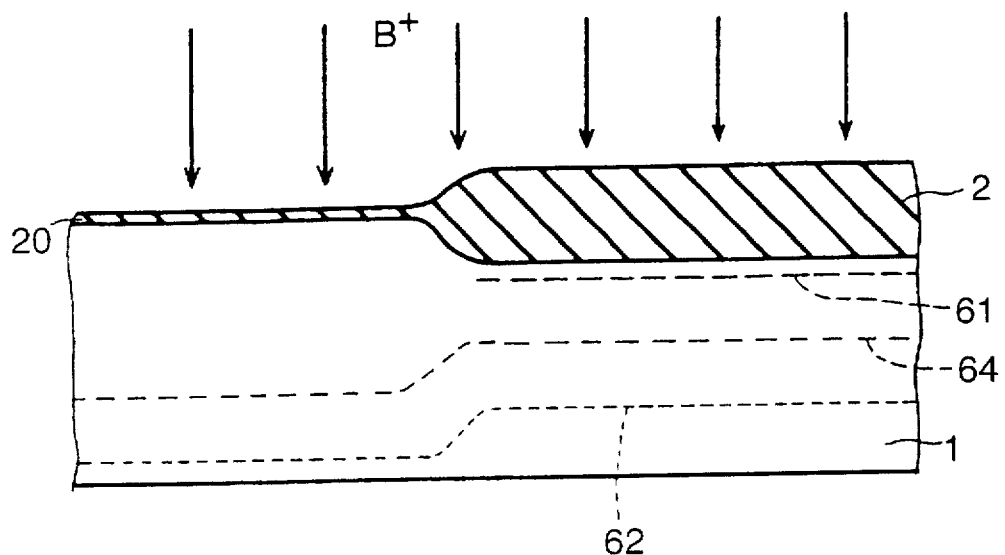
FIG. 71 is a partial sectional view showing a characteristic part of a method of forming a p well according to a sixth embodiment of the present invention.
Figure 72:
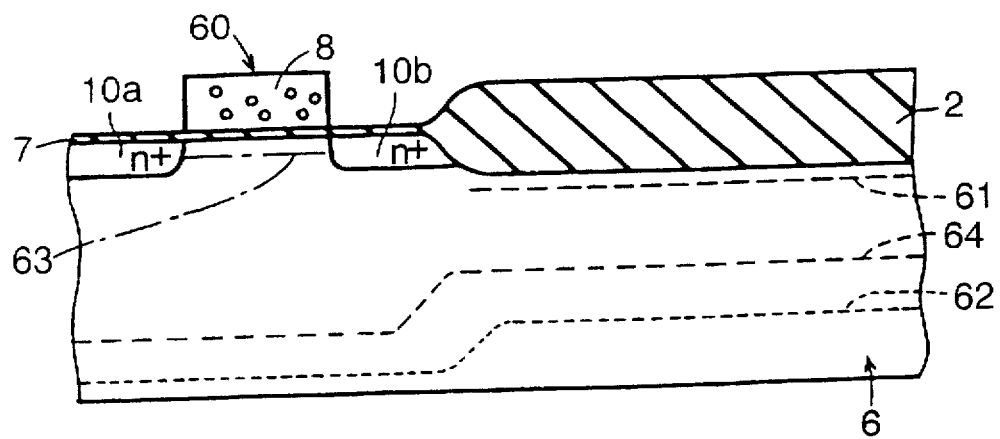
FIG. 72 is a partial sectional view showing a structure of an n channel MOS field effect transistor formed in a p well according to the sixth embodiment of the present invention.
Figure 73:
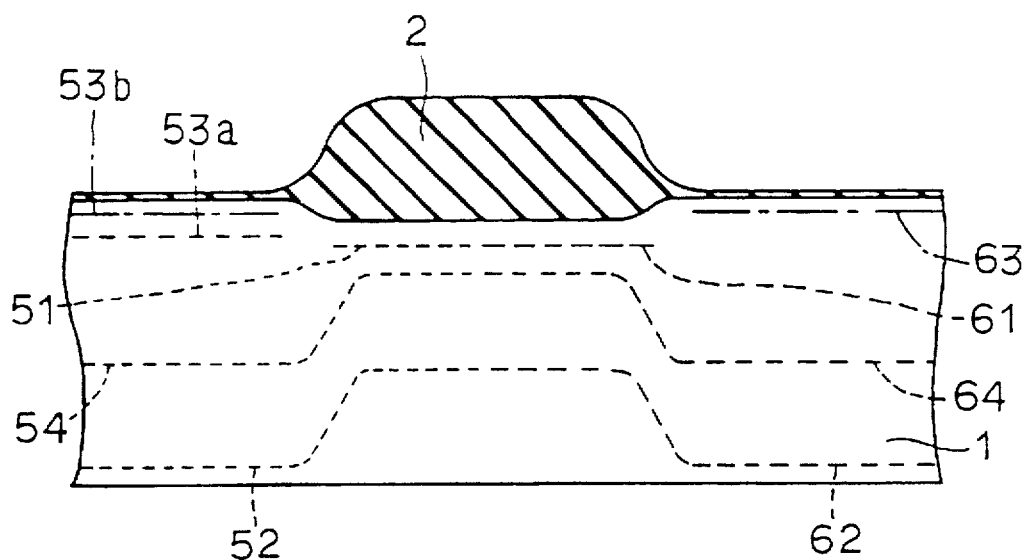
FIG. 73 is a partial sectional view showing a characteristic part of a method of manufacturing a CMOS semiconductor device according to the sixth embodiment of the present invention.

The present embodiment basically relates to the same manufacturing steps of FIGS. 42–47 in the second embodiment. Therefore, description will be given only to steps of manufacturing a fourth impurity concentration peak. FIG. 71 is a partial sectional view of a region of a p well 6. After a first p type impurity concentration peak 61 is formed, another boron ions is implanted in the silicon substrate 1. The ion implantation is carried out with a dose of $1.0\times10^{12}$–$1.0\times10^{13}$ cm$^{-2}$ under 90–360 keV. As a result, an impurity region having a fourth p type impurity concentration peak 64 (the concentration of which is up to about $1.0\times10^{17}$ cm$^{-3}$) at a region shallower than a region of the second p type impurity concentration peak 62 of the silicon substrate 1 is formed extending from the element isolation region to the element region. Thereafter, the same steps as those of the fourth embodiment will be executed to complete a semiconductor device with an n channel MOS transistor 60 formed in the p well 6 shown in FIG. 72. An n well and a p channel MOS transistor in the n well region can be formed by the same steps as those of the fourth embodiment. In addition, in manufacturing a CMOS semiconductor device, a p well and an n well can be formed by the same manner as in the fifth embodiment, as shown in FIG. 73.

Figure 74:
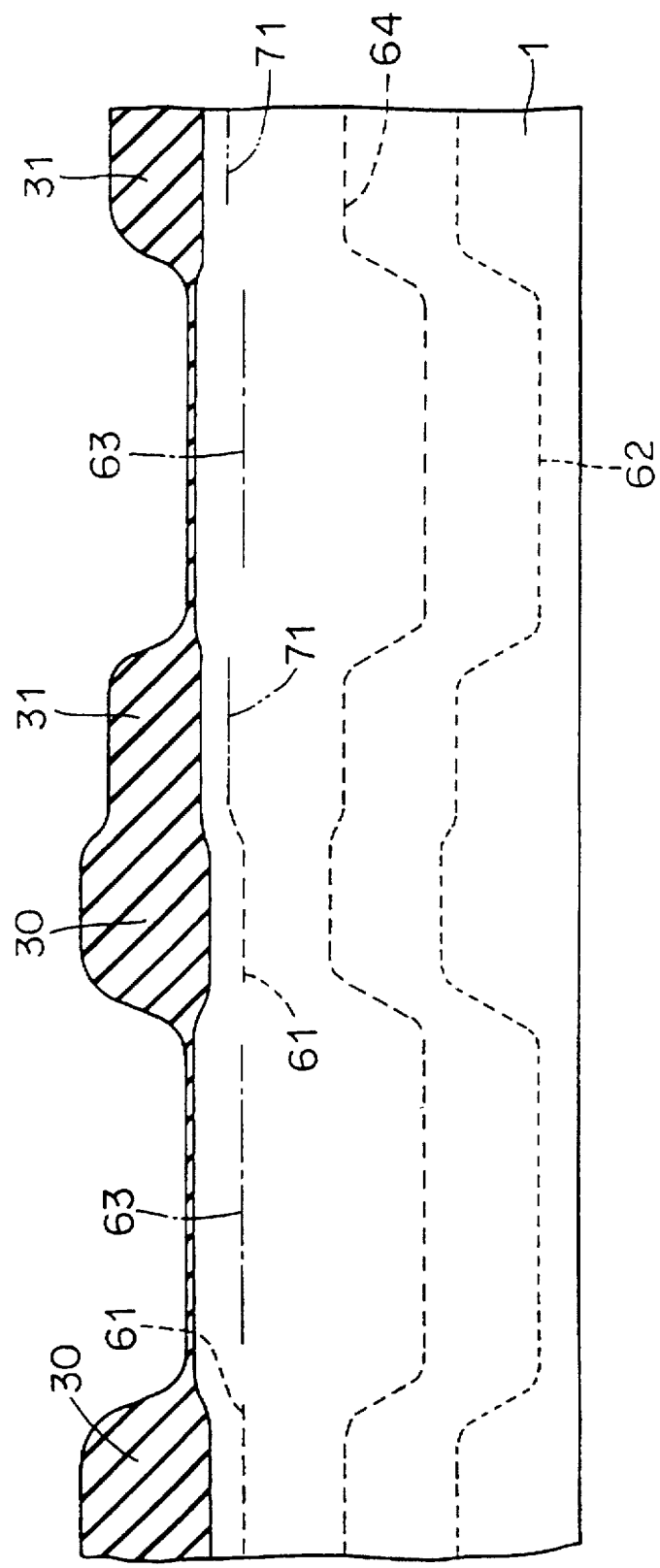
FIG. 74 is a partial sectional view showing a second characteristic part of the semiconductor device according to the sixth embodiment of the present invention.
Figure 75:
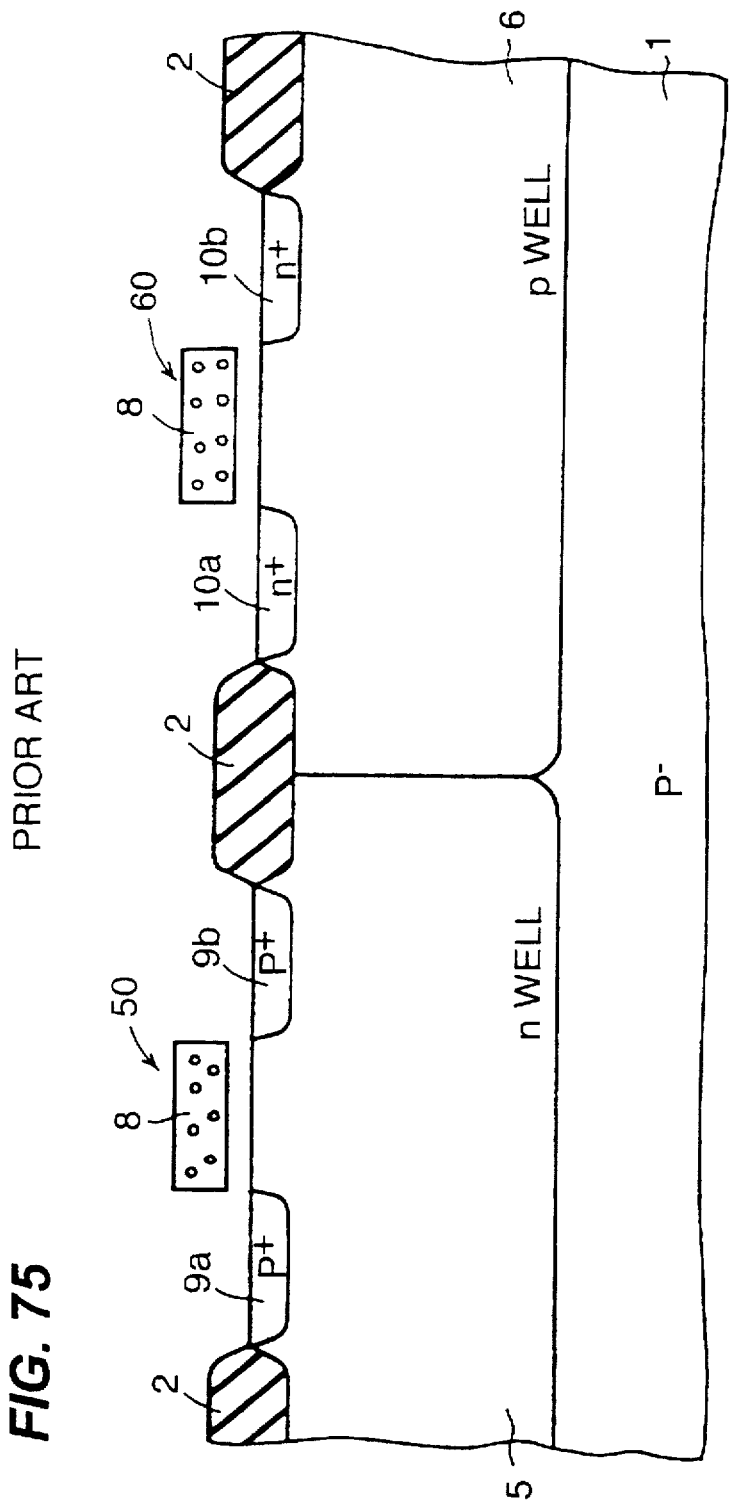
FIG. 75 is a partial sectional view showing the structure of a conventional CMOS semiconductor device.
Figure 76:
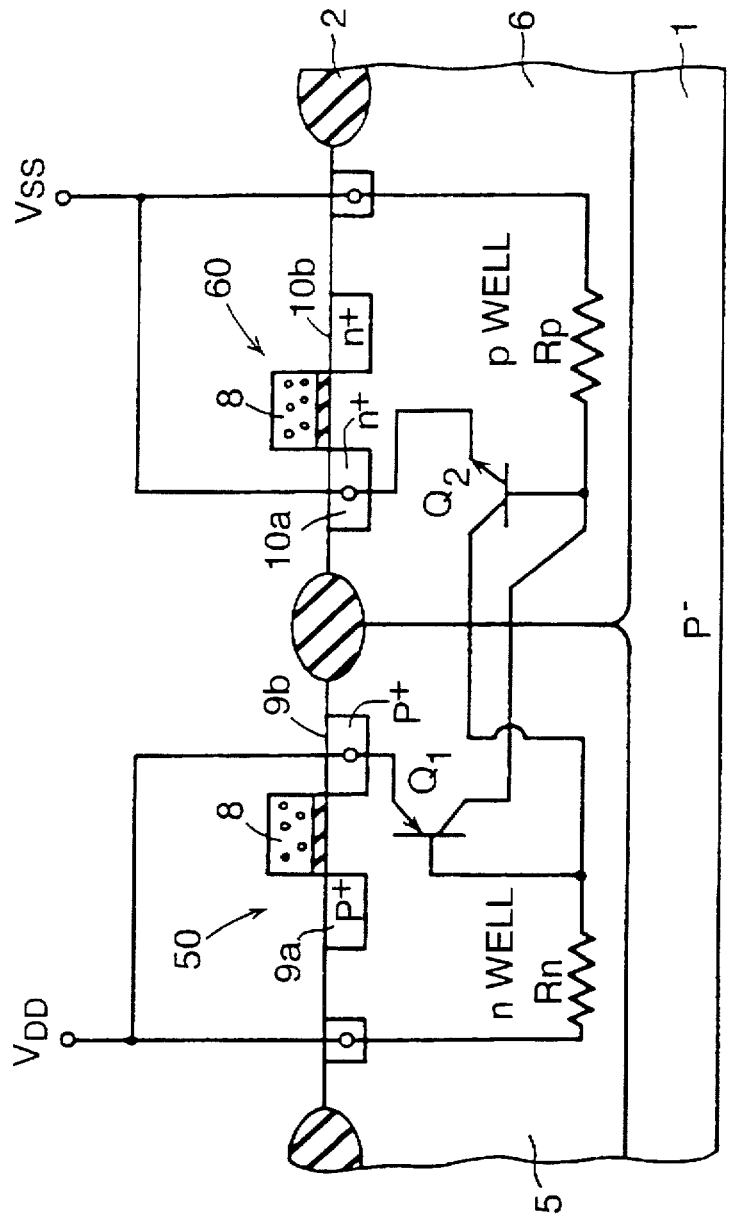
FIG. 76 is a partial sectional view schematically showing one example of a parasitic thiristor formed in a conventional CMOS semiconductor device.
Figure 77:
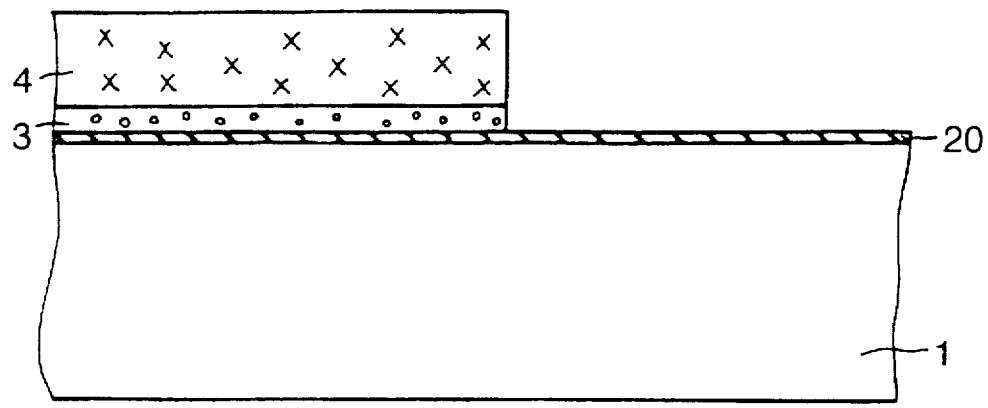
FIG. 77 is a partial sectional view showing a first step of a conventional method of forming a p well.
Figure 78:
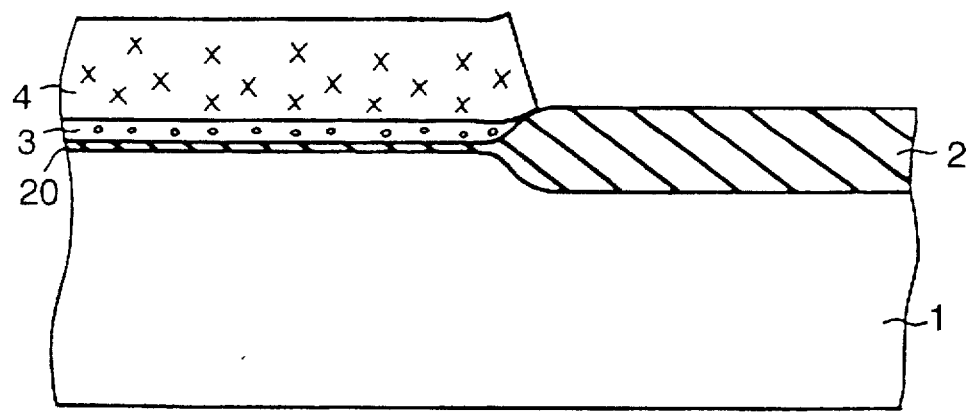
FIG. 78 is a partial sectional view showing a second step of the conventional method of forming a p well.
Figure 79:
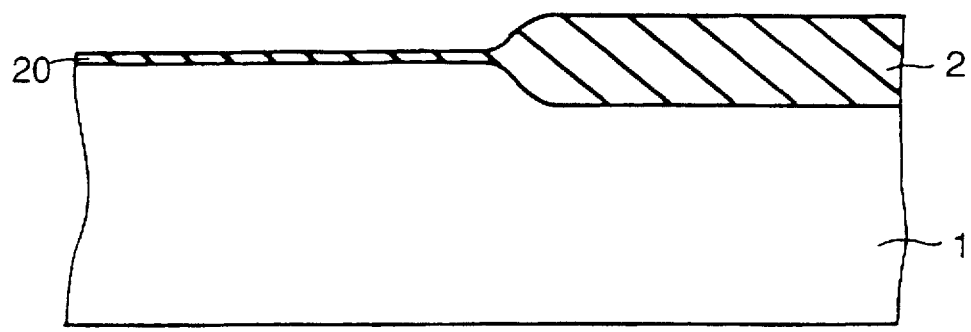
FIG. 79 is a partial sectional view showing a third step of the conventional method of forming a p well.
Figure 80:
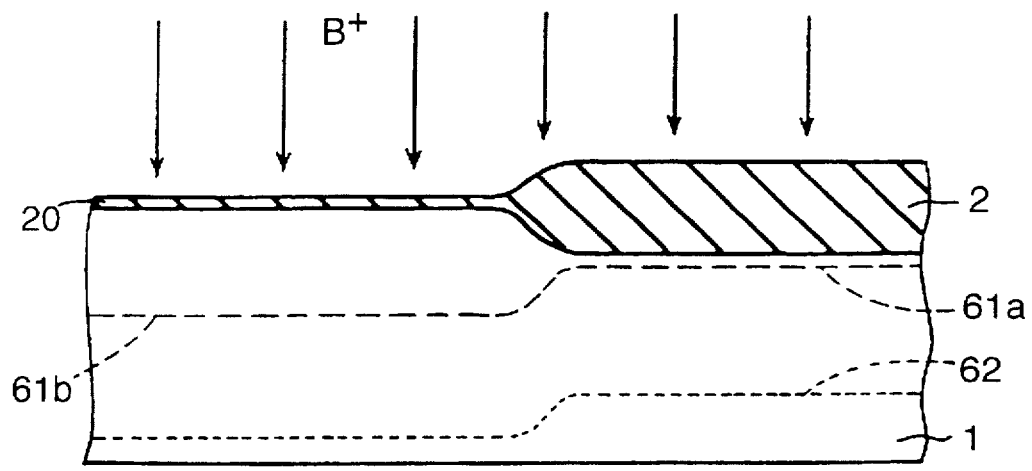
FIG. 80 is a partial sectional view showing a fourth step of the conventional method of forming a p well.
Figure 81:
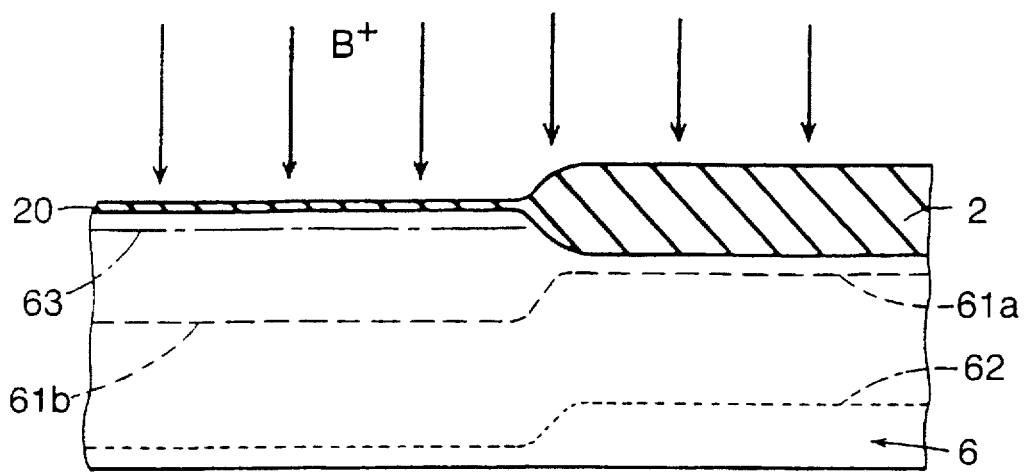
FIG. 81 is a partial sectional view showing a fifth step of the conventional method of forming a p well.
Figure 82:
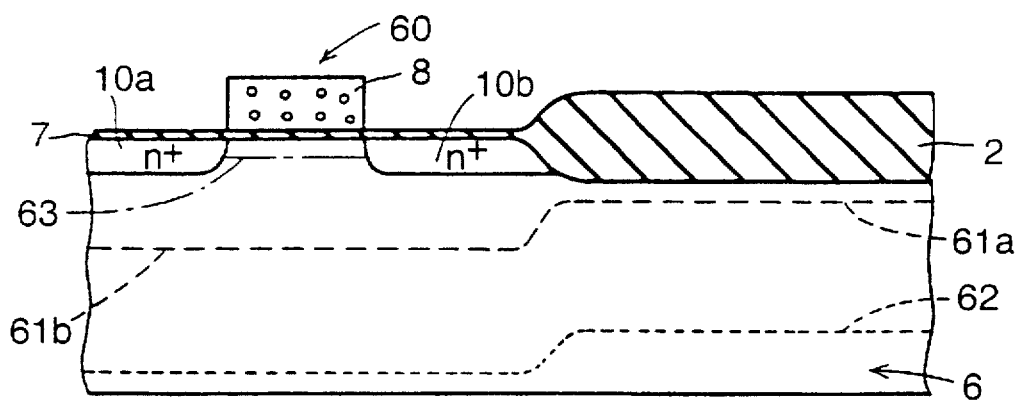
FIG. 82 is a partial sectional view showing a sixth step of the conventional method of forming a p well.
Figure 83:
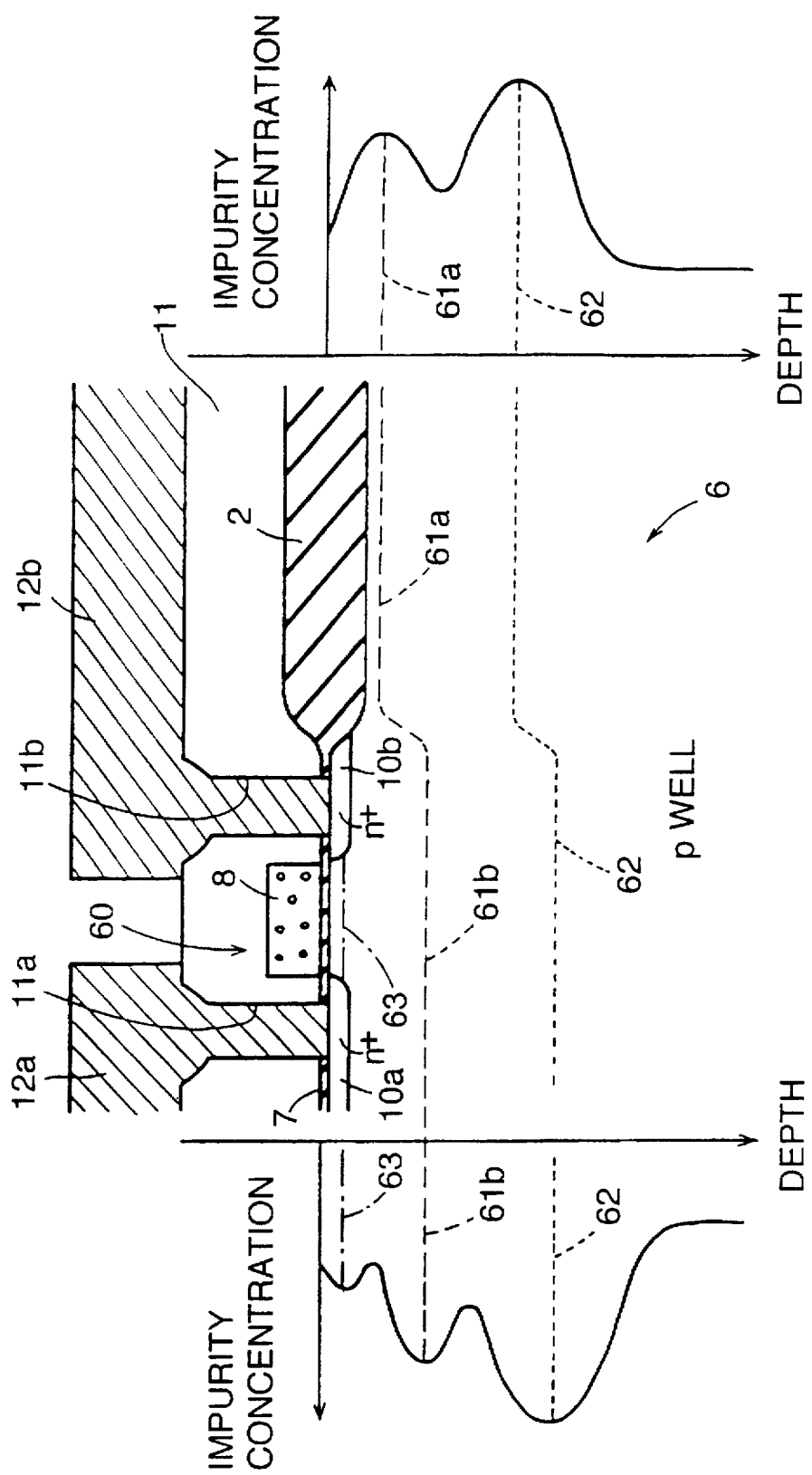
FIG. 83 is a diagram showing a relationship between a conventional p well structure and an impurity concentration in the direction of depth.
Figure 84:
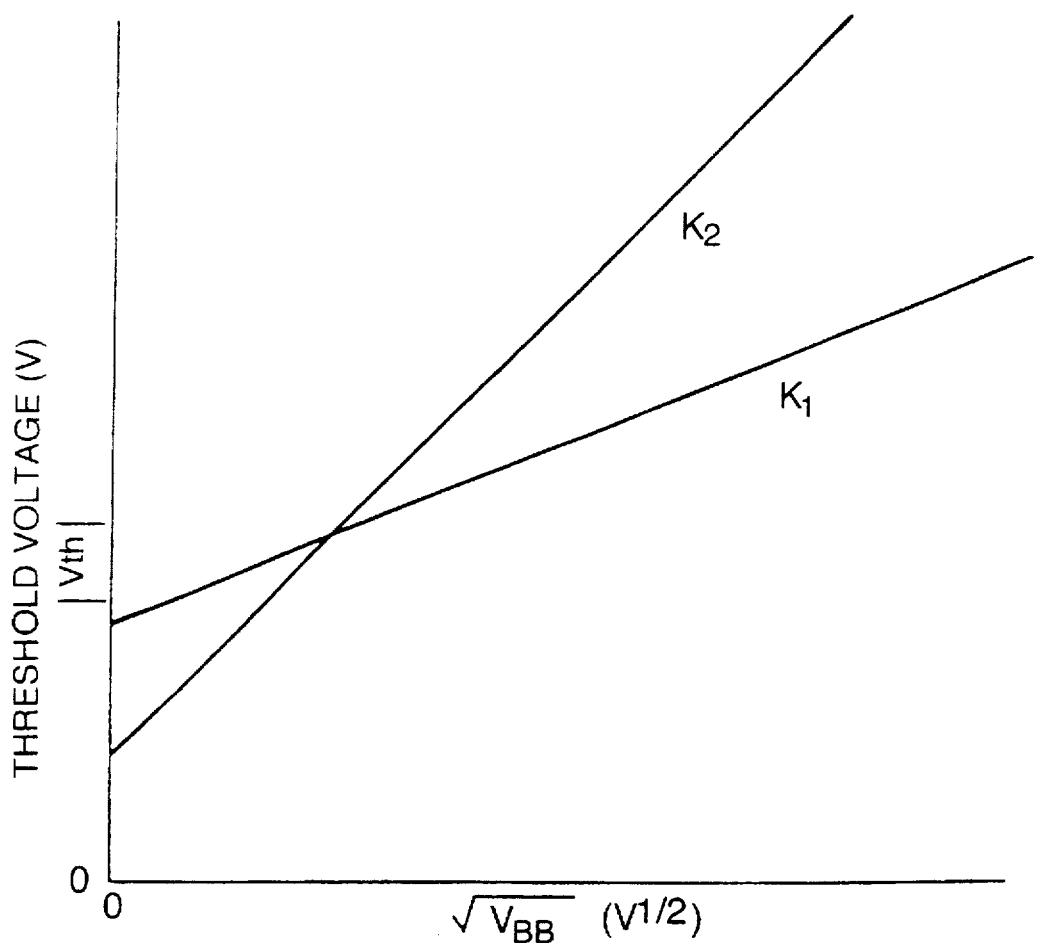
FIG. 84 is a graph showing a relationship between a threshold voltage and a substrate bias voltage.
Figure 85:
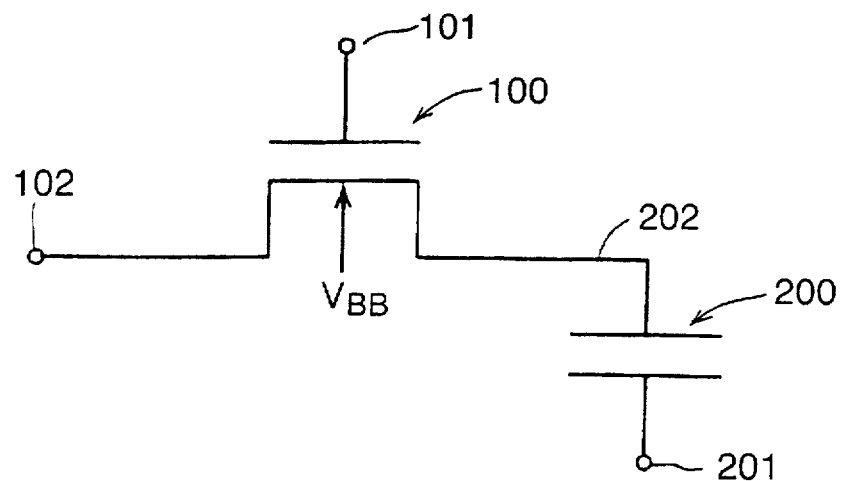
FIG. 85 is an equivalent circuit diagram showing a memory cell of a DRAM, which diagram is used for illustrating the effects exerted by an increase in substrate bias effects.
Figure 86:
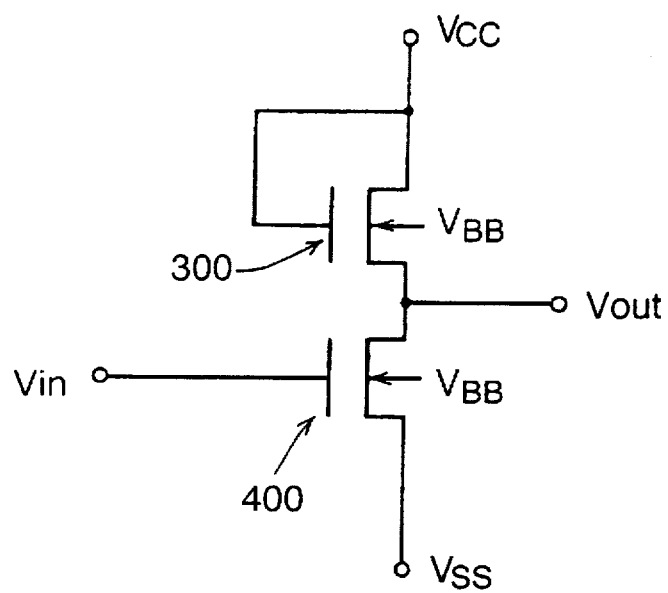
FIG. 86 is an equivalent circuit diagram showing an n channel MOS inverter, which diagram is used for illustrating effects exerted by an increase in the substrate bias effects.

Furthermore, the structure described in the fifth embodiment enables a formation of a fourth p type impurity concentration peak 64 at a region shallower than a region wherein a second p type impurity concentration peak 62 is formed, as shown in FIG. 74.

As described in the foregoing, provision of a fourth impurity concentration peak results in a formation of a channel stopper region as well as a first impurity concentration peak in a region directly under an isolation oxide film. In addition, the fourth impurity concentration peak serves in an element region to prevent punch through.

In a semiconductor device according to one aspect of the present invention, there exists a first impurity concentration peak only in proximity to the lower surface of an isolation and insulation film in an element isolation region. The first impurity concentration peak is not formed in an element region. The retrograde well structure of the present invention therefore prevents a substrate bias effect of an electric field effect transistor formed in the well region from increasing. As a result, the retrograde well structure of the present invention achieves a reduced substrate effect constant. It is therefore possible to ensure high speed operation for a semiconductor device employing a retrograde well structure, while reducing malfunction.

In a method of manufacturing a semiconductor device according to one aspect of the present invention, ion implantation under predetermined energy by using a nitride film and a polysilicn film as masks forms a first impurity concentration peak only in proximity to a lower surface of an isolation oxide film but not in an element region. Therefore, the retrograde well structure of the present invention prevents a substrate bias effect of a field effect transistor formed in the well region from increasing. As a result, the retrograde well structure of the present invention achieves a reduced substrate effect constant. It is therefore possible to ensure high speed operation for a semiconductor device employing a retrograde well structure, while reducing malfunction.

In a method of manufacturing a semiconductor device according to a further aspect of the present invention, a first impurity concentration peak and a third impurity concentration peak are simultaneously formed in proximity to a lower surface of an isolation oxide film and in proximity of an element region, respectively. It is therefore possible to reduce the number of manufacturing steps required by the first embodiment and to avoid a formation of the first impurity concentration peak in the element region. The retrograde well structure therefore prevents substrate bias effect of a field effect transistor formed in the well region from increasing. As a result, the retrograde well structure of the present invention achieves a reduced substrate effect constant and ensures a high speed operation for a semiconductor device employing the retrograde well structure while reducing malfunction.

In a method of manufacturing a semiconductor device according to still further aspect of the present invention, impurities of a first conductivity type are implanted after a formation of an isolation oxide film and impurities of a second conductivity type are implanted under predetermined energy, thereby canceling a first impurity region in an element region. Therefore, a first impurity concentration peak is not formed in the element region. The retrograde well structure of the present invention therefore prevents substrate bias effect of a field effect transistor formed in the well from increasing. As a result, the retrograde well structure of the present invention achieves a reduced substrate effect constant. It is therefore possible to ensure a high speed operation for a semiconductor device employing the retrograde well structure while reducing malfunction.

In a method of manufacturing a semiconductor device according to still further aspect of the present invention, a first isolation and insulation film having a first thickness is formed. Thereafter, the first isolation and insulation film is formed into a second isolation and insulation film having a second thickness larger than the first thickness.

This prevents distortion of the semiconductor substrate at an edge portion of the isolation oxide film caused by growth of the isolation oxide film. Furthermore, a first impurity concentration peak is not formed in an element region. A retrograde well structure of the present invention therefore prevents a substrate bias effect of a field effect transistor formed in the well region from increasing. As a result, a reduced substrate effect constant can be obtained by the retrograde well structure of the present invention. It is therefore possible to ensure a high speed operation for a semiconductor device employing the retrograde well structure while reducing a malfunction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate having a main surface;
   an isolation and insulation film formed in an element isolation region to isolate an element region from other element regions on the main surface of said semiconductor substrate, said isolation and insulation film having a lower surface; and
   a first well region of n-type conductivity formed in the main surface of said semiconductor substrate and having a first impurity concentration distributed from the main surface of said semiconductor substrate along a direction of depth,
   said first impurity concentration including:
      a first impurity concentration peak region of n-type conductivity existing only in proximity to the lower surface of said isolation and insulation film in said element isolation region,
      a second impurity concentration peak region of n-type conductivity extending from said element isolation region to said element region at a position apart from the lower surface of said isolation and insulation film and apart from the main surface of said semiconductor substrate, and
      a third impurity concentration peak region of n-type conductivity existing only in proximity to said element region; and
   a second well region of p-type conductivity formed in the main surface of said semiconductor substrate adjacent said first well region and having a second impurity concentration distributed from the main surface of said semiconductor substrate along a direction of depth,
   said second impurity concentration including:
      a first impurity concentration peak region of p-type conductivity existing only in proximity to the lower surface of said isolation and insulation film in said element isolation region,
      a second impurity concentration peak region of p-type conductivity extending from said element isolation region to said element region at a position apart from the lower surface of said isolation and insulation film and apart from the main surface of said semiconductor substrate, and
      a third impurity concentration peak region of p-type conductivity existing only in proximity to said element region.

2. The device of claim 1, wherein the impurity concentration of said first well region further includes a p-type concentration region existing only in proximity to said element region, shallower than said third impurity concentration peak region.

\* \* \* \* \*